(12) United States Patent
Miyairi et al.

(10) Patent No.: US 7,883,943 B2
(45) Date of Patent: Feb. 8, 2011

(54) METHOD FOR MANUFACTURING THIN FILM TRANSISTOR AND METHOD FOR MANUFACTURING DISPLAY DEVICE

(75) Inventors: Hidekazu Miyairi, Kanagawa (JP); Takafumi Mizoguchi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 37 days.

(21) Appl. No.: 12/397,880

(22) Filed: Mar. 4, 2009

(65) Prior Publication Data

US 2009/0233389 A1    Sep. 17, 2009

(30) Foreign Application Priority Data

Mar. 11, 2008    (JP) .............................. 2008-061680

(51) Int. Cl.
H01L 21/00    (2006.01)
H01L 21/84    (2006.01)

(52) U.S. Cl. .............................. 438/151; 257/E21.411; 257/E21.414; 257/E33.053

(58) Field of Classification Search .................. 438/22, 438/29, 38, 45, 151, 158; 257/E21.411, E21.414, 257/E33.053
See application file for complete search history.

(56) References Cited

U.S. PATENT DOCUMENTS

| | | | |
|---|---|---|---|
| 4,409,134 A | 10/1983 | Yamazaki | |
| 6,008,065 A | 12/1999 | Lee et al. | |
| 6,485,997 B2 | 11/2002 | Lee et al. | |
| 6,493,048 B1 | 12/2002 | Baek et al. | |
| 6,635,581 B2 * | 10/2003 | Wong | .......................... 438/736 |
| 7,116,384 B2 * | 10/2006 | Chen | .......................... 349/47 |
| 7,223,643 B2 | 5/2007 | Ohnuma et al. | |
| 2001/0049064 A1* | 12/2001 | Lee et al. | ........................ 430/5 |
| 2006/0290867 A1 | 12/2006 | Ahn et al. | |
| 2007/0002249 A1 | 1/2007 | Yoo et al. | |
| 2007/0126969 A1 | 6/2007 | Kimura et al. | |
| 2007/0139571 A1 | 6/2007 | Kimura | |
| 2007/0146591 A1 | 6/2007 | Kimura et al. | |

(Continued)

FOREIGN PATENT DOCUMENTS

JP    64-084669    3/1989

(Continued)

OTHER PUBLICATIONS

U.S. Appl. No. 12/393,121.*

(Continued)

*Primary Examiner*—Alexander G Ghyka
*Assistant Examiner*—Leonard Chang
(74) *Attorney, Agent, or Firm*—Fish & Richardson P.C.

(57) ABSTRACT

A method for manufacturing a thin film transistor and a display device using a small number of masks is provided. A conductive film is formed, a thin-film stack body having a pattern is formed over the conductive film, an opening portion is formed in the thin-film stack body so as to reach the conductive film, a gate electrode layer is formed by processing the conductive film using side-etching, and an insulating layer, a semiconductor layer, and a source and drain electrode layer are formed over the gate electrode layer, whereby a thin film transistor is manufactured. By provision of the opening portion, controllability of etching is improved.

17 Claims, 46 Drawing Sheets

U.S. PATENT DOCUMENTS

2007/0222936 A1    9/2007    Shih

FOREIGN PATENT DOCUMENTS

| JP | 03-011744 | 1/1991 |
| JP | 03-161938 | 7/1991 |
| JP | 07-307477 | 11/1995 |
| JP | 2000-307118 | 11/2000 |
| JP | 2003-179069 | 6/2003 |
| WO | 2008/099528 A1 | 8/2008 |

OTHER PUBLICATIONS

U.S. Appl. No. 12/473,776.*
U.S. Appl. No. 12/396,998.*
Kim et al., "Novel Four-Mask-Count Process Architecture for TFT-LCDs", SID Digest '00, May 16-18, 2000, pp. 1006-1009.

* cited by examiner

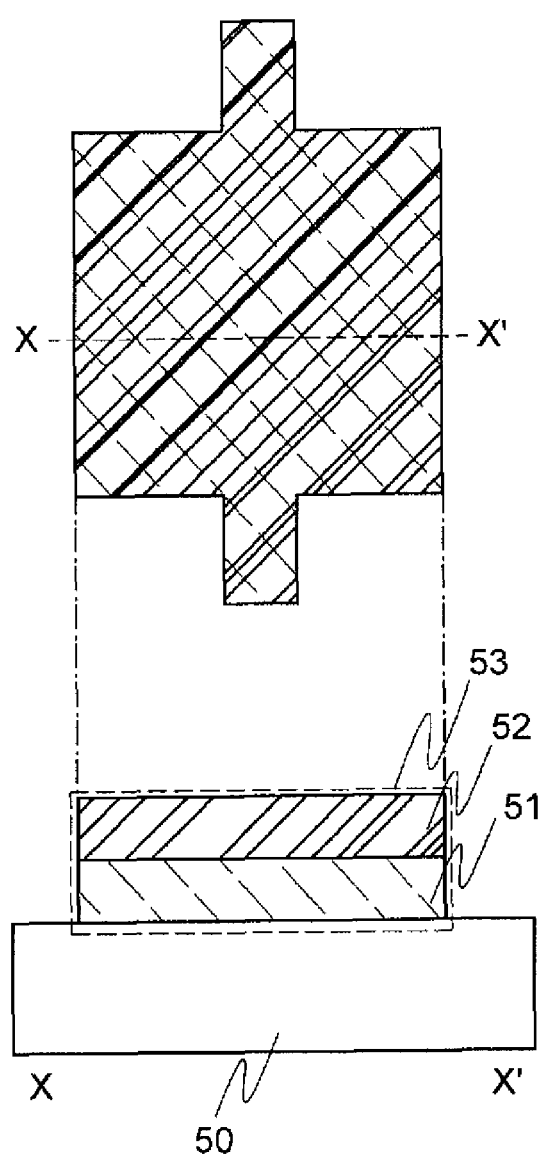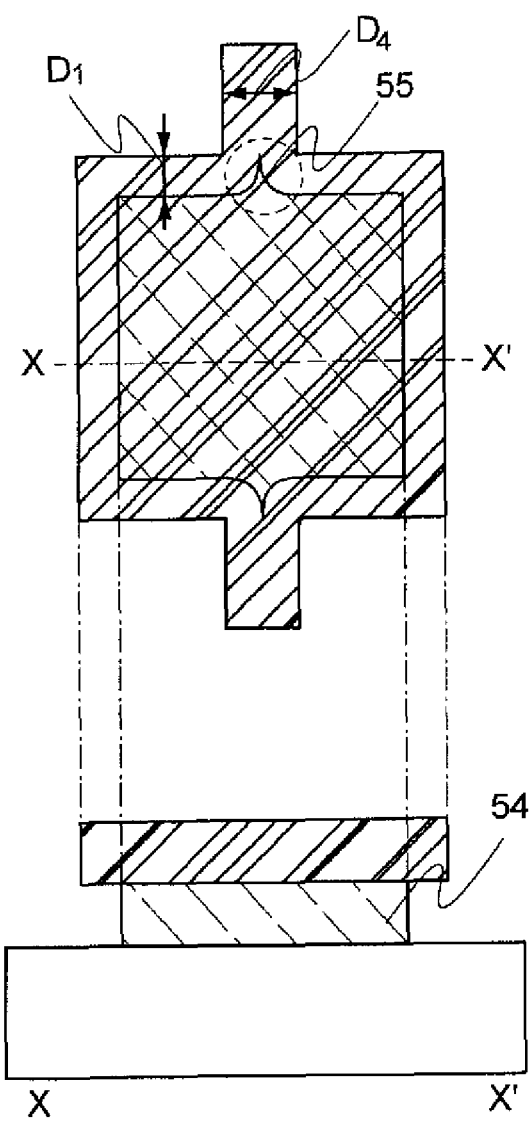

108 110 170
100 102 104 106

114
116C 120A 171 120D 120C

224

METHOD FOR MANUFACTURING THIN FILM TRANSISTOR AND METHOD FOR MANUFACTURING DISPLAY DEVICE

BACKGROUND OF THE INVENTION

1. Field of the Invention

The present invention relates to a method for manufacturing a thin film transistor and a method for manufacturing a display device including the thin film transistor.

2. Description of the Related Art

In recent years, thin film transistors that are formed using a semiconductor thin film having a thickness of several nanometers to several hundreds of nanometers over a substrate having an insulating surface such as a glass substrate have been attracting attentions. Thin film transistors are widely used for electronic devices such as ICs (integrated circuits) and electro-optical devices. In particular, thin film transistors are urgently developed as switching elements of image display devices typified by liquid crystal display devices, EL (electro-luminescent) display devices, and the like. In an active matrix liquid crystal display device, for example, a voltage is applied between a pixel electrode connected to a selected switching element and an opposite electrode corresponding to the pixel electrode, and thus, a liquid crystal layer disposed between the pixel electrode and the opposite electrode is modulated optically. The optical modulation can be recognized as a display pattern by an observer. Here, the term "active matrix liquid crystal display device" refers to a liquid crystal display device which employs a method in which a liquid crystal layer is modulated optically by driving pixel electrodes arranged in matrix using switching elements, so that display patterns are formed on a screen. The term "active matrix EL display device" refers to an EL display device which employs a method in which a display pattern is formed on a screen by driving pixels arranged in matrix using switching elements.

The range of application of the active matrix display devices is expanding, and demands for larger screen size, higher definition, and higher aperture ratio are increasing. In addition, it is demanded that the active matrix liquid crystal display device has high reliability and that a method for manufacturing the active matrix liquid crystal display device offers high productivity and low manufacturing cost. As a method for increasing productivity and reducing manufacturing cost, simplification of the process can be given.

In an active matrix display device, thin film transistors are mainly used as switching elements. In manufacturing thin film transistors, reduction in the number of photomasks used in photolithography is important for simplification of the process. If one photomask is added, the following steps are further needed: resist application, prebaking, light exposure, development, postbaking, and the like, and moreover other steps before and after the above-described steps, such as film formation and etching and further resist removal, cleaning, drying, and the like. The number of steps is significantly increased only by adding one photomask in the manufacturing process. Therefore, many techniques for reducing the number of photomasks in a manufacturing process have been developed.

Thin film transistors are broadly classified into a top gate type in which a gate electrode is formed over a channel formation region and a bottom gate type in which a gate electrode is formed under a channel formation region. It is known that the number of photomasks used in a manufacturing process of bottom-gate thin film transistors is less than the number of photomasks used in a manufacturing process of top-gate thin film transistors. Bottom-gate thin film transistors are generally formed using three photomasks.

Many conventional techniques for reducing the number of photomasks use a complicated technique such as backside light exposure, resist reflow, or a lift-off method, which requires a special apparatus. There has been a contributing factor that yield is reduced due to various problems caused by the usage of such a complicated technique. Moreover, there is often no option but to sacrifice electrical characteristics of thin film transistors.

As a typical method for reducing the number of photomasks in a manufacturing process of a thin film transistor, a technique using a multi-tone mask (called a half-tone mask or a gray-tone mask) is widely known. As a technique for reducing the number of manufacturing steps by using a multi-tone mask, Patent Document 1 (Japanese Published Patent Application No. 2003-179069) can be given as an example.

However, even when bottom-gate thin film transistors are manufactured using a multi-tone mask as described above, at least two photomasks are needed, and it is difficult to further reduce the number of photomasks. One of them is used for patterning a gate electrode layer.

SUMMARY OF THE INVENTION

Here, one mode of the present invention is to provide a new method in which thin film transistors can be manufactured without using a photomask for patterning the gate electrode layer. In other words, a method for manufacturing thin film transistors by using only one photomask without using a complicated technique is disclosed.

Accordingly, the number of photomasks can be reduced than ever before in manufacturing thin film transistors.

Also, the mode of the present invention can be applied to a method for manufacturing thin film transistors (also referred to as pixel TFTs) that are used for pixels of a display device. Thus, one mode of the present invention is to provide a method for manufacturing a display device in which the number of photomasks used for photolithographic method is reduced than ever before without using a complicated technique.

In the method for manufacturing a thin film transistor, which is one mode of the invention, a first conductive film and a thin-film stack body in which an insulating film, a semiconductor film, an impurity semiconductor film, and a second conductive film are stacked in this order over the first conductive film are formed; first etching is performed to expose the first conductive film and form at least a pattern of the thin-film stack body; and second etching is performed to form a pattern of the first conductive film. Here, the second etching is performed under such conditions as to selectively side-etch the first conductive film.

Here, as the first etching, either dry etching or wet etching may be used. In addition, a highly anisotropic etching (physical etching) method is preferably employed. By employing the highly anisotropic etching method as the first etching, the precision of the processing for forming a pattern can be improved. Note that the first etching can be performed in one step when dry etching is employed as the first etching, while the first etching may be performed in plural steps when wet etching is employed as the first etching. Therefore, it is preferable to employ dry etching as the first etching.

As the second etching, either dry etching or wet etching may be used. In addition, a highly isotropic etching (chemical etching) method is preferably employed. By employing the highly isotropic etching (chemical etching) method as the second etching, the first conductive film can be side-etched. Accordingly, as the second etching, wet etching is preferably employed.

The second etching is described with reference to pattern diagrams illustrated in FIGS. 1A-1 and 1A-2 and FIGS. 1B-1 and 1B-2. FIG. 1A-1 illustrates a top view of a thin film transistor before the second etching, and FIG. 1A-2 illustrates a cross-sectional view of a thin film transistor before the second etching, which is taken along the line X-X'. Further, FIG. 1B-1 illustrates a top view of a thin film transistor after the second etching, and FIG. 1B-2 illustrates a cross-sectional view of a thin film transistor after the second etching, which is taken along the line X-X'. Only a first layer 51 is etched by the second etching.

In FIGS. 1A-1 and 1A-2 and FIGS. 1B-1 and 1B-2, the first layer 51 and a second layer 52 are stacked over a substrate 50 and a structure 53 formed using stacked layers including the first layer 51 and the second layer 52 has the formed pattern (see FIGS. 1A-1 and 1A-2). When the second etching is performed on the structure 53, only the first layer 51 is etched and an etched first layer 54 is formed (see FIG. 1B-2). The etched first layer 54 has a horn 55 because etching progresses isotropically from an exposed portion of the first layer 51.

As described with reference to FIGS. 1A-1 and 1A-2 and FIGS. 1B-1 and 1B-2, when a gate electrode is formed by performing the second etching on the first conductive film, a gate electrode is formed into an irregular shape to have a horn and parasitic capacitance is generated due to this horn. Further, when the longer horn is formed, insulation between adjacent wirings becomes uncompleted. As a result, short circuit is caused between thin film transistors of adjacent pixels. In particular, in FIG. 1B-1, when a distance $D_4$ is more than twice as large as a distance $D_1$, short circuit is easily caused. Thus, in order to prevent the short circuit, the distance $D_4$ is determined depending on the distance $D_1$, thereby reducing the freedom of layout design.

Accordingly, in the method for manufacturing a thin film transistor of one mode of the invention, an opening portion is provided at a portion where a horn is generated by patterning a gate electrode using side-etching. By provision of the opening portion at a portion where a horn is generated, generation of the horn can be prevented and the horn can be made to be smaller.

Note that the "pattern of the first conductive film" means, for example, a top view layout of a metal wiring which includes a gate electrode, a gate wiring, a capacitor electrode, a capacitor wiring and a power supply line.

That is, one mode of the invention is a method for manufacturing a thin film transistor in which a conductive film is formed, a thin-film stack body having a pattern is formed over the conductive film, an opening portion is formed in the thin-film stack body so as to reach the conductive film, and a gate electrode layer is formed by side-etching. The gate electrode layer includes a gate wiring. Here, at least one opening portion is provided between adjacent wirings formed using the gate electrode layer over the source wiring. The opening portion is preferably formed at an intersection of the gate wiring and the source wiring with the gate wiring sandwiched. At this time, a distance between the opening portion and the gate wiring may be determined in accordance with the etching rate of the side-etching. It is preferable that the gate electrode layer be formed without generation of a horn due to side-etching.

One mode of the invention is a method for manufacturing a thin film transistor including the steps of: forming a first conductive film; forming an insulating film over the first conductive film; forming a semiconductor film over the insulating film; forming an impurity semiconductor film over the semiconductor film; forming a second conductive film over the impurity semiconductor film; forming a first resist mask including a recessed portion over the second conductive film and including at least one opening portion between adjacent wirings which are formed by processing the first conductive film in a region where there is a wiring which is formed by processing the second conductive film; exposing at least a surface of the first conductive film by performing first etching on the insulating film, the semiconductor film, the impurity semiconductor film, and the second conductive film using the first resist mask; forming a gate electrode layer by performing second etching in which part of the first conductive film is side-etched; forming a second resist mask by making the first resist mask to be reduced to expose a part of the second conductive film, which overlaps with the recessed portion of the first resist mask; and forming a source and drain electrode layer, source and drain region layers, and a semiconductor layer by performing third etching on the second conductive film, the impurity semiconductor film, and a part of the semiconductor film using the second resist mask.

One mode of the invention is a method for manufacturing a thin film transistor including the steps of: forming a first conductive film; forming an insulating film over the first conductive film; forming a semiconductor film over the insulating film; forming an impurity semiconductor film over the semiconductor film; forming a second conductive film over the impurity semiconductor film; forming a first resist mask including a recessed portion over the second conductive film and including at least one opening portion between adjacent wirings which are formed by processing the first conductive film in a region where there is a wiring which is formed by processing the second conductive film; exposing at least a surface of the first conductive film by performing first etching on the insulating film, the semiconductor film, the impurity semiconductor film, and the second conductive film using the first resist mask; forming a second resist mask by making the first resist mask to be reduced to expose a part of the second conductive film, which overlaps with the recessed portion of the first resist mask; forming a gate electrode layer by performing second etching in which part of the first conductive film is side-etched; and forming a source and drain electrode layer, source and drain region layers, and a semiconductor layer by performing third etching on the second conductive film, the impurity semiconductor film, and a part of the semiconductor film using the second resist mask.

One mode of the invention is a method for manufacturing a thin film transistor including the steps of: forming a first conductive film; forming an insulating film over the first conductive film; forming a semiconductor film over the insulating film; forming an impurity semiconductor film over the semiconductor film; forming a second conductive film over the impurity semiconductor film; forming a first resist mask including a recessed portion over the second conductive film and including at least one opening portion between adjacent wirings which are formed by processing the first conductive film in a region where there is a wiring which is formed by processing the second conductive film; performing first etching on the first conductive film, the insulating film, the semiconductor film, the impurity semiconductor film, and the second conductive film using the first resist mask; forming a gate electrode layer by performing second etching in which part of the first conductive film is side-etched; forming a second resist mask by making the first resist mask to be reduced to expose a part of the second conductive film, which overlaps with the recessed portion of the first resist mask; and forming a source and drain electrode layer, source and drain region layers, and a semiconductor layer by performing third etching on the second conductive film, the impurity semiconductor film, and a part of the semiconductor film using the second resist mask.

One mode of the invention is a method for manufacturing a thin film transistor including the steps of: forming a first conductive film; forming an insulating film over the first conductive film; forming a semiconductor film over the insulating film; forming an impurity semiconductor film over the semiconductor film; forming a second conductive film over the impurity semiconductor film; forming a first resist mask including a recessed portion over the second conductive film and including at least one opening portion between adjacent wirings which are formed by processing the first conductive film in a region where there is a wiring which is formed by processing the second conductive film; performing first etching on the first conductive film, the insulating film, the semiconductor film, the impurity semiconductor film, and the second conductive film using the first resist mask; forming a second resist mask by making the first resist mask to be reduced to expose a part of the second conductive film, which overlaps with the recessed portion of the first resist mask; forming a gate electrode layer by performing second etching in which part of the first conductive film is side-etched; and forming a source and drain electrode layer, source and drain region layers, and a semiconductor layer by performing third etching on the second conductive film, the impurity semiconductor film, and a part of the semiconductor film using the second resist mask.

In the manufacturing method having any of the above-described structures, in the case where the first resist mask has a recessed portion, the first resist mask is preferably formed using a multi-tone mask. By using the multi-tone mask, a resist mask having a recessed portion can be formed by a simple process.

By employing the manufacturing method having any of the above-described structures, an element region is formed by the first etching, and a side surface of the gate electrode layer can be provided more on the inside than a side surface of the element region by a roughly uniform distance by the second etching.

In the manufacturing method having any of the above-described structures using the first etching and the second etching, it is preferable that the first etching be performed by dry etching and the second etching be performed by wet etching. The processing by the first etching is preferably performed with high precision, and side-etching needs to be performed in the processing by the second etching. For high-precision processing, dry etching is preferable. Since a chemical reaction is utilized in wet etching, side-etching is more likely to occur in wet etching than in dry etching.

In the manufacturing method having any of the above-described structures, the opening portion is preferably provided over a region where there is a wiring which is formed by processing the second conductive film at an intersection of a wiring which is formed by processing the first conductive film and the wiring that is formed by processing the second conductive film with the wiring that is formed by processing the first conductive film sandwiched.

One mode of the invention is a method for manufacturing a display device including the steps of: forming a first conductive film; forming a first insulating film over the first conductive film; forming a semiconductor film over the first insulating film; forming an impurity semiconductor film over the semiconductor film; forming a second conductive film over the impurity semiconductor film; forming a first resist mask including a recessed portion over the second conductive film and including at least one opening portion between adjacent wirings which are formed by processing the first conductive film in a region where there is a wiring which is formed by processing the second conductive film; exposing at least a surface of the first conductive film by performing first etching on the first insulating film, the semiconductor film, the impurity semiconductor film, and the second conductive film using the first resist mask; forming a gate electrode layer by performing second etching in which part of the first conductive film is side-etched; forming a second resist mask by making the first resist mask to be reduced to expose a part of the second conductive film, which overlaps with the recessed portion of the first resist mask; forming a source and drain electrode layer, source and drain region layers, and a semiconductor layer by performing third etching on the second conductive film, the impurity semiconductor film, and a part of the semiconductor film using the second resist mask, thereby forming a thin film transistor; removing the second resist mask and forming a second insulating film which covers the thin film transistor; forming an opening portion in the second insulating film so as to expose a part of the source and drain electrode layer; and forming a pixel electrode in the opening portion formed in the second insulating film and over the second insulating film selectively.

One mode of the invention is a method for manufacturing a display device including the steps of: forming a first conductive film; forming a first insulating film over the first conductive film; forming a semiconductor film over the first insulating film; forming an impurity semiconductor film over the semiconductor film; forming a second conductive film over the impurity semiconductor film; forming a first resist mask including a recessed portion over the second conductive film and including at least one opening portion between adjacent wirings which are formed by processing the first conductive film in a region where there is a wiring which is formed by processing the second conductive film; exposing at least a surface of the first conductive film by performing first etching on the first insulating film, the semiconductor film, the impurity semiconductor film, and the second conductive film using the first resist mask; forming a second resist mask by making the first resist mask to be reduced to expose a part of the second conductive film, which overlaps with the recessed portion of the first resist mask; forming a gate electrode layer by performing second etching in which part of the first conductive film is side-etched; forming a source and drain electrode layer, source and drain region layers, and a semiconductor layer by performing third etching on the second conductive film, the impurity semiconductor film, and a part of the semiconductor film using the second resist mask, thereby forming a thin film transistor; removing the second resist mask and forming a second insulating film which covers the thin film transistor; forming an opening portion in the second insulating film so as to expose a part of the source and drain electrode layer; and forming a pixel electrode in the opening portion formed in the second insulating film and over the second insulating film selectively.

In the method for manufacturing a display device having any of the above-described structures, in the case where the first resist mask has a recessed portion, the first resist mask is preferably formed using a multi-tone mask. By using the multi-tone mask, a resist mask having a recessed portion can be formed by a simple process.

By employing the method for manufacturing a display device having any of the above-described structures, an element region is formed by the first etching, and a side surface of the gate electrode layer can be provided more on the inside than a side surface of the element region by a roughly uniform distance by the second etching.

In the method for manufacturing a display device having any of the above-described structures using the first etching and the second etching, it is preferable that the first etching be performed by dry etching and the second etching be performed by wet etching. The processing by the first etching is preferably performed with high precision, and side-etching needs to be performed in the processing by the second etching. For high-precision processing, dry etching is preferable. Since a chemical reaction is utilized in wet etching, side-etching is more likely to occur in wet etching than in dry etching.

In the method for manufacturing a display device having any of the above-described structures, the second insulating film is preferably formed by stacking an insulating film by a CVD method or a sputtering method and an insulating film by a spin coating method. More preferably, the second insulating film is formed by stacking a silicon nitride film by a CVD method or a sputtering method and an organic resin film by a spin coating method. By formation of the second insulating film in this manner, the thin film transistor can be protected from an impurity element or the like which may adversely affect electrical characteristics of the thin film transistor, and planarity of a surface over which a pixel electrode is formed can be improved; accordingly, reduction in yield can be prevented.

In the method for manufacturing a display device having any of the above-described structures, the opening portion formed in the first resist mask is preferably provided over a region where there is a wiring which is formed by processing the second conductive film at an intersection of a wiring which is formed by processing the first conductive film and the wiring that is formed by processing the second conductive film with the wiring that is formed by processing the first conductive film sandwiched.

Also, a thin film transistor manufactured by using any of the manufacturing methods having any of the above-described structures according to the invention to be disclosed includes a gate insulating film over a gate electrode layer, a semiconductor layer over the gate insulating film, an impurity semiconductor layer including a source region and a drain region over the semiconductor layer, a source and drain electrode layer over the source region and the drain region, a cavity in contact with a side surface of the gate electrode layer, and at least one opening portion between adjacent wirings formed using the gate electrode layer in a region where the source region is formed. The vicinity of an end portion of the gate electrode can have a lower dielectric constant (low-k) by providing the cavity. Further, the display device of the invention to be disclosed has the thin film transistor.

Note that a "film" means one formed over an entire surface without being formed into a pattern, and a "layer" means one which has been formed into a pattern with a desired shape using a resist mask or the like. However, as for each layer of stacked films, a "film" and a "layer" are used in an indistinguishable manner in some cases.

Note that etching is preferably performed under such conditions as to be "unintentionally etched" as little as possible.

Note that a film "having heat resistance" in this specification means a film which maintains a form of a film at a temperature in a later step and can maintain required functions and characteristics.

Note that a "gate wiring" means a wiring connected to a gate electrode of a thin film transistor. The gate wiring is formed using a gate electrode layer. Further, the gate wiring is sometimes referred to as a scanning line.

Note that "adjacent wirings formed using a gate electrode layer" means a gate wiring and a capacitor wiring which are adjacent to each other or two gate wirings which are adjacent to each other. Any wiring which is formed using a gate electrode layer may be included regardless of functions of the wiring.

Note that a "source wiring" in this specification means a wiring connected to one of a source electrode and a drain electrode of a thin film transistor. The source wiring is formed using a source and drain electrode layer. Further, the source wiring is sometimes referred to as a signal line.

In addition, a "power supply line" means a wiring which is connected to a power supply and is held at a constant potential.

A pattern of a gate electrode can formed without a new photomask, and the number of steps for manufacturing a thin film transistor can be significantly reduced. The thin film transistor can be applied to a display device. Accordingly, the number of steps for manufacturing a display device can be significantly reduced as well.

More specifically, the number of photomasks can be reduced. It is also possible to manufacture a thin film transistor using one photomask (multi-tone mask). Accordingly, the number of steps for manufacturing a thin film transistor or a display device can be significantly reduced. Also, since thin film transistors can be manufactured by using only one photomask, positional alignment of the photomask can be prevented from being misaligned.

In addition, a complicated step using backside light exposure, resist reflow, a lift-off method, or the like is not needed unlike the conventional technique that is aimed at reducing the number of photomasks. Therefore, the number of steps for manufacturing a display device can be significantly reduced without reducing yield of the display device.

In the conventional technique that is aimed at reducing the number of photomasks, electrical characteristics of a thin film transistor have often been sacrificed. In another mode of the invention, the number of steps for manufacturing a thin film transistor can be significantly reduced while electrical characteristics of the thin film transistor are maintained. Therefore, the number of steps for manufacturing a display device can be significantly reduced without sacrificing display quality of the display device or the like.

Further, by the above-described effects, manufacturing cost of a thin film transistor and a display device can be significantly reduced.

Furthermore, by provision of an opening portion as described above, a contact area between a film which is to be etched and a chemical solution or a gas which is used for the etching in the second etching can be increased. Thus, controllability of the second etching can be improved, and a thin film transistor with smaller parasitic capacitance can be manufactured compared to the case where an opening portion is not provided. Further, insufficient insulation between adjacent wirings formed using a gate electrode layer can be prevented and thin film transistors and display devices can be manufactured with high yield.

In addition, by increasing a contact area between a film which is to be etched and a chemical solution or a gas which is used for the etching in the second etching, etching can be favorably performed even in the case where there is concern that etching is hindered by a residue or the like which is caused in manufacturing steps and is left on a plane to be etched.

Note that by provision of an opening portion, the layout is not determined depending on the side-etching amount of the second etching. Thus, without reducing the freedom of layout design, the number of steps for manufacturing a thin film transistor and a display device can be significantly reduced.

Furthermore, because a thin film transistor with low leakage current at an end portion of the gate electrode layer can be manufactured, a display device with a high contrast ratio and high display quality can be obtained.

BRIEF DESCRIPTION OF THE DRAWINGS

FIGS. 1A-1 and 1A-2 and FIGS. 1B-1 and 1B-2 each illustrate a method for manufacturing a thin film transistor.

FIGS. 28A-1 and 28A-2 and FIGS. 28B-1 and 28B-2 each illustrate a multi-tone mask.

DETAILED DESCRIPTION OF THE INVENTION

Embodiment

Figure 2A:
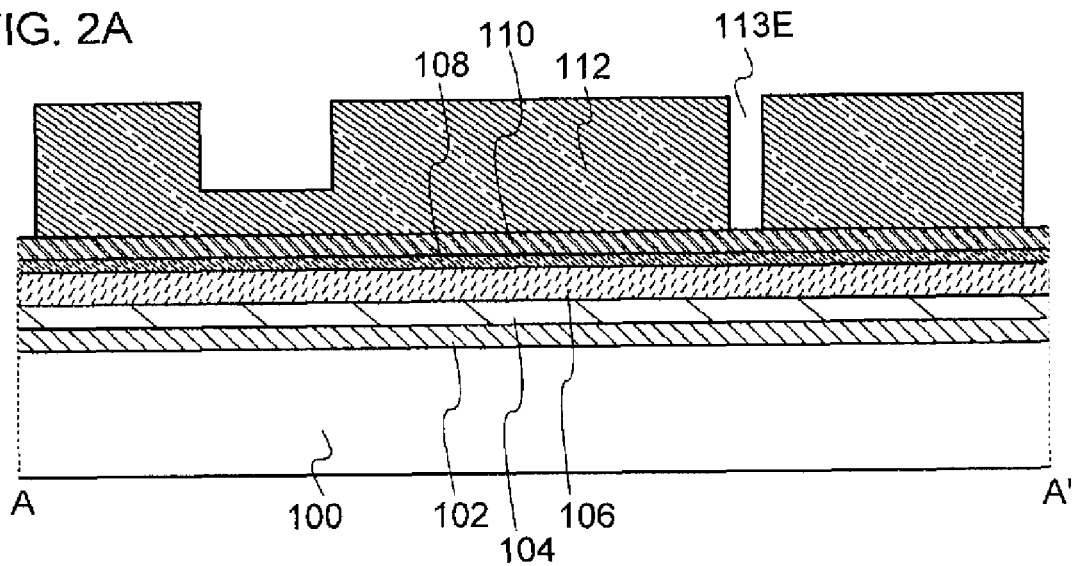
FIGS. 2A to 2C illustrate an example of a method for manufacturing a thin film transistor and a display device.
Figure 2B:
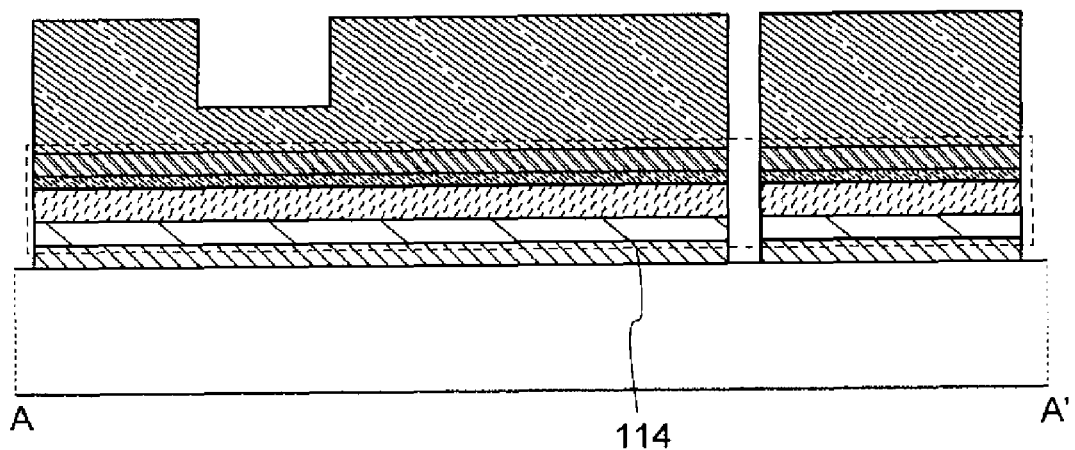
Figure 2C:
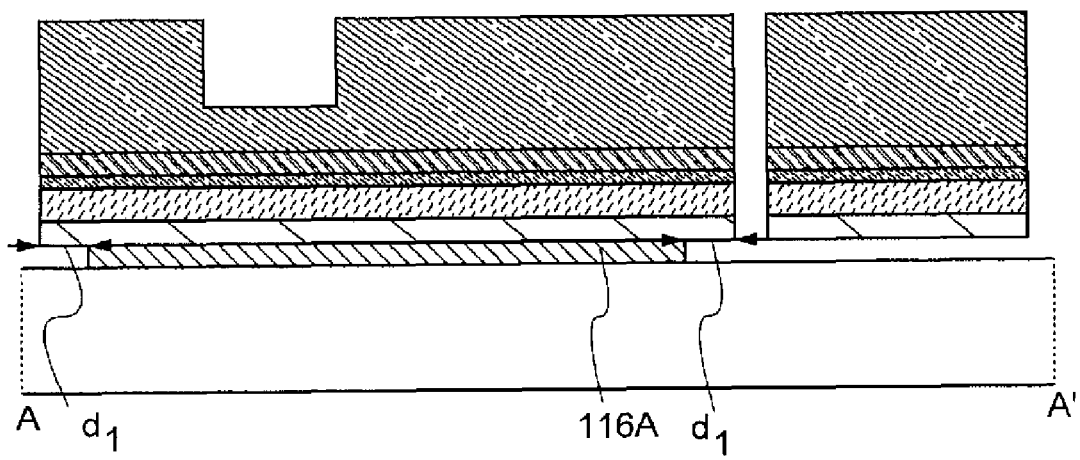

Hereinafter, embodiment modes of the present invention will be explained with reference to the accompanying drawings. However, note that it is easily understood by those skilled in the art that the invention is not limited to the following descriptions, and various changes may be made in forms and details without departing from the spirit and the scope of the invention. Therefore, the invention is not interpreted as being limited to the following description of the embodiment modes. Note that the same reference numerals are commonly used to denote the same components among different drawings in structures of the invention explained below. The same hatching pattern is applied to similar parts, and the similar parts are not especially denoted by reference numerals in some cases. In addition, a first insulating film and a second insulating film are not illustrated in the top views.

Embodiment 1

In this embodiment, an example of a method for manufacturing a thin film transistor and a method for manufacturing a display device in which the thin film transistors are arranged in matrix will be described with reference to FIGS. 2A to 2C, FIGS. 3A to 3C, FIGS. 4A to 4C, FIGS. 5A to 5C, FIGS. 6A to 6C, FIGS. 7A to 7C, FIGS. 5A to 8C, FIGS. 9A to 9C, FIGS. 10A to 10C, FIGS. 11A to 11C, FIGS. 12A to 12C, FIGS. 13A to 13C, FIGS. 14A to 14C, FIGS. 15A to 15C, FIGS. 16A to 16C, FIG. 17, FIG. 18, FIG. 19, FIG. 20, FIG.

21, FIG. 22, FIG. 23, FIG. 24, FIG. 25, FIG. 26, FIGS. 27A to 27C, and FIGS. 28A-1 and 28A-2 and FIGS. 28B-1 and 28B-2.

Figure 21:
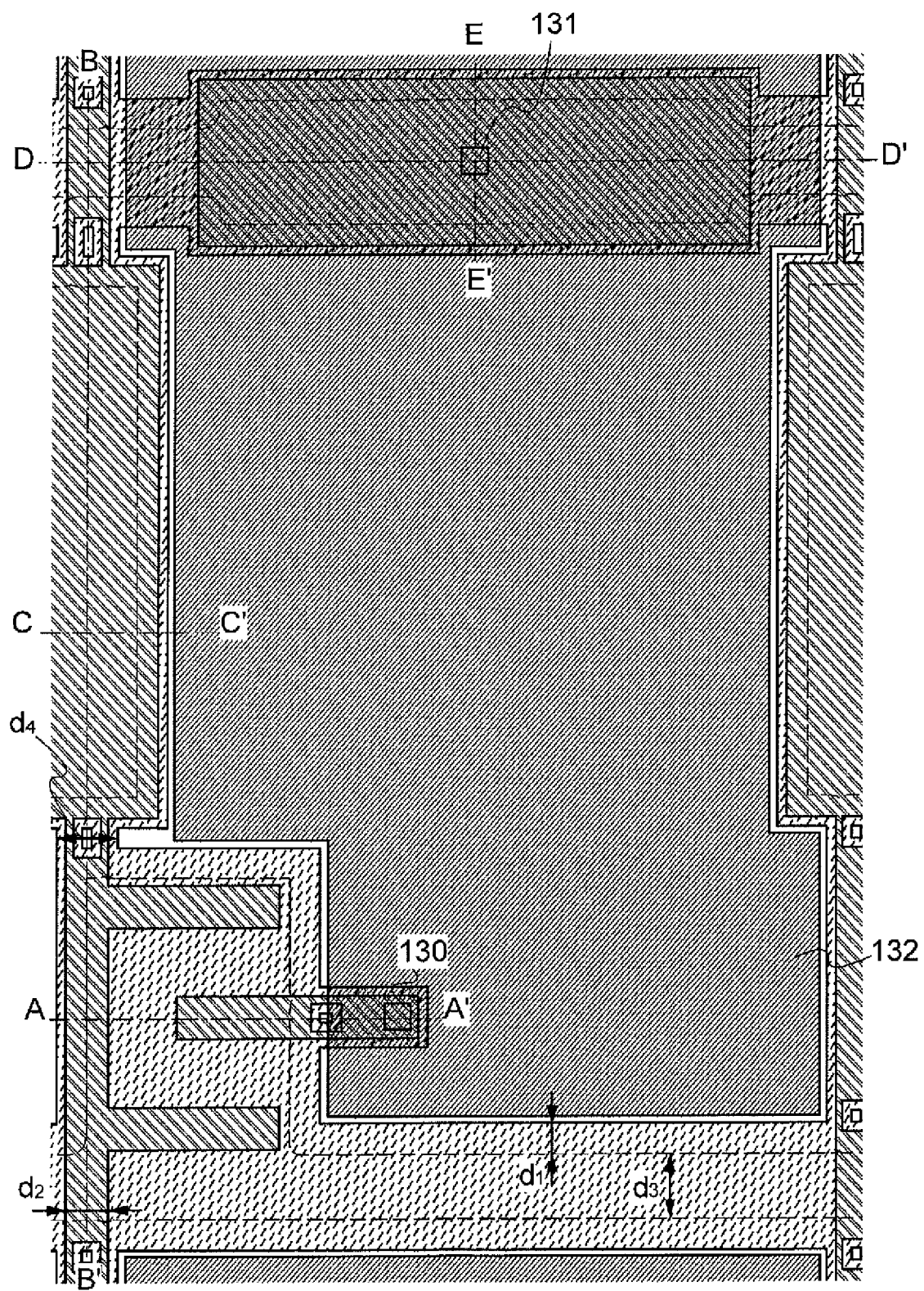
FIG. 21 illustrates an example of a method for manufacturing a thin film transistor and a display device.

FIG. 17, FIG. 18, FIG. 19, FIG. 20, and FIG. 21 are top views of thin film transistors according to this embodiment. FIG. 21 is a completion view in which components are formed up to a pixel electrode. FIGS. 2A to 2C, FIGS. 3A to 3C, and FIGS. 4A to 4C are cross-sectional views taken along the line A-A' in FIG. 17, FIG. 18, FIG. 19, FIG. 20, and FIG. 21. FIGS. 5A to 5C, FIGS. 6A to 6C, and FIGS. 7A to 7C are cross-sectional views taken along the line B-B' in FIG. 17, FIG. 18, FIG. 19, FIG. 20, and FIG. 21. FIGS. 8A to 8C, FIGS. 9A to 9C, and FIGS. 10A to 10C are cross-sectional views taken along the line C-C' in FIG. 17, FIG. 18, FIG. 19, FIG. 20, and FIG. 21. FIGS. 11A to 11C, FIGS. 12A to 12C, and FIGS. 13A to 13C are cross-sectional views taken along the line D-D' in FIG. 17, FIG. 18, FIG. 19, FIG. 20, and FIG. 21. FIGS. 14A to 14C, FIGS. 15A to 15C, and FIGS. 16A to 16C are cross-sectional views taken along the line E-E' in FIG. 17, FIG. 18, FIG. 19, FIG. 20, and FIG. 21.

First, a first conductive film 102, a first insulating film 104, a semiconductor film 106, an impurity semiconductor film 108, and a second conductive film 110 are formed over a substrate 100. These films may each have a single layer or stacked layers including a plurality of films. Note that an insulating film may be provided between the substrate 100 and the first conductive film 102 as a base film.

The substrate 100 is an insulating substrate. In the case of being employed for a display device, a glass substrate or a quartz substrate can be used as the substrate 100. In this embodiment, a glass substrate is used.

The first conductive film 102 is formed using a conductive material. The first conductive film 102 can be formed using a conductive material such as a metal, e.g., titanium, molybdenum, chromium, tantalum, tungsten, aluminum, copper, neodymium, niobium, scandium, or the like, or an alloy including any of these metal materials as a main component. Note that the material of the first conductive film 102 needs to have such heat resistance as to withstand a later step (such as formation of the first insulating film 104) and be not unintentionally etched or eroded in a later step (such as etching of the second conductive film 110). As long as these conditions are satisfied, the material of the first conductive film 102 is not limited to a particular material.

In addition, the first conductive film 102 can be formed by, for example, a sputtering method, a CVD method (including a thermal CVD method, a plasma CVD method, and the like), or the like. However, the formation method of the first conductive film 102 is not limited to a particular method.

The first insulating film 104 is formed using an insulating material. The first insulating film 104 can be formed using, for example, a silicon oxide film, a silicon nitride film, a silicon oxynitride film, a silicon nitride oxide film, or the like. Note that as in the case of the first conductive film 102, the material of the first insulating film 104 needs to have such heat resistance as to withstand a later step (such as formation of the semiconductor film 106) and be not unintentionally etched or eroded in a later step. As long as these conditions are satisfied, the material of the first insulating film 104 is not limited to a particular material.

Further, the first insulating film 104 can be formed by, for example, a CVD method (including a thermal CVD method, a plasma CVD method, and the like), a sputtering method, or the like. However, the formation method of the first insulating film 104 is not limited to a particular method.

Furthermore, the first insulating film 104 serves as a gate insulating film,

The semiconductor film 106 is formed using a semiconductor material. The semiconductor film 106 can be formed using, for example, amorphous silicon formed using a silane gas or the like. Note that as in the case of the first conductive film 102 and the like, the material of the semiconductor film 106 needs to have such heat resistance as to withstand a later step (such as formation of the second conductive film 110 and the like) and be not unintentionally etched or eroded in a later step. As long as these conditions are satisfied, the material of the semiconductor film 106 is not limited to a particular material. Therefore, germanium or the like may be used. Note that the crystallinity of the semiconductor film 106 is not particularly limited as well.

In addition, the semiconductor film 106 can be formed by, for example, a CVD method (including a thermal CVD method, a plasma CVD method, and the like), a sputtering method, or the like. However, the formation method of the semiconductor film 106 is not limited to a particular method.

The impurity semiconductor film 108 is a semiconductor film containing an impurity element imparting one conductivity type, and is formed using a gas for forming a semiconductor material to which the impurity element imparting one conductivity type is added or the like. For example, the impurity semiconductor film 108 is a silicon film containing phosphorus or boron, which is formed using a silane gas containing phosphine (chemical formula: $PH_3$) or diborane (chemical formula: $B_2H_6$). Note that as in the case of the first conductive film 102 and the like, the material of the impurity semiconductor film 108 needs to have such heat resistance as to withstand a later step (such as formation of the second conductive film 110 and the like) and be not unintentionally etched or eroded in a later step. As long as these conditions are satisfied, the material of the impurity semiconductor film 108 is not limited to a particular material. Note that the crystallinity of the impurity semiconductor film 108 is not particularly limited as well.

In the case of manufacturing an n-channel thin film transistor, phosphorus, arsenic, or the like may be used as the impurity element imparting one conductivity type to be added. That is, a silane gas used for formation of the impurity semiconductor film 108 may contain phosphine, arsine (chemical formula: $AsH_3$), or the like at a desired concentration. On the contrary, in the case of manufacturing a p-channel thin film transistor, boron or the like may be added as the impurity element imparting one conductivity type. That is, a silane gas used for formation of the impurity semiconductor film 108 may contain diborane or the like at a desired concentration. Further, in the case where a region which can make ohmic contact to a source and drain electrode layer is provided by doping or the like in a part of a semiconductor layer formed using the semiconductor film 106, the impurity semiconductor film 108 does not need to be provided.

In addition, the impurity semiconductor film 108 can be formed by, for example, a CVD method (including a thermal CVD method, a plasma CVD method, and the like), or the like. However, the formation method of the impurity semiconductor film 108 is not limited to a particular method.

The second conductive film 110 is formed using a material which is a conductive material (a material mentioned as the material of the first conductive film 102) but is different from the material used for the first conductive film 102. Here, the "different material" means a material having a different main component. Specifically, a material which is not easily etched by second etching that is described later is preferably selected. Further, as in the case of the first conductive film 102 and the like, the material of the second conductive film 110 needs to have such heat resistance as to withstand a later step (such as formation of a first protective film 126 and the like) and be not unintentionally etched or eroded in a later step. Accordingly, as long as these conditions are satisfied, the material of the second conductive film 110 is not limited to a particular material.

In addition, the second conductive film 110 can be formed by, for example, a sputtering method, a CVD method (including a thermal CVD method, a plasma CVD method, and the like), or the like. However, the formation method of the second conductive film 110 is not limited to a particular method.

Note that as for heat resistance required for the first conductive film 102, the first insulating film 104, the semiconductor film 106, the impurity semiconductor film 108, and the second conductive film 110, which are described above, the first conductive film 102 requires the highest heat resistance, the heat resistance required for the films becomes lower in order of the above description, and the second conductive film 110 requires the lowest heat resistance. For example, in the case where the semiconductor film 106 is an amorphous semiconductor film containing hydrogen, hydrogen in the semiconductor film is desorbed at about 300° C. or more and electrical characteristics change. Accordingly, for example, the temperature may be set so as not to exceed about 300° C. in steps after formation of the semiconductor film 106.

Next, a first resist mask 112 is formed over the second conductive film 110 (see FIG. 2A, FIG. 5A, FIG. 8A, FIG. 11A, and FIG. 14A). The first resist mask 112 is a resist mask having a recessed portion and a projected portion. In other words, the first resist mask 112 can also be referred to as a resist mask including a plurality of regions (here, two regions) having different thicknesses. In the first resist mask 112, the thick region is called a projected portion of the first resist mask 112 and the thin region is called a recessed portion of the first resist mask 112.

In the first resist mask 112, a projected portion is formed in a region where a source and drain electrode layer 120 is formed, and a recessed portion is formed in a region where a semiconductor layer is exposed without existence of the source and drain electrode layer 120.

The first resist mask 112 can be formed using a multi-tone mask. Here, multi-tone masks will be described with reference to FIGS. 28A-1 and 28A-2 and FIGS. 28B-1 and 28B-2.

A multi-tone mask is a mask capable of light exposure with multi-level light intensity, and typically, light exposure is performed with three levels of light intensity with the use of an exposed region, a half-exposed region, and an unexposed region. When using the multi-tone mask, one-time light exposure and development process allows a resist mask with plural thicknesses (typically, two levels of thicknesses) to be formed. Therefore, by the usage of a multi-tone mask, the number of photomasks can be reduced.

Figures 1, 28A:
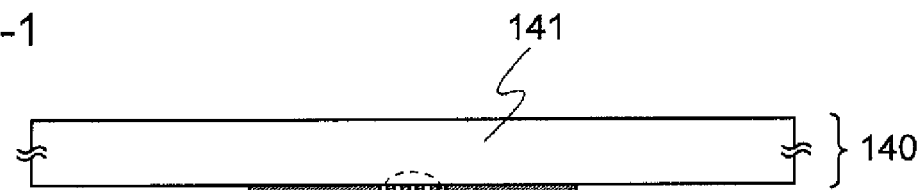
Figures 2, 28A:
Figures 1, 28B:
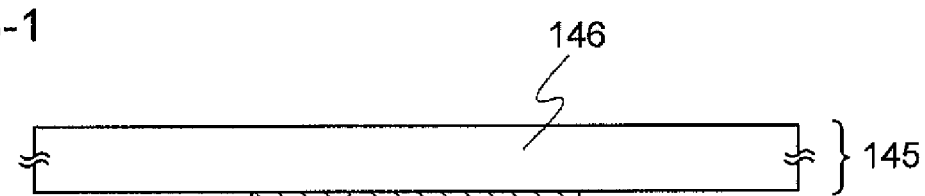
Figures 2, 28B:

FIGS. 28A-1 and 28B-1 are cross-sectional views of typical multi-tone masks. A gray-tone mask 140 is illustrated in FIG. 28A-1 and a half-tone mask 145 is illustrated in FIG. 28B-1.

The gray-tone mask 140 illustrated in FIG. 28A-1 includes a light-blocking portion 142 formed using a light-blocking film on a substrate 141 having a light-transmitting property, and a diffraction grating portion 143 provided with a pattern of the light-blocking film.

The transmittance of light is controlled at the diffraction grating portion 143 in such a manner that slits, dots, mesh, or the like are provided at an interval equal to or less than the resolution limit of light used for light exposure. Note that the slits, dots, or mesh provided at the diffraction grating portion 143 may be provided at regular or irregular intervals.

As the substrate 141 having a light-transmitting property, quartz or the like can be used. The light-blocking film for forming the light-blocking portion 142 and the diffraction grating portion 143 may be formed using a metal film and preferably provided using chromium, chromium oxide, or the like.

In the case where the gray-tone mask 140 is irradiated with light for light exposure, as illustrated in FIG. 28A-2, the transmittance in the region overlapping with the light-blocking portion 142 is 0%, and the transmittance in the region where both the light-blocking portion 142 and the diffraction grating portion 143 are not provided is 100%. Further, the transmittance at the diffraction grating portion 143 is basically in the range of 10% to 70%, which can be adjusted by the interval of slits, dots, or mesh of the diffraction grating, or the like.

The half-tone mask 145 illustrated in FIG. 28B-1 includes a semi-light-transmitting portion 147 formed using a semi-light-transmitting film on a substrate 146 having a light-transmitting property, and a light-blocking portion 148 formed using a light-blocking film.

The semi-light-transmitting portion 147 can be formed using a film of MoSiN, MoSi, MoSiO, MoSiON, CrSi, or the like. The light-blocking portion 148 may be formed using a metal film which is the same as or substantially the same as the light-blocking film of the gray-tone mask and preferably provided using chromium, chromium oxide, or the like.

In the case where the half-tone mask 145 is irradiated with light for light exposure, as illustrated in FIG. 28B-2, the transmittance in the region overlapping with the light-blocking portion 148 is 0%, and the transmittance in the region where both the light-blocking portion 148 and the semi-light-transmitting portion 147 are not provided is 100%. Further, the transmittance in the semi-light-transmitting portion 147 is basically in the range of 10% to 70%, which can be adjusted by the kind, the thickness, or the like of the material to be formed.

By light exposure using the multi-tone mask and development, the first resist mask 112 that includes regions having different thicknesses can be formed.

Note that the embodiment mode is not limited thereto and the first resist mask may be formed without using the multi-tone mask. Further, as described above, the first resist mask may be a resist mask which does not have a projected portion and a recessed portion.

Figure 17:
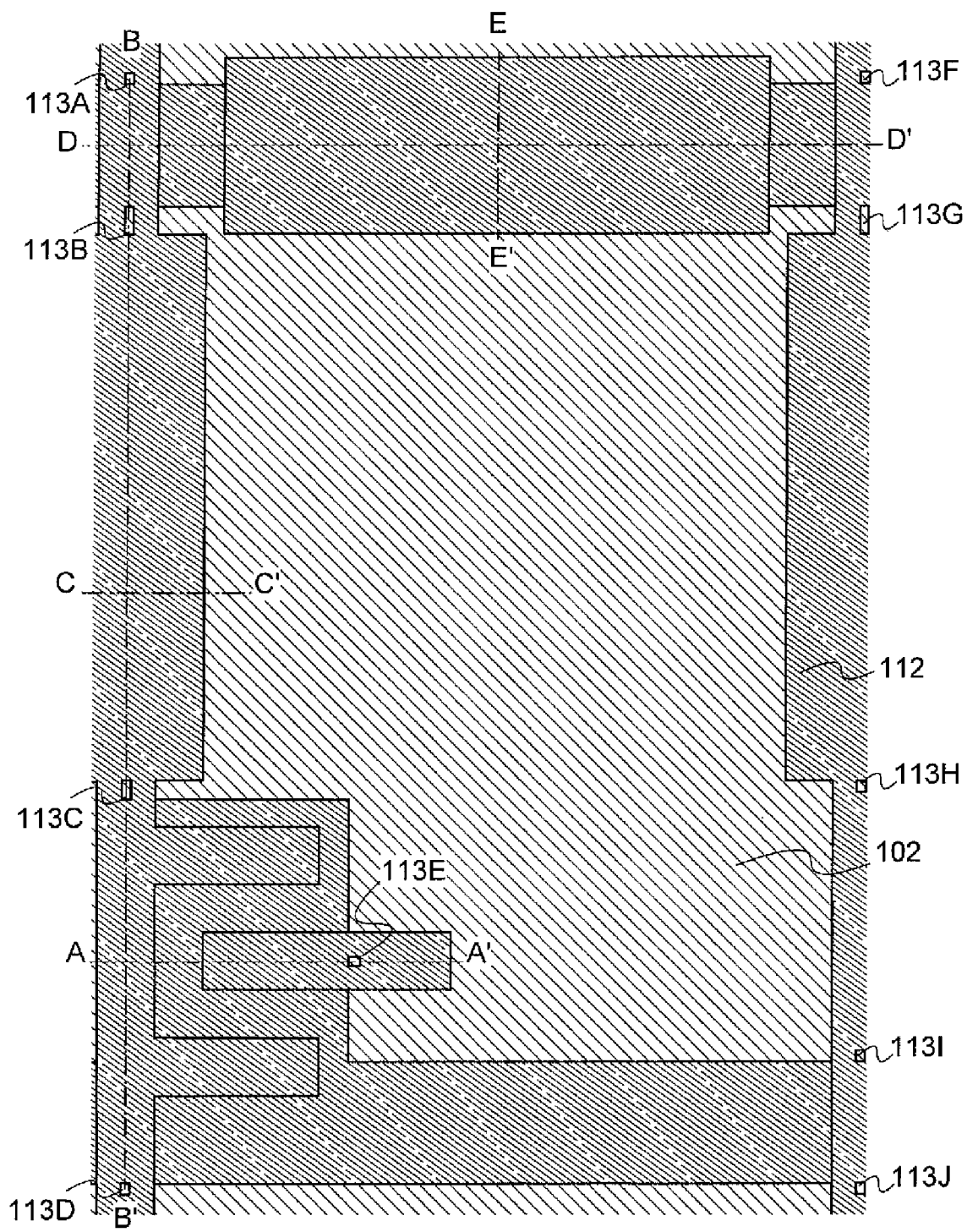
FIG. 17 illustrates an example of a method for manufacturing a thin film transistor and a display device.

Furthermore, the first resist mask 112 has resist opening portions 113A to 113J as illustrated in FIG. 17.

Here, at least one resist opening portion may be provided between adjacent wirings formed using a conductive layer (a gate electrode layer 116) which is the processed first conductive film 102. Because the first resist mask 112 has the resist opening portion in a region overlapping with the source wiring, an opening portion can be formed in a thin-film stack body 114 by the first etching. Note that the opening portion to be provided in the thin-film stack body 114 is preferably formed so as to reach at least a surface of the first conductive film 102. By provision of the opening portion in the thin-film stack body 114, controllability of the second etching that is described later can be improved. Moreover, because the first resist mask 112 has at least one resist opening portion between a gate wiring and a capacitor wiring, which are adjacent to each other, in a region overlapping with a source wiring, the accuracy of insulation between a gate wiring and a capacitor wiring, which are adjacent to each other, by the second etching that is described later can be improved.

Note that at an intersection of the source wiring and the wiring provided using the conductive layer (the gate electrode layer 116) that is the processed first conductive film 102, the resist opening portion is preferably provided at a position where the gate wiring is sandwiched between them (see FIG. 17, FIG. 18, FIG. 19, FIG. 20, and FIG. 21). At this time, a distance between the opening portion and the gate wiring may be determined in accordance with the etching rate of the side-etching. By the second etching accompanied by the side-etching, a horn is not generated in the conductive layer (the gate electrode layer 116) that is the processed first conductive film 102, or the horn can be formed to be smaller even when the horn is generated.

Next, first etching is performed using the first resist mask 112. That is, the first insulating film 104, the semiconductor film 106, the impurity semiconductor film 108, and the second conductive film 110 are patterned by etching to form the thin-film stack body 114 (see FIG. 2B, FIG. 5B, FIG. 8B, FIG. 11B, FIG. 14B, and FIG. 17). At this time, at least a surface of the first conductive film 102 is preferably exposed. This etching step is called "first etching." As the first etching, either dry etching or wet etching may be used. In addition, a highly anisotropic etching (physical etching) method is preferably employed. By employing the highly anisotropic etching method as the first etching, the precision of the processing for forming a pattern can be improved. Note that the first etching can be performed in one step when dry etching is employed as the first etching, while the first etching is preferably performed in plural steps when wet etching is employed as the first etching. This is because the etching rate varies depending on the kind of a film to be etched and it is difficult to perform the etching of all films in one step.

Note that the first etching may be performed by, for example, three stages of dry etching. First, etching may be performed in a mixed gas including a $Cl_2$ gas, a $CF_4$ gas, and an $O_2$ gas. Then, etching may be performed using only a $Cl_2$ gas. Lastly, etching may be performed using only a $CHF_3$ gas.

Next, second etching is performed using the first resist mask 112. That is, the first conductive film 102 is patterned by the etching to form the gate electrode layer 116 (see FIG. 2C, FIG. 5C, FIG. 8C, FIG. 11C, FIG. 14C, and FIG. 18). This etching step is called "second etching".

Note that the gate electrode layer 116 includes a gate electrode of a thin film transistor, a gate wiring, one electrode of a capacitor element, a capacitor wiring, and a supporting portion. When a gate electrode layer is referred to as a gate electrode layer 116A, the gate electrode layer means an electrode layer which includes a gate wiring and a gate electrode of a thin film transistor; when a gate electrode layer is referred to as a gate electrode layer 116B or a gate electrode layer 116D, the gate electrode layer means an electrode layer which includes a supporting portion; and when a gate electrode layer is referred to as a gate electrode layer 116C, the gate electrode layer means an electrode layer which includes a capacitor wiring and one electrode of a capacitor element. Then, these gate electrode layers are collectively referred to as the gate electrode layer 116.

Note that positions of the resist opening portions 113A to 113J that are described above are not limited to the positions illustrated in drawings. The resist opening portions 113A to 113J can be provided at a required position or a preferable position when forming the gate electrode layer 116 by the second etching that is described below.

The second etching is performed under such etching conditions that a side surface of the gate electrode layer 116 formed using the first conductive film 102 is provided more on the inside than a side surface of the thin-film stack body 114. In other words, the second etching is performed so that the side surface of the gate electrode layer 116 is in contact with a bottom surface of the thin-film stack body 114 (the etching is performed such that the width of the gate electrode layer 116 is narrower than that of the thin-film stack body 114 along the line A-A' in FIGS. 17 to 21). Further, the second etching is performed under such conditions that the etching rate of the second conductive film 110 is low and the etching rate of the first conductive film 102 is high. In other words, the second etching is performed under the conditions that the etching selectivity of the first conductive film 102 with respect to the second conductive film 110 is high. By performing the second etching under such conditions, the gate electrode layer 116 can be formed.

Note that the shape of the side surface of the gate electrode layer 116 is not particularly limited. For example, the shape may be a tapered shape. The shape of the side surface of the gate electrode layer 116 is determined in accordance with the conditions such as a chemical solution used in the second etching.

Here, the phrase "the conditions that the etching rate of the second conductive film 110 is low and the etching rate of the first conductive film 102 is high" or "the conditions that the etching selectivity of the first conductive film 102 with respect to the second conductive film 110 is high" means conditions satisfying the following first requirement and second requirement.

The first requirement is that the gate electrode layer 116 is left in necessary places. The places where the gate electrode layer 116 is necessary are regions indicated by dotted lines in FIG. 18, FIG. 19, FIG. 20, and FIG. 21. That is, it is necessary that the gate electrode layer 116 is left so as to form a gate wiring, a capacitor wiring, and a supporting portion after the second etching. In order that the gate electrode layer forms the gate wiring and the capacitor wiring, the second etching needs to be performed so as not to disconnect these wirings. As illustrated in FIGS. 2A to 2C and FIG. 18, the side surface of the gate electrode layer 116 is preferably provided more on the inside than the side surface of the thin-film stack body 114 by a distance $d_1$, and the distance $d_1$ may be set as appropriate by a practitioner in accordance with the layout.

The second requirement is that a width $d_3$ of the gate wiring or the capacitor wiring formed using the gate electrode layer 116 and a minimum width $d_2$ of a source wiring formed using a source and drain electrode layer 120A have appropriate values (see FIG. 21). This is because as the source and drain electrode layer 120A is etched by the second etching, the minimum width $d_2$ of the source wiring is reduced; accordingly, the current density of the source wiring becomes excessive and electrical characteristics are degraded. Therefore, the second etching is performed under the conditions that the etching rate of the first conductive film 102 is not too high and the etching rate of the second conductive film 110 is as low as possible.

Here, the case where the resist opening portions 113A to 113J are not provided is discussed. In the case where the resist opening portions 113A to 113J are not provided, it is difficult to make the minimum width $d_2$ of the source wiring large. This is because in the case where the resist opening portions 113A to 113J are not provided, the minimum width $d_2$ of the source wiring is determined by a minimum width $d_4$ of the semiconductor layer overlapping with the source wiring and the minimum width $d_4$ of the semiconductor layer has to be increased in order to make the minimum width $d_2$ of the source wiring larger; accordingly, it becomes difficult that the gate wiring and the capacitor wiring, which are adjacent to each other, are insulated from each other. In this case, the minimum width $d_4$ of the semiconductor layer needs to be set smaller than about twice the distance $d_1$. In other words, the distance $d_1$ needs to be set larger than about half the minimum width $d_4$ of the semiconductor layer. Thus, the layout available to be designed is limited. Moreover, the etching rate of a chemical solution used in the second etching needs to be sufficient. When insulation between the gate wiring and the capacitor wiring, which are adjacent to each other, is secured, an etching gas, a chemical solution, or the like, which can be used for the second etching, is limited.

Accordingly, as described above, by providing the first resist mask 112 with the resist opening portions 113A to 113J, the number of paths through which an etching gas, a chemical solution, or the like enters is increased and the shape of the gate electrode layer 116 can be a preferable shape. Further, the range of choices of chemical solutions used for the etching can be expanded, and the range of choices of materials can be expanded as well.

Furthermore, in the case where the resist opening portions 113A to 113J are not provided, as described above, a horn is formed in the gate electrode layer 116 in the top views in some cases. This is because the second etching is roughly isotropic. In addition, in some cases, the horn is in contact with the gate wiring and the capacitor wiring, which are adjacent to each other; accordingly, the gate wiring and the capacitor wiring, which are adjacent to each other, are electrically connected, which becomes the cause of reduction in yield. However, as described above, by provision of the resist opening portions 113A to 113J, insulation between the gate wiring and the capacitor wiring, which are adjacent to each other, can be secured, which makes it possible to increase yield.

Moreover, even when insulation between the gate wiring and the capacitor wiring, which are adjacent to each other, can be secured without provision of the resist opening portions, parasitic capacitance is generated due to the existence of the horn that is described above, which causes delay of a signal and the like. As described above, by providing the first resist mask 112 with the resist opening portions 113A to 113J, generation of the horn can be prevented and the horn can be made to be smaller. Accordingly, generation of parasitic capacitance can be suppressed and display devices with excellent characteristics or the like can be manufactured.

Note that there may be at least one portion where the width of the semiconductor layer overlapping with the source wiring is the minimum width $d_4$ between the gate wiring and the capacitor wiring that is adjacent to the gate wiring. It is preferable that the width of the semiconductor layer in a region adjacent to the gate wiring and a region adjacent to the capacitor wiring be the minimum width $d_4$ as illustrated in FIG. 21.

Note that as in the case of the portion where the width of the semiconductor layer overlapping with the source wiring is the minimum width $d_4$, one resist opening portion to be provided in the first resist mask 112 may be provided between the gate wiring and the capacitor wiring, which are adjacent to each other, and all of the resist opening portions are not necessarily provided. For example, the resist opening portion that is provided at a position adjacent to the supporting portion, that is, only the resist opening portion 113B, the resist opening portion 113C, the resist opening portion 113G, and the resist opening portion 113H may be provided, or only the resist opening portion 113B and the resist opening portion 113G to be provided between the capacitor wiring and the supporting portion may be provided.

However, there is a problem in that the width of the source wiring to be formed is made to be narrow when the resist opening portions 113A to 113J are provided. When a cross-sectional area of the wiring is narrower, the path for electric current becomes narrower, which leads to the increase in the amount of generated heat. The increase in the amount of generated heat causes disconnection or the like in use, which becomes the cause of the breakdown of electronic devices. That is, reliability is reduced.

Figure 22:
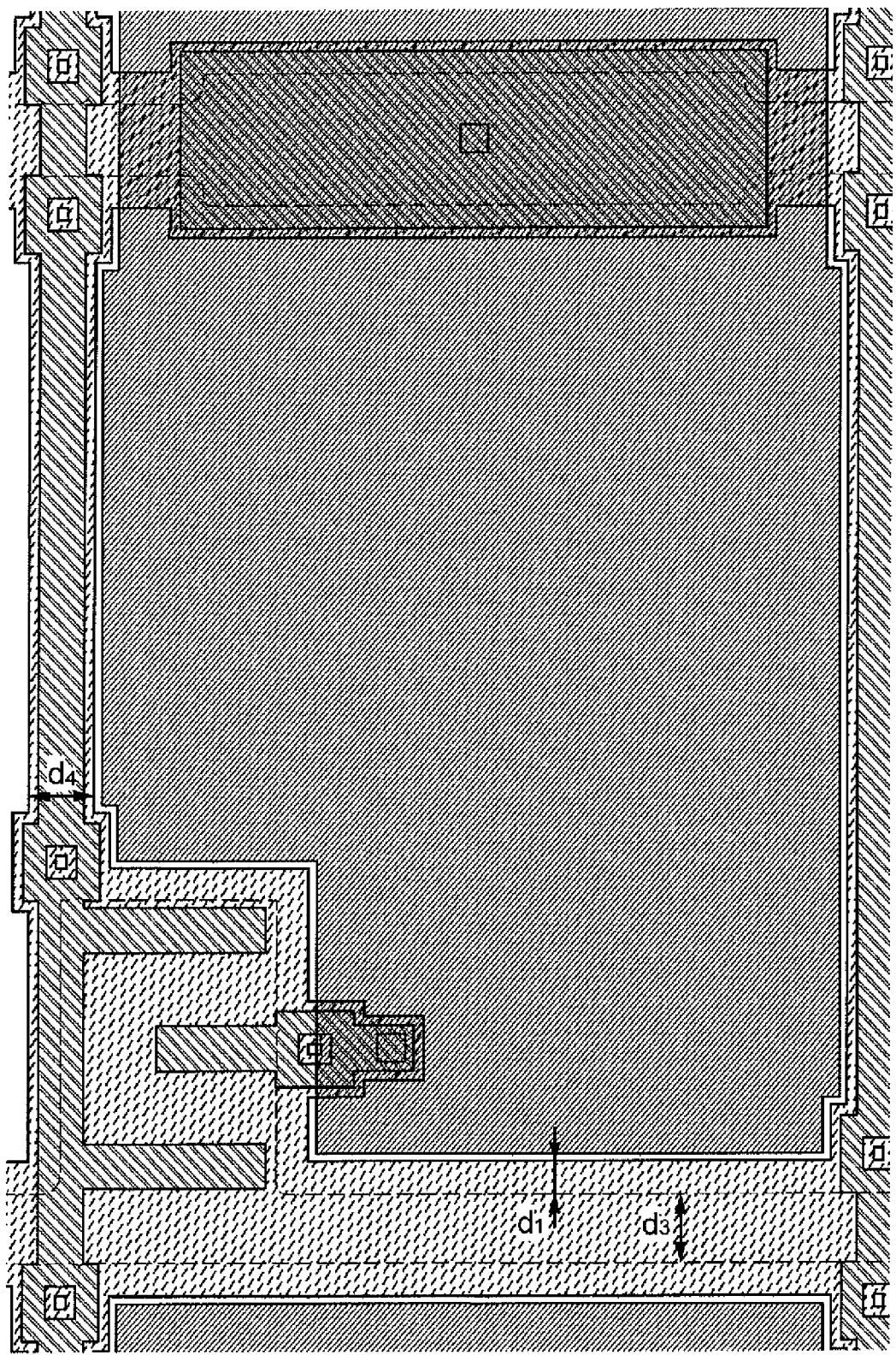
FIG. 22 illustrates an example of a method for manufacturing a thin film transistor and a display device.
Figure 23:
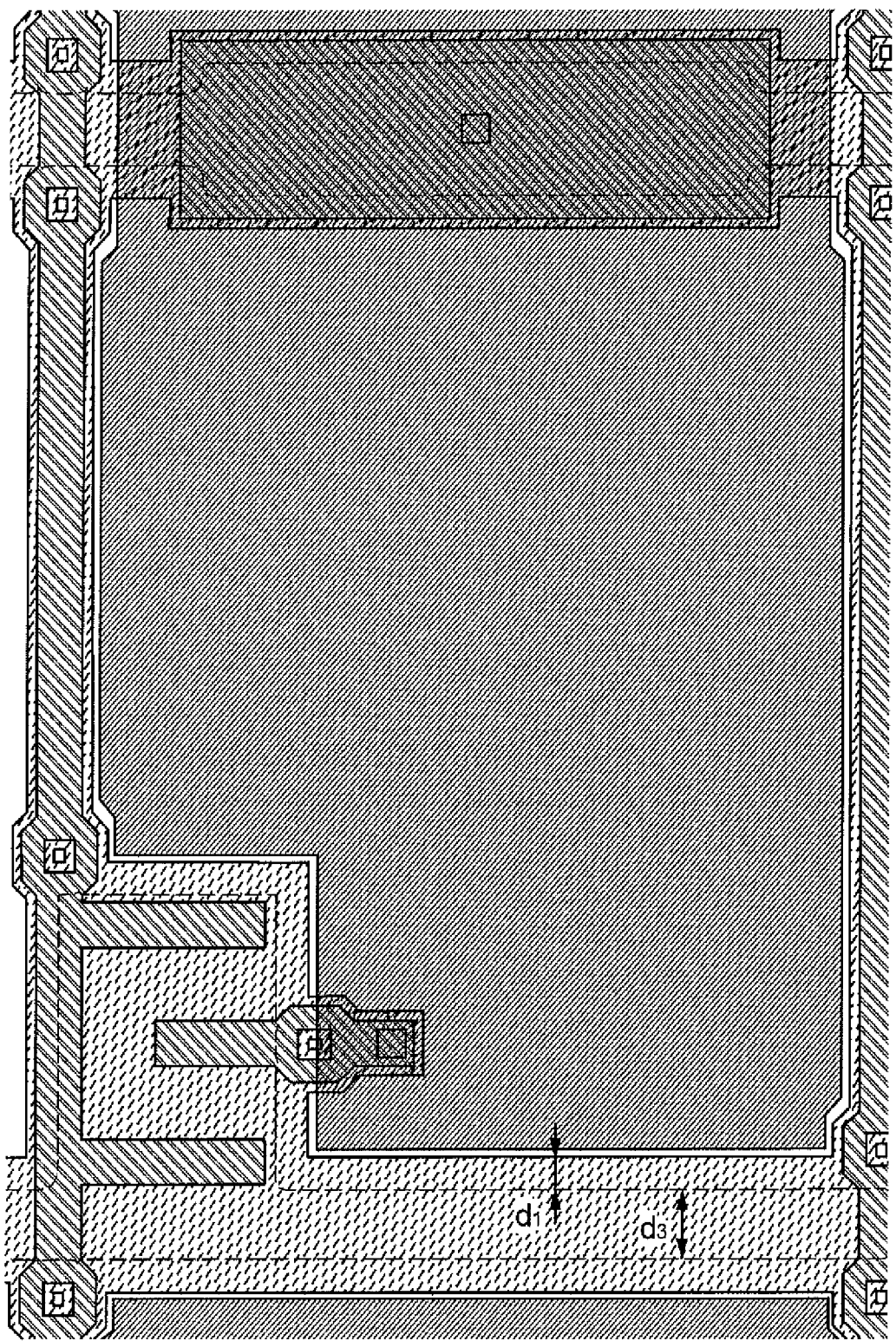
FIG. 23 illustrates an example of a method for manufacturing a thin film transistor and a display device.

Accordingly, it is preferable that the resist opening portion be provided without reducing a cross-sectional area of the source wiring. In order to provide the resist opening portion without reducing the cross-sectional area of the source wiring, the width of the source wiring may be increased by an amount equal to the width of the opening portion on the periphery of the opening portion (see FIG. 22 and FIG. 23). As illustrated in FIG. 22 and FIG. 23, by increasing the width of the source wiring on the periphery of the opening portion, the opening portion can be provided without narrowing the width of the source wiring. That is, because reliability is improved, it is preferable that the opening portion be provided in the center of a wiring which is provided as an upper layer (here, the source wiring) when the cross-sectional area of the wiring is held constant.

Alternatively, the increase in the amount of generated heat may be suppressed by increasing the thickness of the second conductive film 110 used for forming the source wiring.

In addition, it is preferable that the width of the electrode in a portion connected to a pixel electrode layer, which is formed using the source and drain electrode layer, be equal to the minimum width $d_2$ of the source wiring.

As described above, the second etching under the condition in which side-etching can be performed is very important. This is because by the second etching in which the first conductive film 102 is side-etched, the gate wiring and the capacitor wiring, which are adjacent to each other, can be formed to be securely insulated from each other (see FIG. 18).

Here, the term "side-etching" means etching in which a film is etched not only in a thickness direction of the film (a direction perpendicular to the substrate surface or a direction perpendicular to the surface of a base film of the film) but also in a direction perpendicular to the thickness direction (a direction parallel to the substrate surface or a direction parallel to the surface of the base film). An end portion subjected to side-etching can have various shapes depending on the etching rate of an etching gas or a chemical solution which is used for the etching with respect to the film. The end portion of the film is, in many cases, formed with a curved surface.

Figure 18:
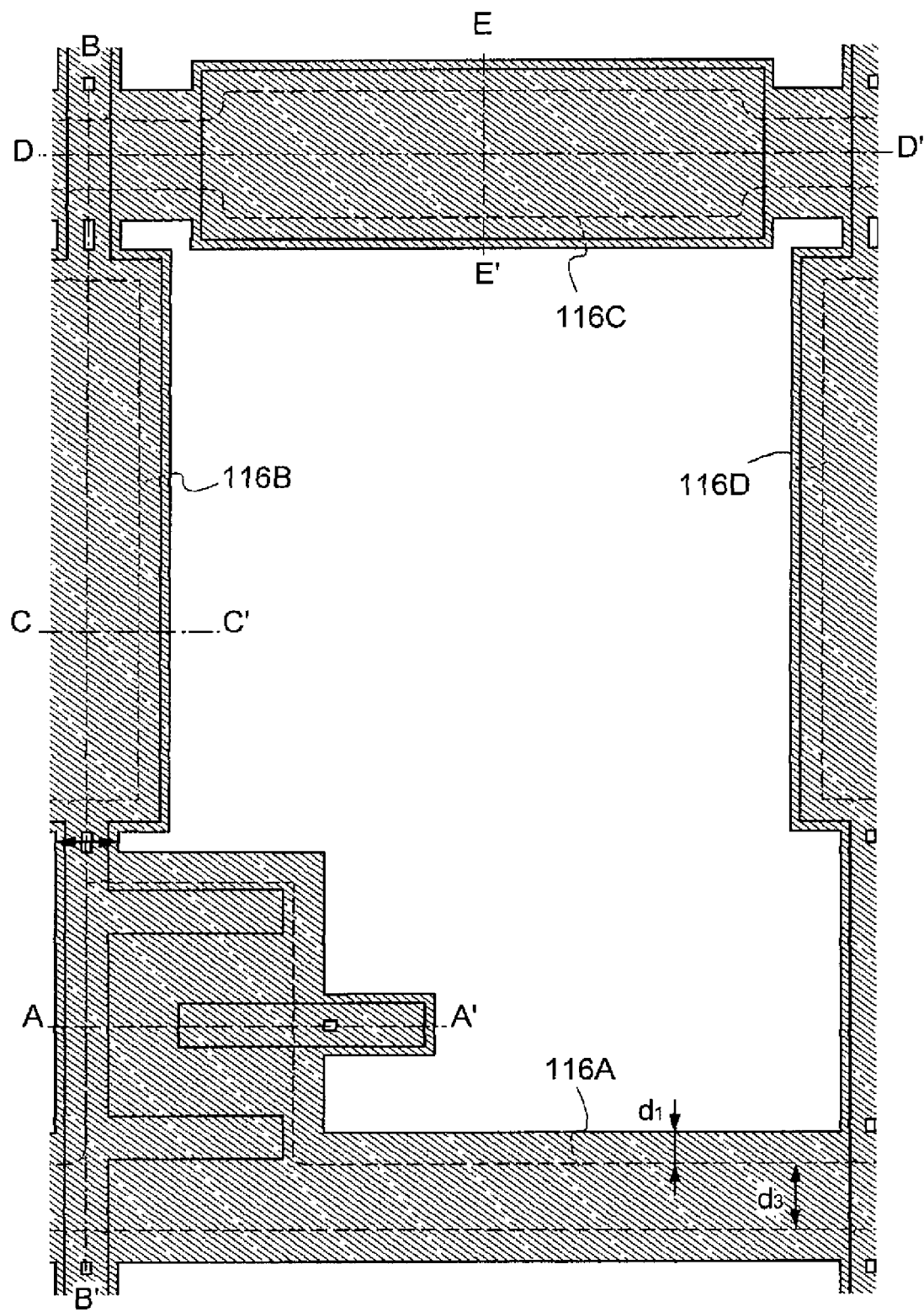
FIG. 18 illustrates an example of a method for manufacturing a thin film transistor and a display device.
Figure 19:
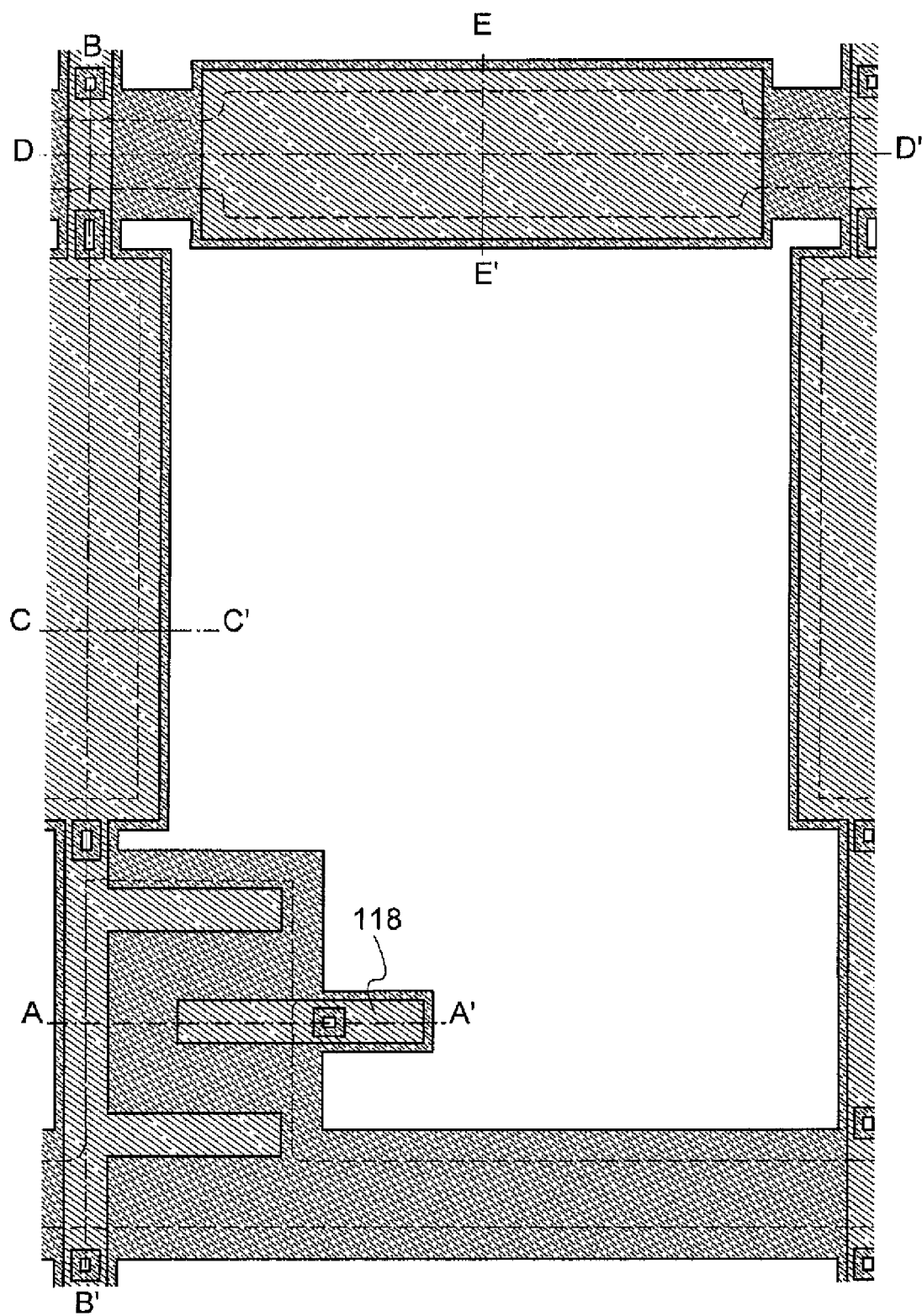
FIG. 19 illustrates an example of a method for manufacturing a thin film transistor and a display device.
Figure 20:
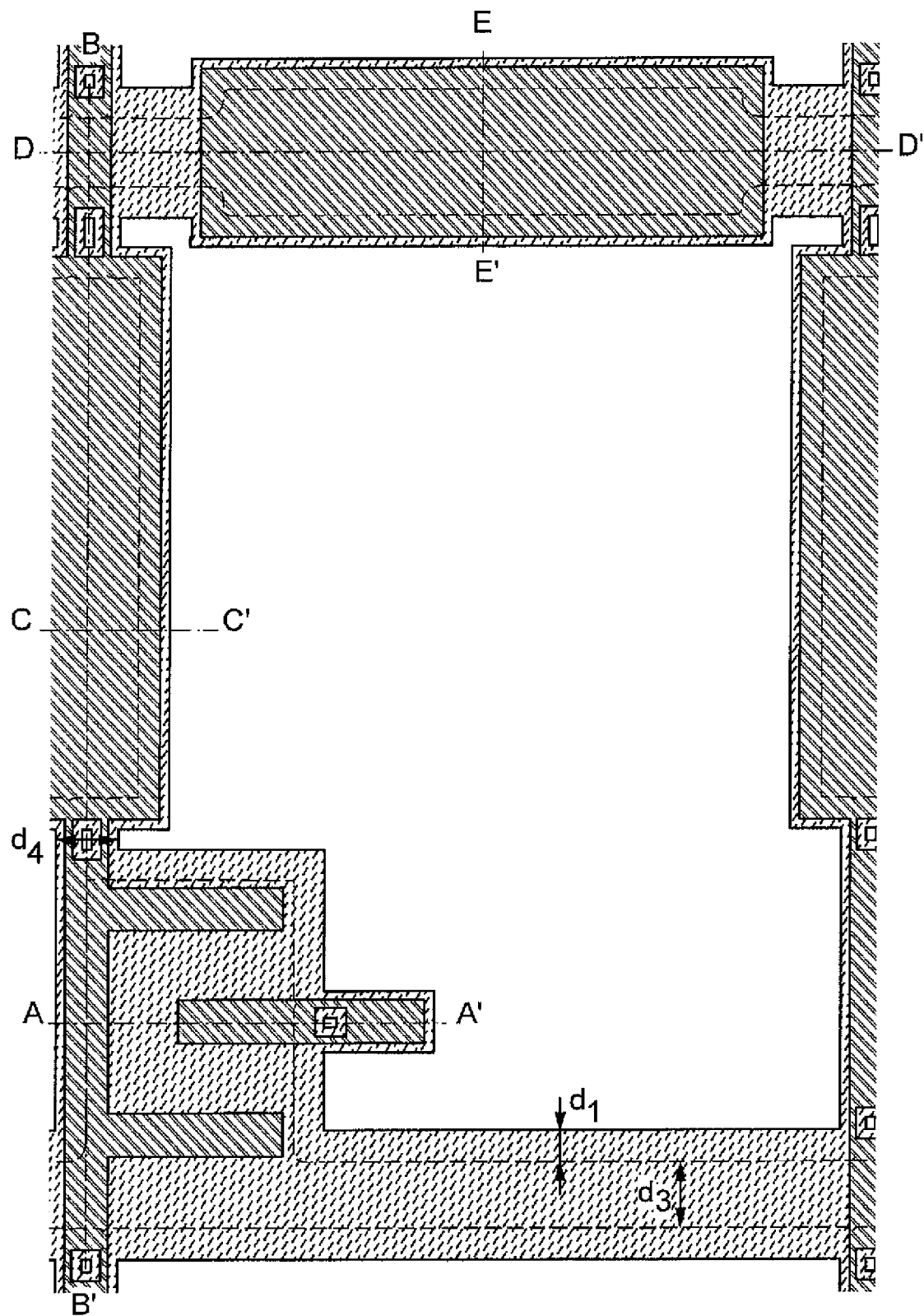
FIG. 20 illustrates an example of a method for manufacturing a thin film transistor and a display device.

As illustrated in FIG. 18, the thin-film stack body 114 formed by the first etching may be designed to be thin in a portion adjacent to a supporting portion which is formed using the gate electrode layer 116B or the gate electrode layer 116D (see the portions indicated by the arrows in FIG. 18).

The gate electrode layer 116B and the gate electrode layer 116D illustrated in FIG. 18 each serve as a supporting portion which supports the thin-film stack body 114. By the existence of the supporting portion, peeling of a film such as a gate insulating film formed over the gate electrode layer can be prevented. Further, by the existence of the supporting portion, a cavity region formed adjacent to the gate electrode layer 116 by the second etching can be prevented from being larger than necessary. Furthermore, it is preferable to provide the supporting portion because the thin-film stack body 114 can be prevented from being broken or damaged due to its own weight and, accordingly, yield is increased. However, the embodiment mode is not limited to the mode with the supporting portion, and the supporting portion is not necessarily provided. An example of a top view of the mode without the supporting portion (corresponding to FIG. 21) is illustrated in FIG. 24.

Figure 24:
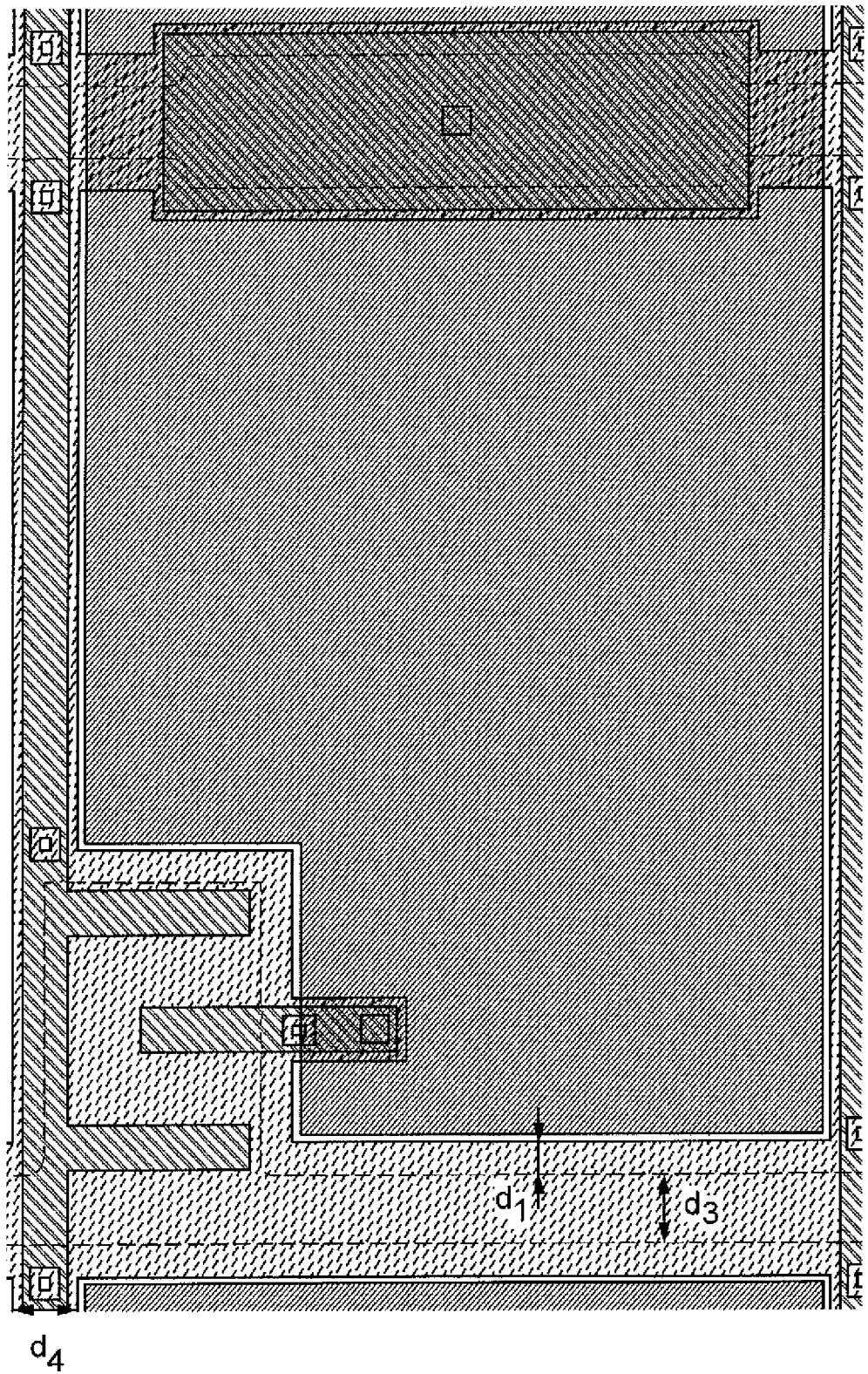
FIG. 24 illustrates an example of a method for manufacturing a thin film transistor and a display device.

Note that even in the case of FIG. 24, as in the case of FIG. 22 and FIG. 23, the width of the wiring is increased to the outer side and the resist opening portion can be formed without narrowing the width of the wiring.

As described above, the second etching is preferably performed by wet etching.

In the case where the second etching is performed by wet etching, the first conductive film 102 may be formed using aluminum or molybdenum, the second conductive film 110 may be formed using titanium or tungsten, and a chemical solution containing nitric acid, acetic acid, and phosphoric acid may be used as an etching solution (an etchant). Alternatively, the first conductive film 102 may be formed using molybdenum, the second conductive film 110 may be formed using titanium, aluminum, or tungsten, and a chemical solution containing hydrogen peroxide water may be used as an etching solution (an etchant).

In the case where the second etching is performed by wet etching, it is most preferable that a stacked film in which molybdenum is provided over aluminum to which neodymium is added be formed as the first conductive film 102, tungsten be provided as the second conductive film 110, and a chemical solution containing nitric acid at 2%, acetic acid at 10%, and phosphoric acid at 72% be used for etching. By the usage of a chemical solution having such a composition, the first conductive film 102 can be etched without the second conductive film 110 being etched. Note that neodymium is added to the first conductive film 102 for the purpose of reducing resistance of aluminum and preventing a formation of hillocks.

Next, the first resist mask 112 is made to be reduced, for example, a thickness of the first resist mask 112 is reduced, and while the second conductive film 110 is exposed, a second resist mask 118 is formed. As a method for forming the second resist mask 118 by reducing the first resist mask 112, for example, ashing using oxygen plasma can be given. However, the method for forming the second resist mask 118 by reducing the first resist mask 112 is not limited thereto. Note that the case of forming the second resist mask 118 after the second etching is described here; however, the embodiment mode is not limited thereto, and the second etching may be performed after formation of the second resist mask I 18.

Next, the second conductive film 110 in the thin-film stack body 114 is etched using the second resist mask 118, so that the source electrode layer 120A and drain electrode layer 120B are formed (see FIG. 3A, FIG. 6A, FIG. 9A, FIG. 12A, FIG. 15A, and FIG. 19). Here, as the etching conditions, the conditions by which films other than the second conductive film 110 are not unintentionally etched or eroded or are not easily unintentionally etched or eroded are selected. In particular, it is important that etching is performed under the conditions that the gate electrode layer 116 is not unintentionally etched or eroded or is not easily unintentionally etched or eroded.

Note that the source electrode layer 120A and drain electrode layer 120B include the source electrode or the drain electrode of the thin film transistor, the source wiring, the electrode that connects the thin film transistor to the pixel electrode, and the other of the electrodes of the capacitor element. When a source and drain electrode layer is referred to as the "source and drain electrode layer 120A" or a "source and drain electrode layer 120C", the source and drain electrode layer means an electrode layer which includes one of the source electrode and the drain electrode of the thin film transistor and a source wiring; when a source and drain electrode layer is referred to as a "source and drain electrode layer 120B", the source and drain electrode layer means an electrode layer which includes the other of the source electrode and the drain electrode of the thin film transistor and the electrode that connects the thin film transistor to the pixel electrode; and when a source and drain electrode layer is referred to as a "source and drain electrode layer 120D", the source and drain electrode layer means an electrode layer which includes the other of the electrodes of the capacitor element. Then, these source and drain electrode layers are collectively referred to as "the source and drain electrode layer 120".

Note that for etching the second conductive film 110 in the thin-film stack body 114, either wet etching or dry etching may be performed.

Then, the impurity semiconductor film 108 and an upper portion of the semiconductor film 106 (back channel portion) in the thin-film stack body 114 are etched to form a semiconductor layer 124, a source region 122A and drain region 122B (see FIG. 3B, FIG. 6B, FIG. 9B, FIG. 12B, FIG. 15B, and FIG. 20). Here, as the etching conditions, the conditions by which films other than the impurity semiconductor film 108 and the semiconductor film 106 are not unintentionally etched or eroded or are not easily unintentionally etched or eroded are selected. In particular, it is important that etching is performed under the conditions that the gate electrode layer 116 is not unintentionally etched or eroded or is not easily unintentionally etched or eroded.

Note that the etching of the impurity semiconductor film 108 and the upper portion of the semiconductor film 106 (back channel portion) in the thin-film stack body 114 can be performed by dry etching or wet etching.

Figure 3A:
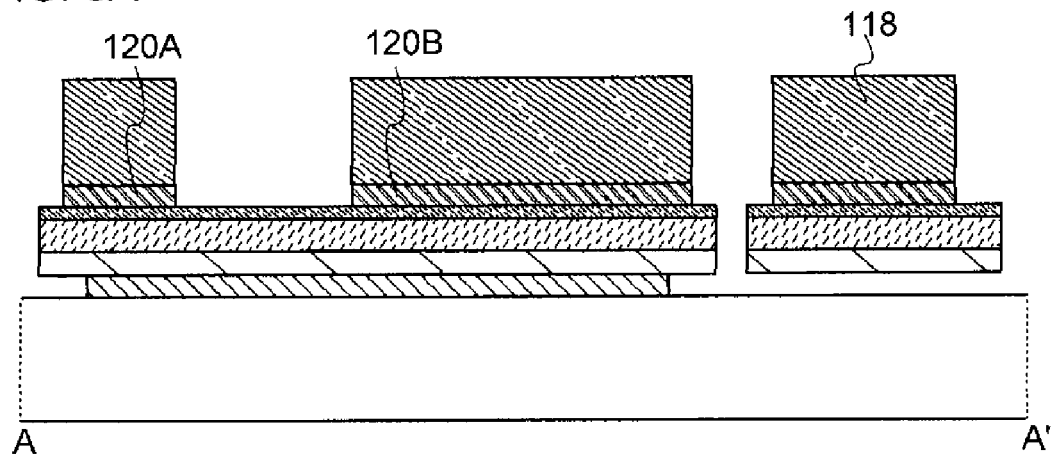
FIGS. 3A to 3C illustrate an example of a method for manufacturing a thin film transistor and a display device.
Figure 3B:
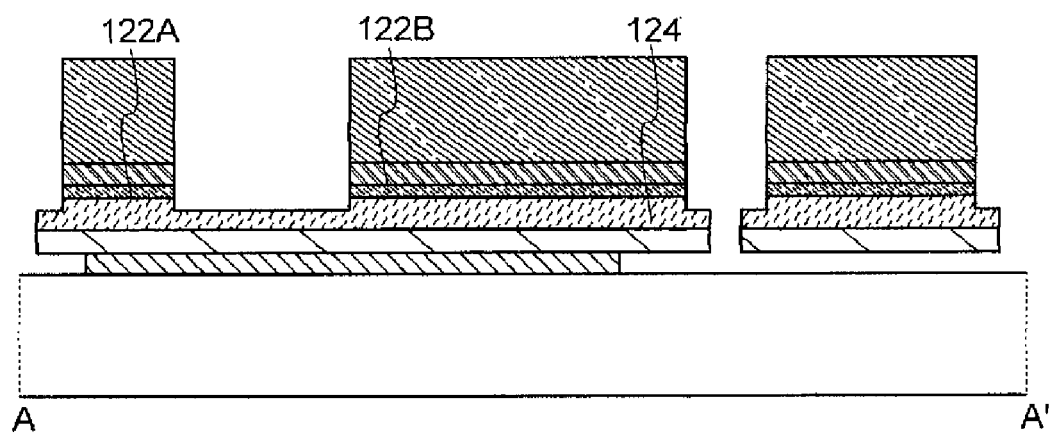
Figure 3C:
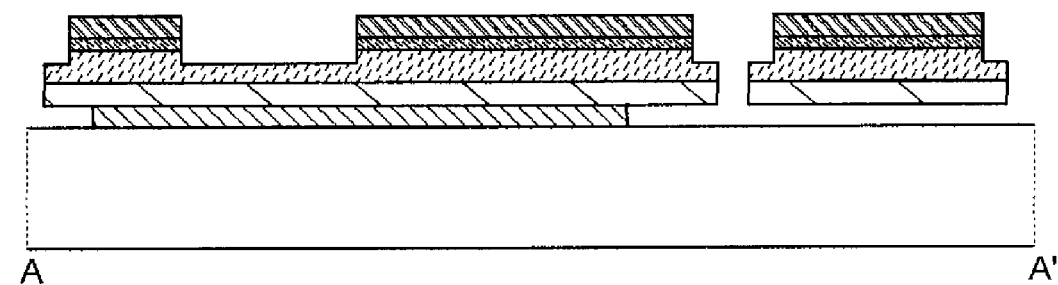

Then, the second resist mask 118 is removed (see FIG. 3C, FIG. 6C, FIG. 9C, FIG. 12C, and FIG. 15C); accordingly, a thin film transistor is completed (see FIG. 3C). As described above, the thin film transistor can be manufactured using one photomask (multi-tone mask).

The steps described with reference to FIG. 3A and FIG. 3B are collectively referred to as "third etching". The third etching may be performed in separate steps as described above or may be performed in a single step.

A second insulating film is formed to cover the thin film transistor that is formed in the above-described manner. Although the second insulating film may be formed using only the first protective film 126, the second insulating film is preferably formed using the first protective film 126 and a second protective film 128 (see FIG. 4A, FIG. 7A, FIG. 10A, FIG. 13A, and FIG. 16A) here. The first protective film 126 may be formed in a similar manner to the first insulating film 104.

The second protective film 128 is formed by a method by which the surface thereof becomes roughly planar. This is because when the surface of the second protective film 128 is roughly planar, disconnection or the like of a pixel electrode layer 132 formed over the second protective film 128 can be prevented. Accordingly, the phrase "roughly planar" means being planar enough to be able to achieve the above-described aim, and does not mean that high planarity is required.

The second protective film 128 can be formed by, for example, a spin coating method or the like using photosensitive polyimide, acrylic, epoxy resin, or the like. Note that the present invention is not limited to these materials and the formation method.

Next, a first opening portion 130 and a second opening portion 131 are formed in the second insulating film (see FIG. 4B, FIG. 7B, FIG. 10B, FIG. 13B, and FIG. 16B). The first opening portion 130 and the second opening portion 131 are formed so as to reach at least the surface of the source and drain electrode layer 120. The formation method of the first opening portion 130 and the second opening portion 131 is not limited to a particular method and may be determined as appropriate by a practitioner in accordance with the diameter of the first opening portion 130 or the like. For example, the first opening portion 130 and the second opening portion 131 can be formed by dry etching using photolithography.

Note that in the case of forming the opening portions by photolithography, one photomask is used.

Next, the pixel electrode layer 132 is formed over the second insulating film (see FIG. 4C, FIG. 7C, FIG. 10C, FIG. 13C, FIG. 16C, and FIG. 21). The pixel electrode layer 132 is formed so as to be connected to the source and drain electrode layer 120 through the opening portions. Specifically, the pixel electrode layer 132 is formed so as to be connected to the source and drain electrode layer 120B through the first opening portion 130 and connected to the source and drain electrode layer 120D through the second opening portion 131. The pixel electrode layer 132 is preferably formed using a conductive material having a light-transmitting property. Here, as the conductive material having a light-transmitting property, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like may be given. The film of the conductive material having a light-transmitting property may be formed by a sputtering method, a CVD method, or the like; however, the present invention is not limited to a particular method. In addition, the pixel electrode layer 132 may have a single layer or stacked layers including a plurality of films.

In this embodiment, only the pixel electrode layer 132 is formed using the conductive material having a light-transmitting property; however, the embodiment mode is not limited thereto. As materials of the first conductive film 102 and the second conductive film 110, conductive materials having a light-transmitting property can also be used.

Note that in the case of forming the pixel electrode layer 132 by photolithography, one photomask is used.

In the above-described manner, manufacture of an active matrix substrate according to this embodiment (so-called array process) is completed. As described in this embodiment, the thin film transistor can be manufactured using one photomask in such a manner that the gate electrode layer is formed utilizing side-etching and, further, the source and drain electrode layer is formed using a multi-tone mask.

Figure 4A:
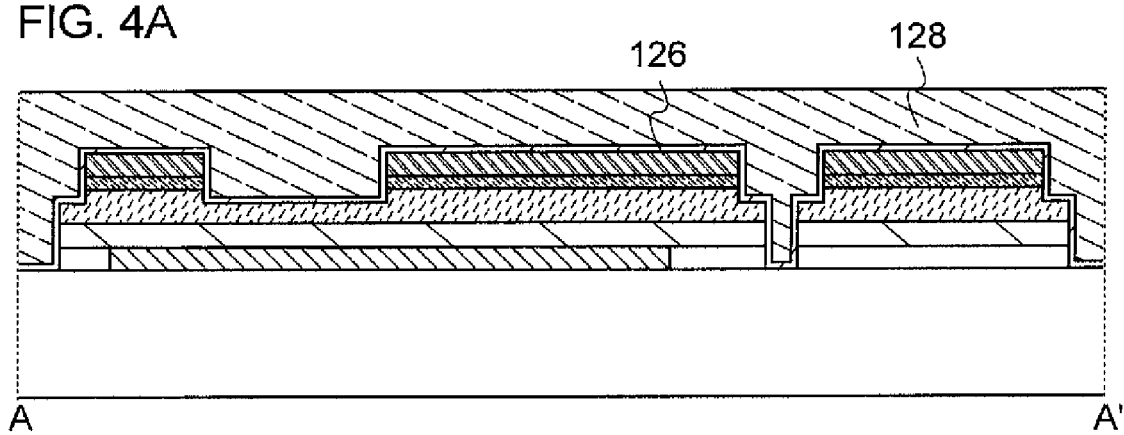
FIGS. 4A to 4C illustrate an example of a method for manufacturing a thin film transistor and a display device.
Figure 4B:
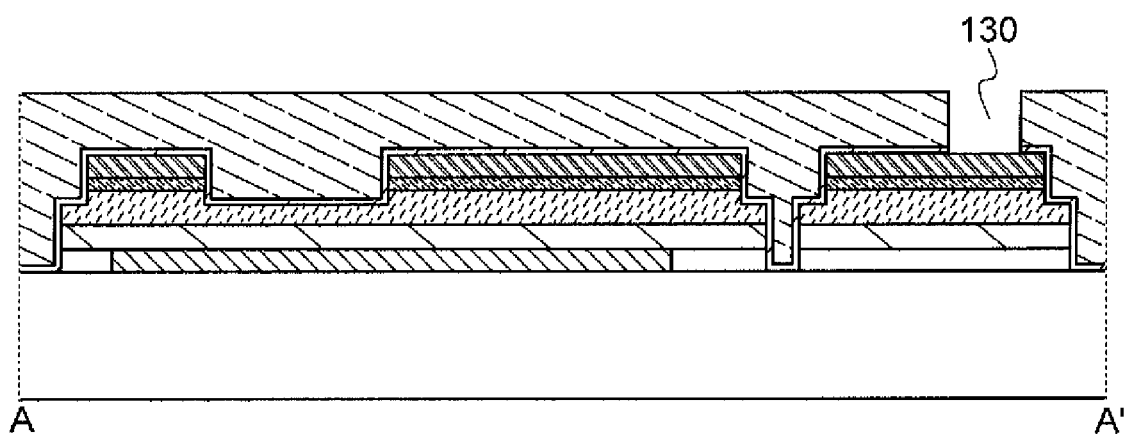
Figure 4C:
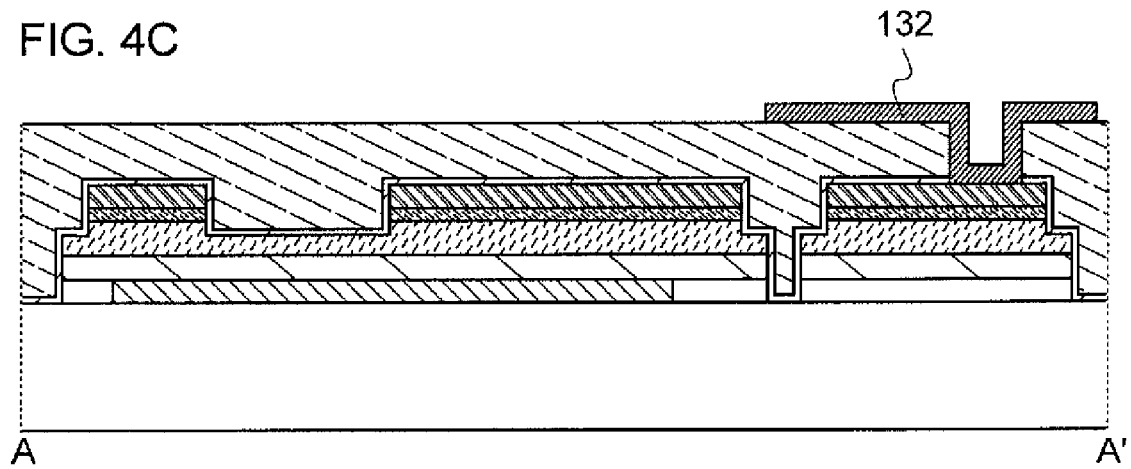
Figure 5A:
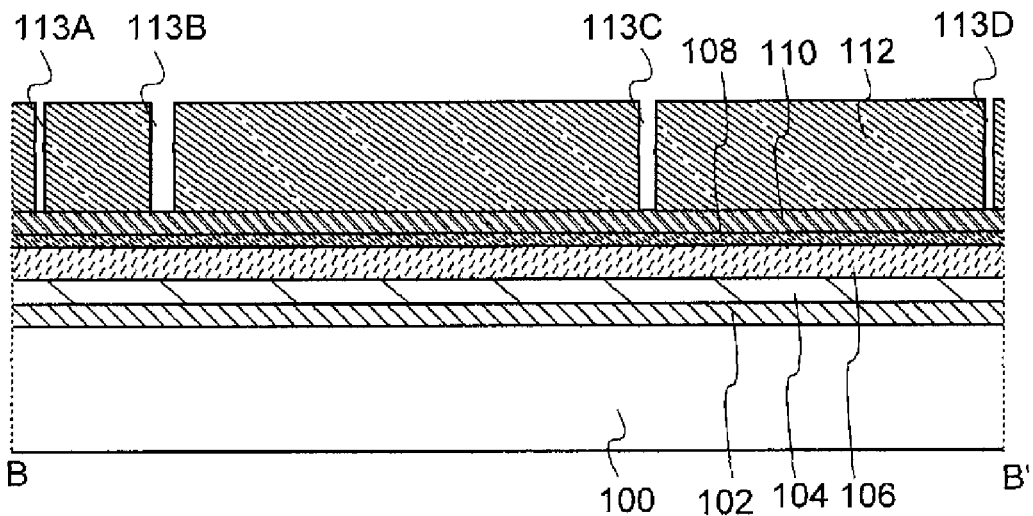
FIGS. 5A to 5C illustrate an example of a method for manufacturing a thin film transistor and a display device.
Figure 5B:
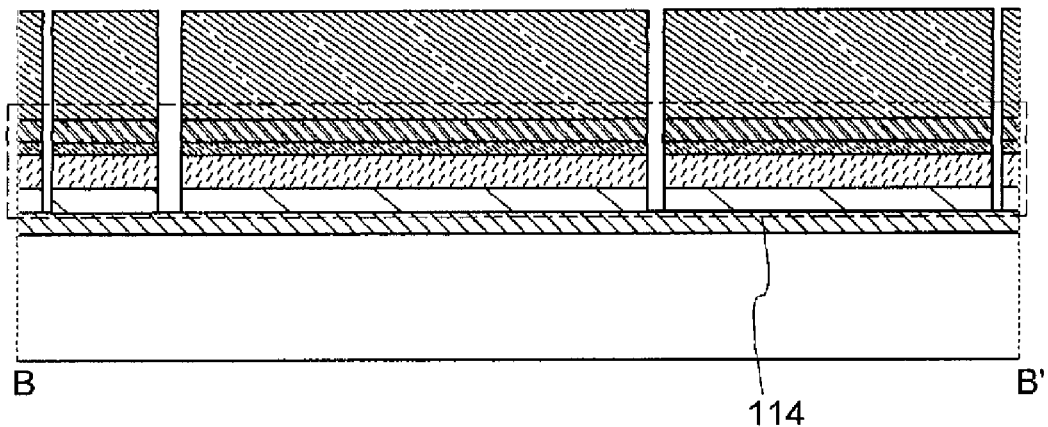
Figure 5C:
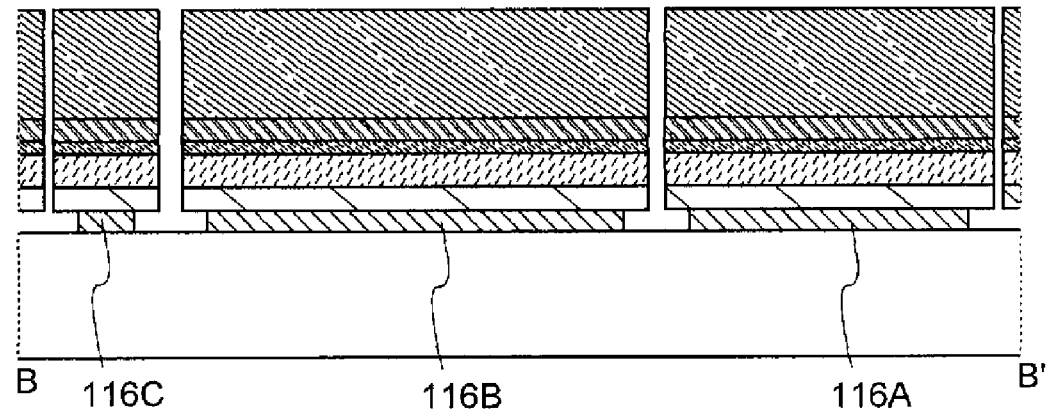
Figure 6A:
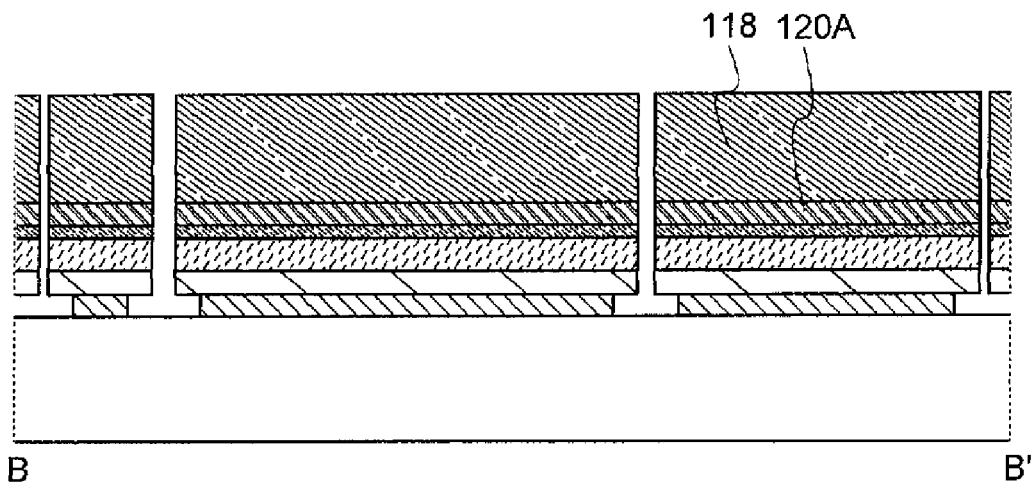
FIGS. 6A to 6C illustrate an example of a method for manufacturing a thin film transistor and a display device.
Figure 6B:
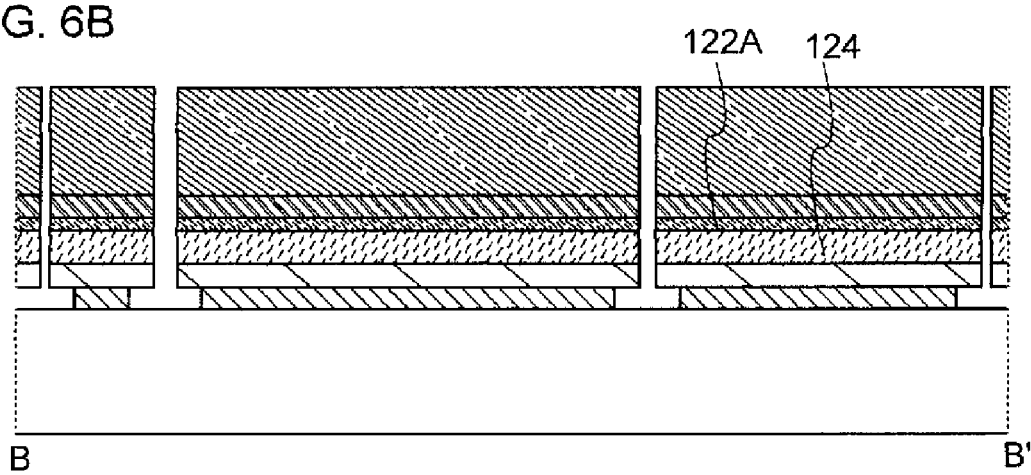
Figure 6C:
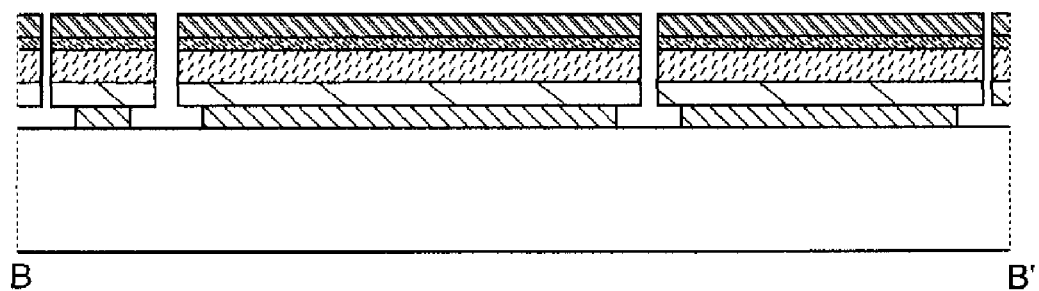
Figure 7A:
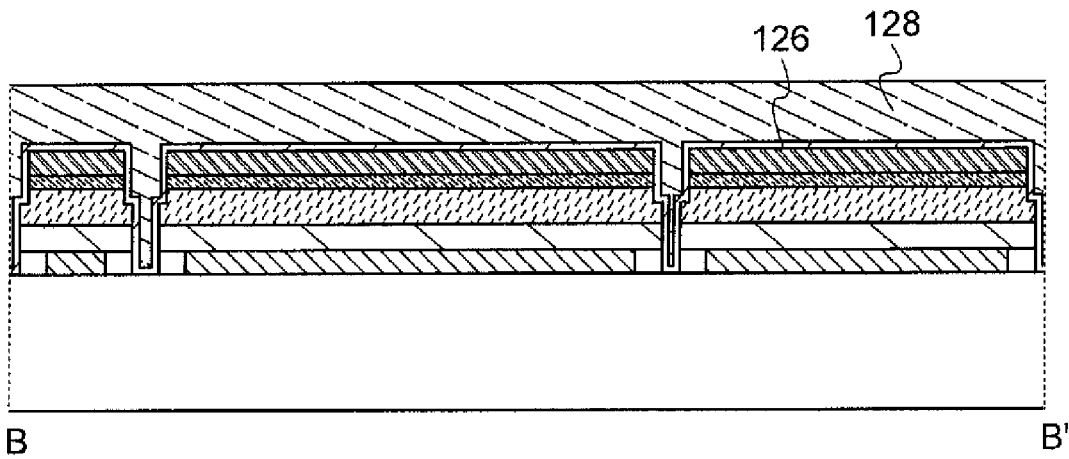
FIGS. 7A to 7C illustrate an example of a method for manufacturing a thin film transistor and a display device.
Figure 7B:
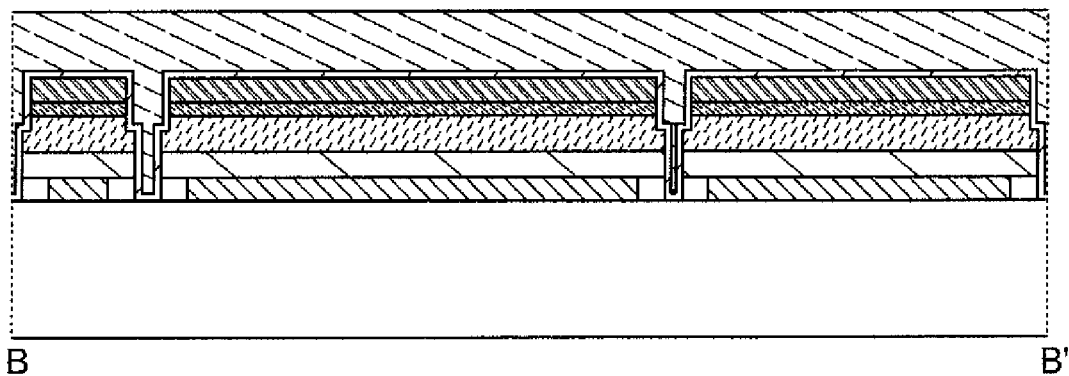
Figure 7C:
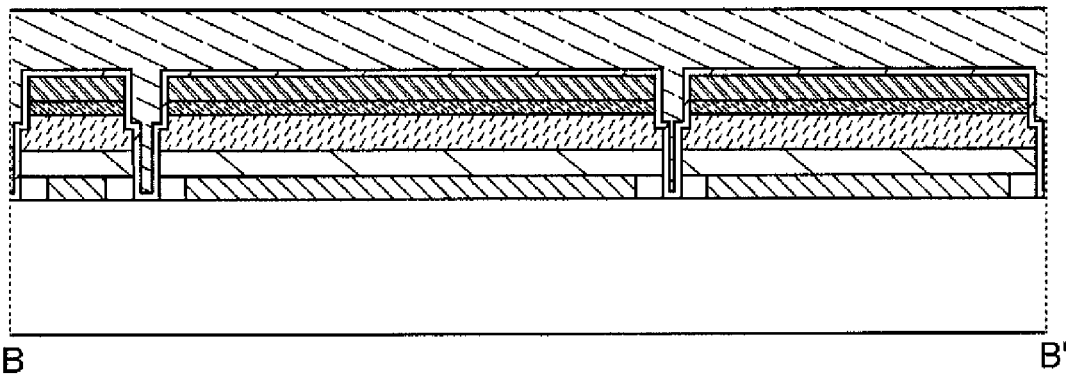
Figure 8A:
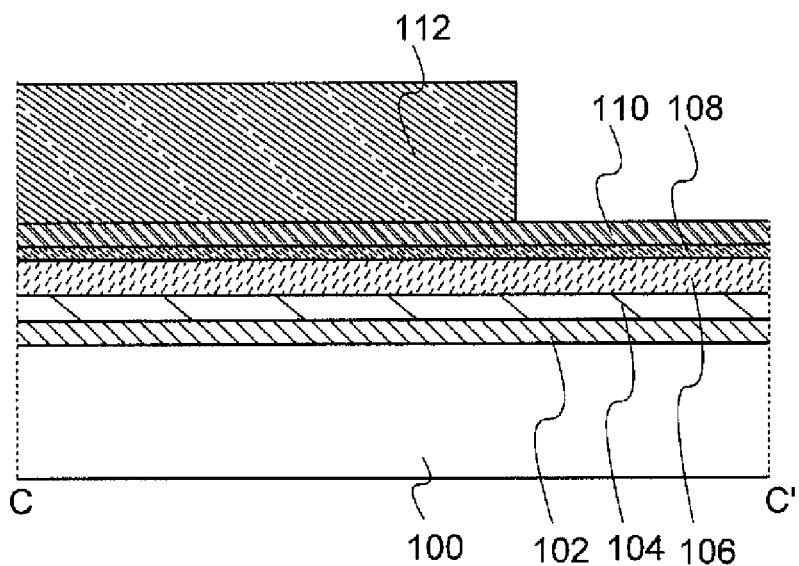
FIGS. 8A to 8C illustrate an example of a method for manufacturing a thin film transistor and a display device.
Figure 8B:
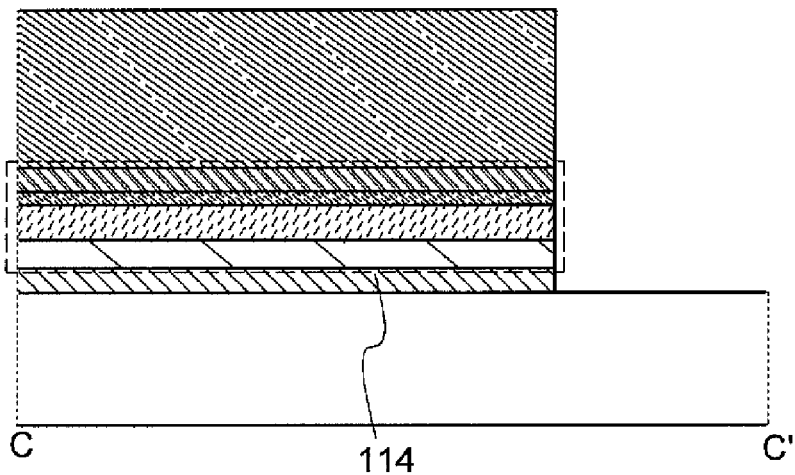
Figure 8C:
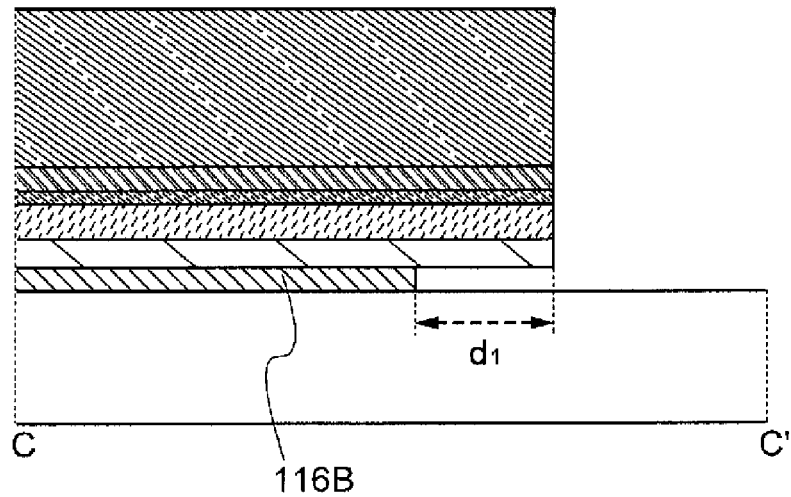
Figure 9A:
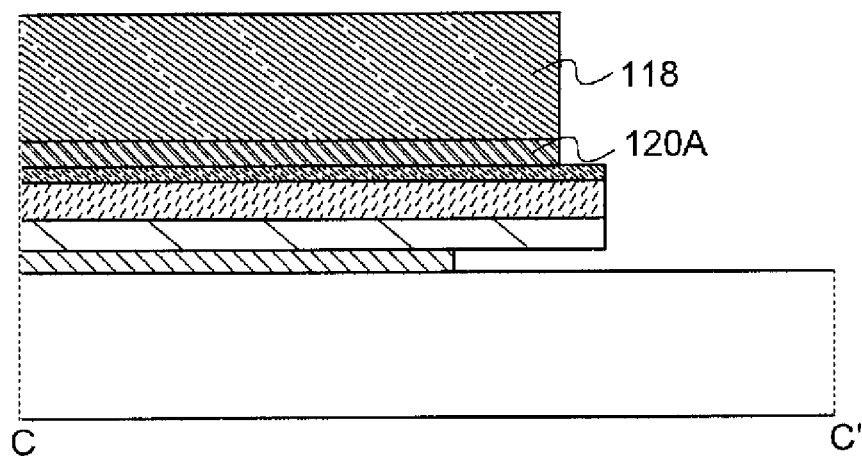
FIGS. 9A to 9C illustrate an example of a method for manufacturing a thin film transistor and a display device.
Figure 9B:
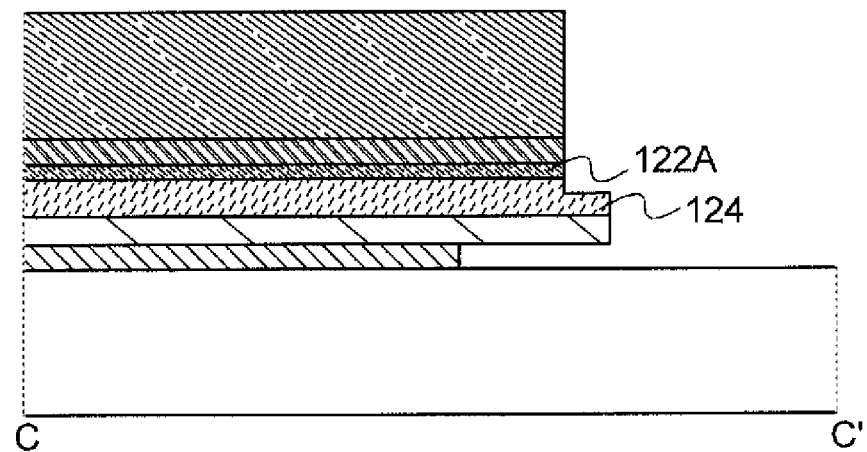
Figure 9C:
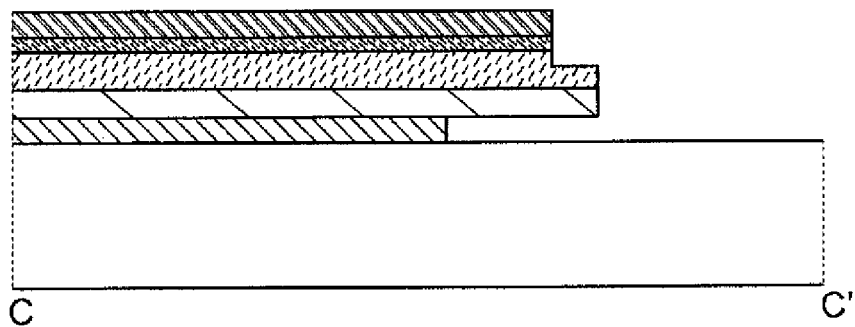
Figure 10A:
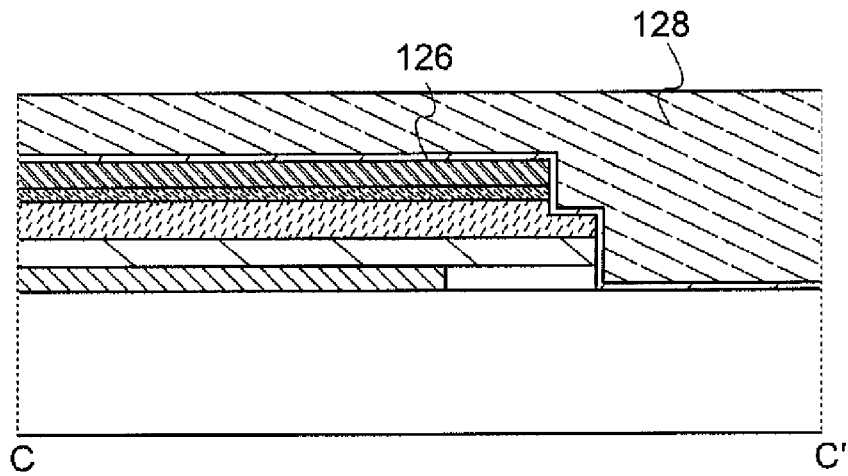
FIGS. 10A to 10C illustrate an example of a method for manufacturing a thin film transistor and a display device.
Figure 10B:
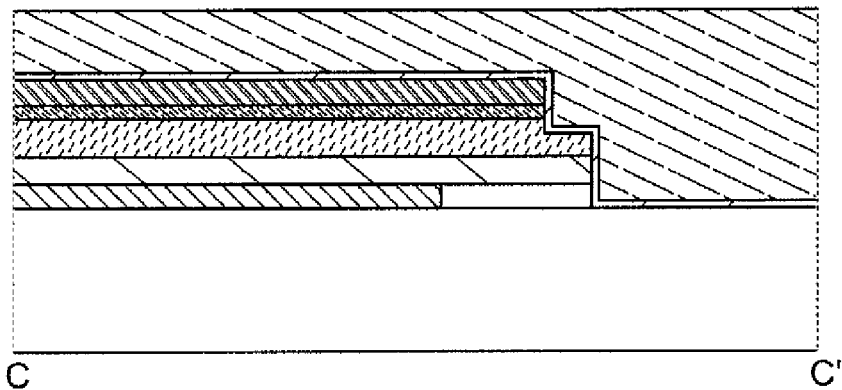
Figure 10C:
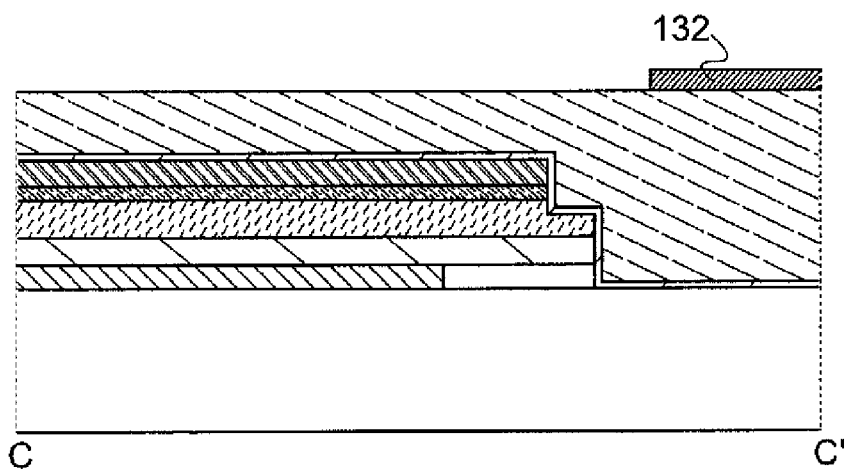
Figure 11A:
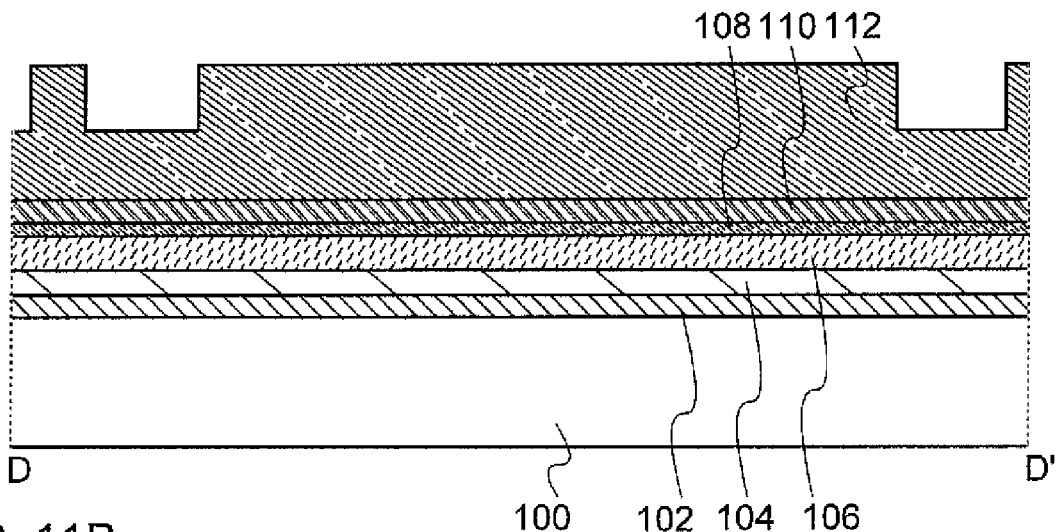
FIGS. 11A to 11C illustrate an example of a method for manufacturing a thin film transistor and a display device.
Figure 11B:
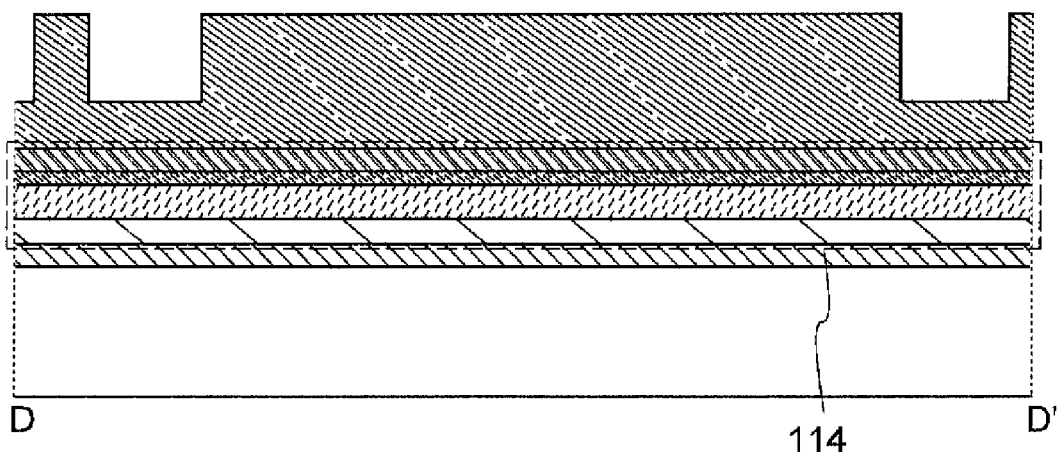
Figure 11C:
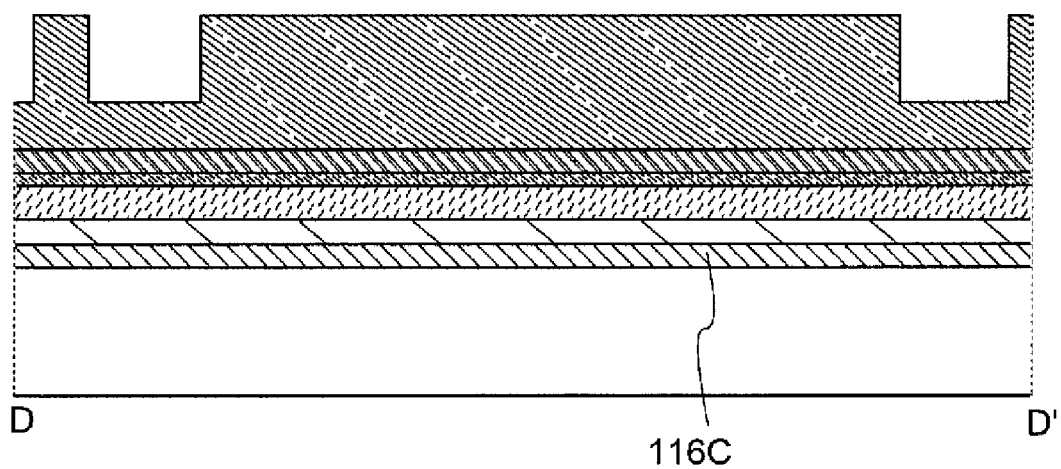
Figure 12A:
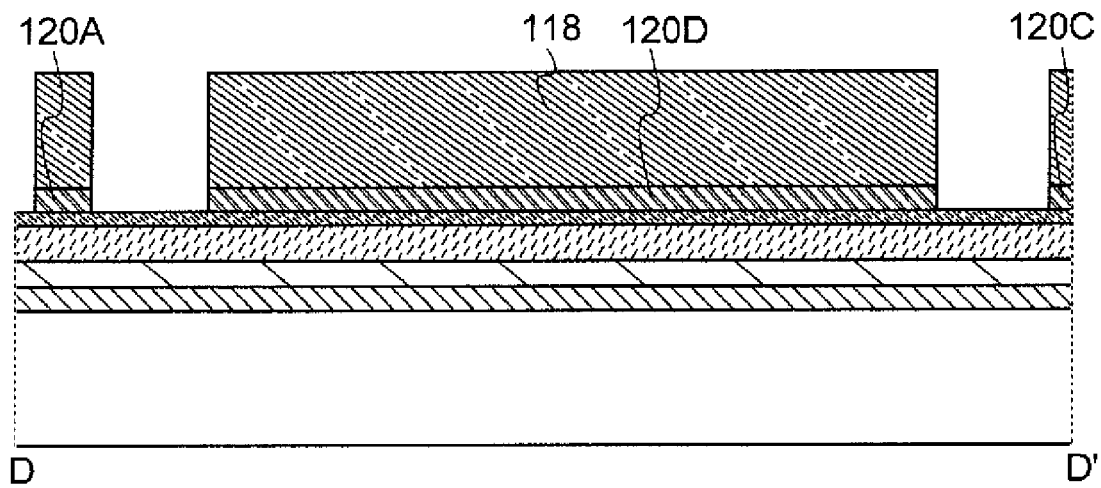
FIGS. 12A to 12C illustrate an example of a method for manufacturing a thin film transistor and a display device.
Figure 12B:
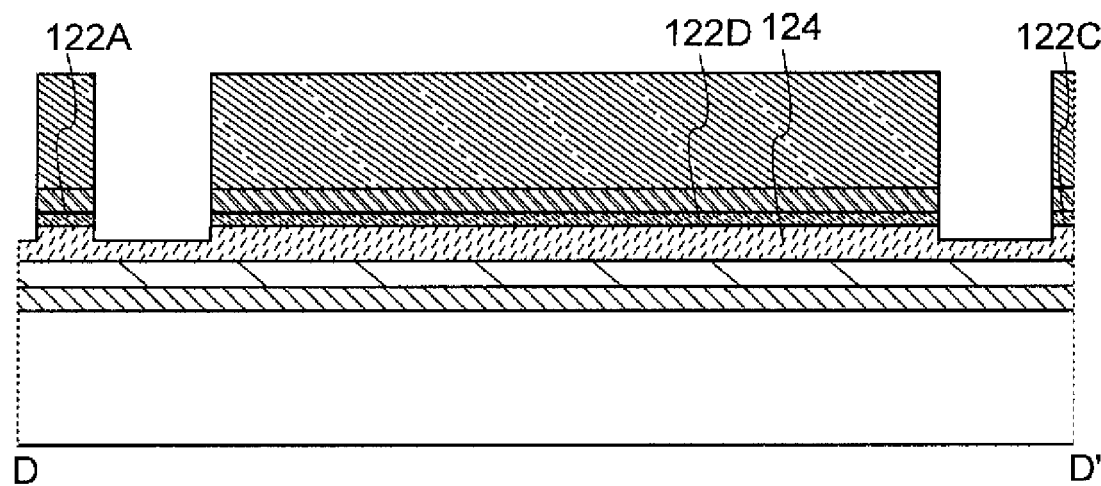
Figure 12C:
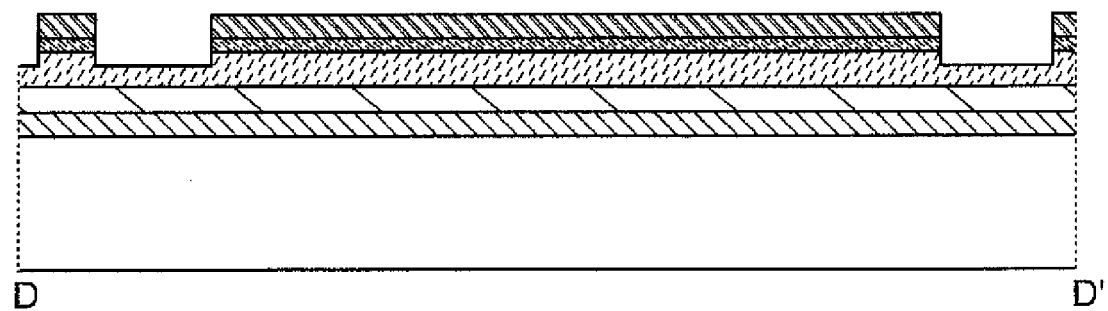
Figure 13A:
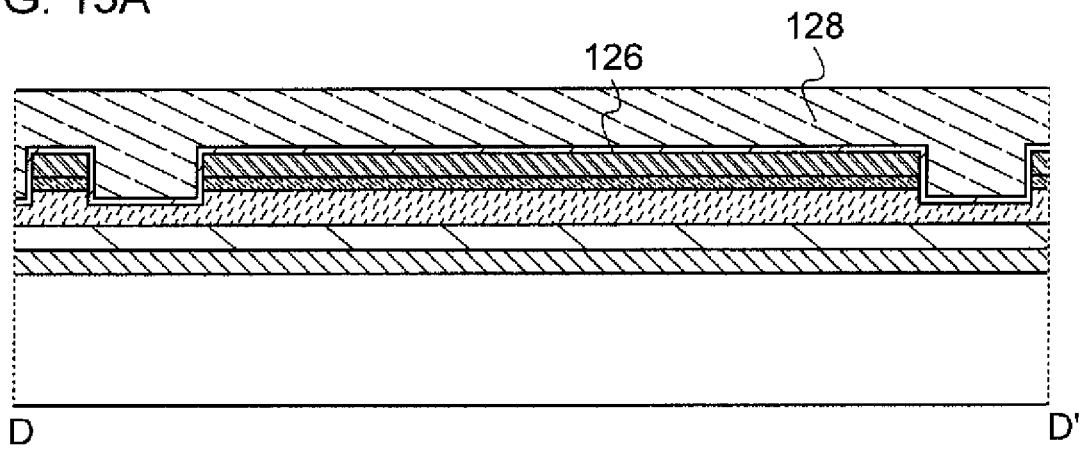
FIGS. 13A to 13C illustrate an example of a method for manufacturing a thin film transistor and a display device.
Figure 13B:
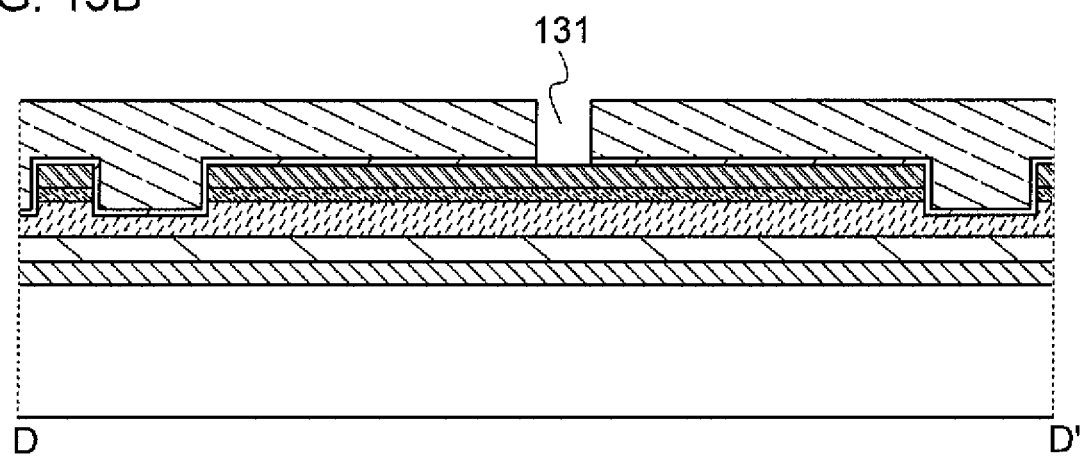
Figure 13C:
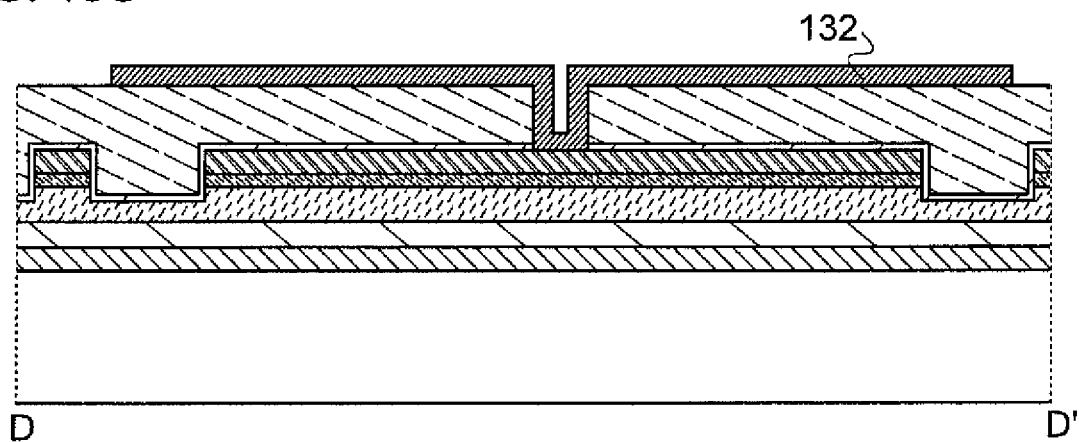
Figure 14A:
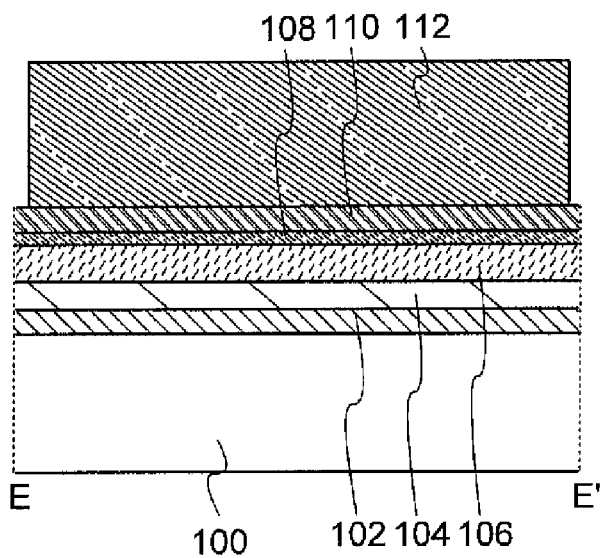
FIGS. 14A to 14C illustrate an example of a method for manufacturing a thin film transistor and a display device.
Figure 14B:
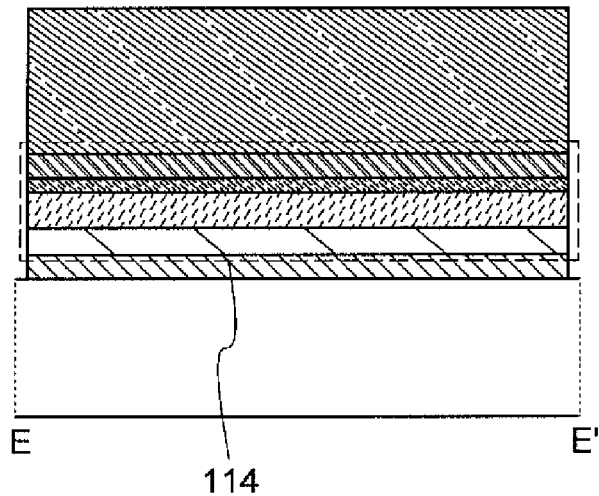
Figure 14C:
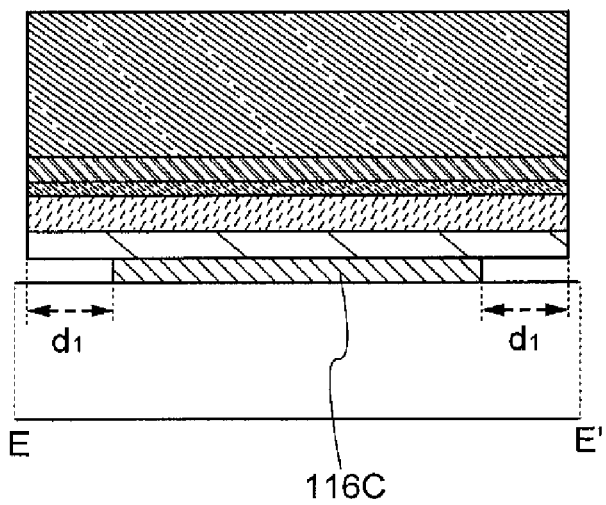
Figure 15A:
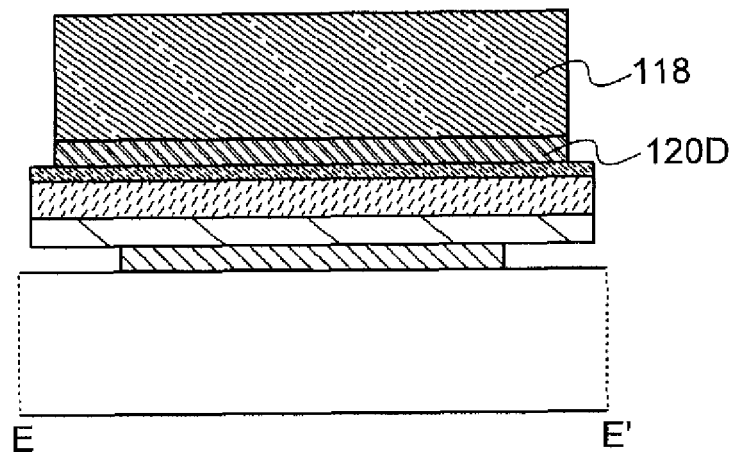
FIGS. 15A to 15C illustrate an example of a method for manufacturing a thin film transistor and a display device.
Figure 15B:
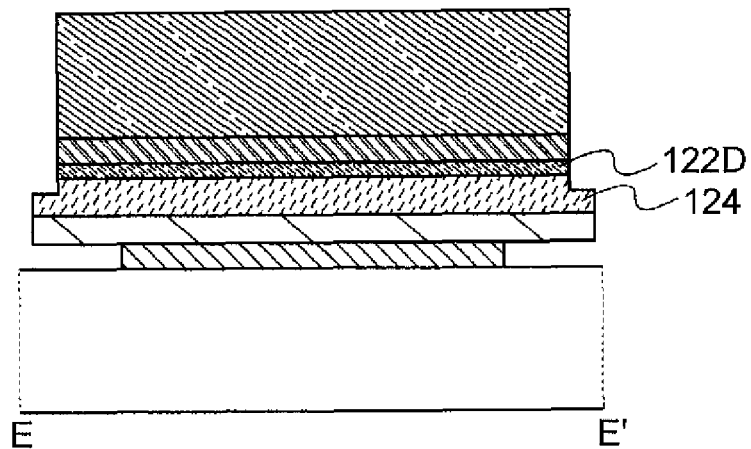
Figure 15C:
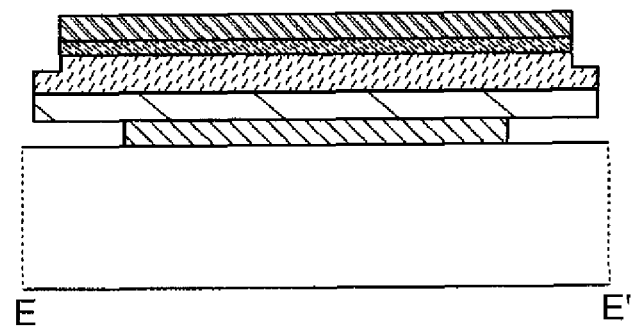
Figure 16A:
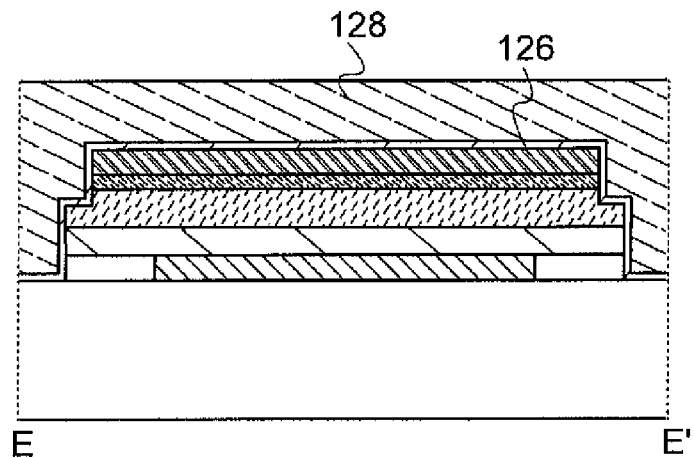
FIGS. 16A to 16C illustrate an example of a method for manufacturing a thin film transistor and a display device.
Figure 16B:
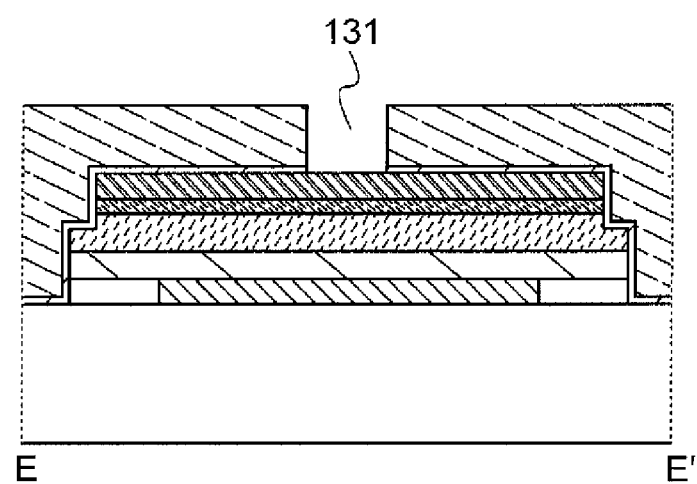
Figure 16C:
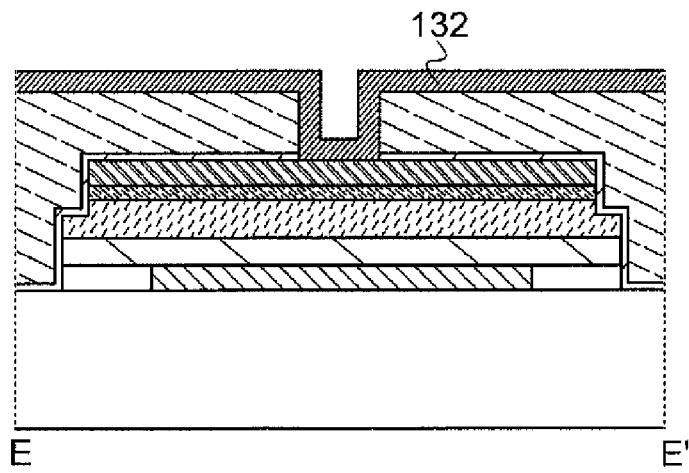

The thin film transistor that is manufactured in the above-described manner has a structure including a gate insulating film over a gate electrode layer, a semiconductor layer over the gate insulating film, an impurity semiconductor layer including a source region and a drain region over the semiconductor layer, a source electrode and a drain electrode over the source region and the drain region, and a cavity adjacent to a side surface of the gate electrode layer (see FIG. 4C). Because such a thin film transistor has the cavity formed adjacent to the side surface of the gate electrode layer, the thin film transistor has low leakage current at an end portion of the gate electrode layer.

Here, a terminal connection portion of the active matrix substrate manufactured in the above-described steps will be described with reference to FIG. 25, FIG. 26, and FIGS. 27A to 27C.

Figure 25:
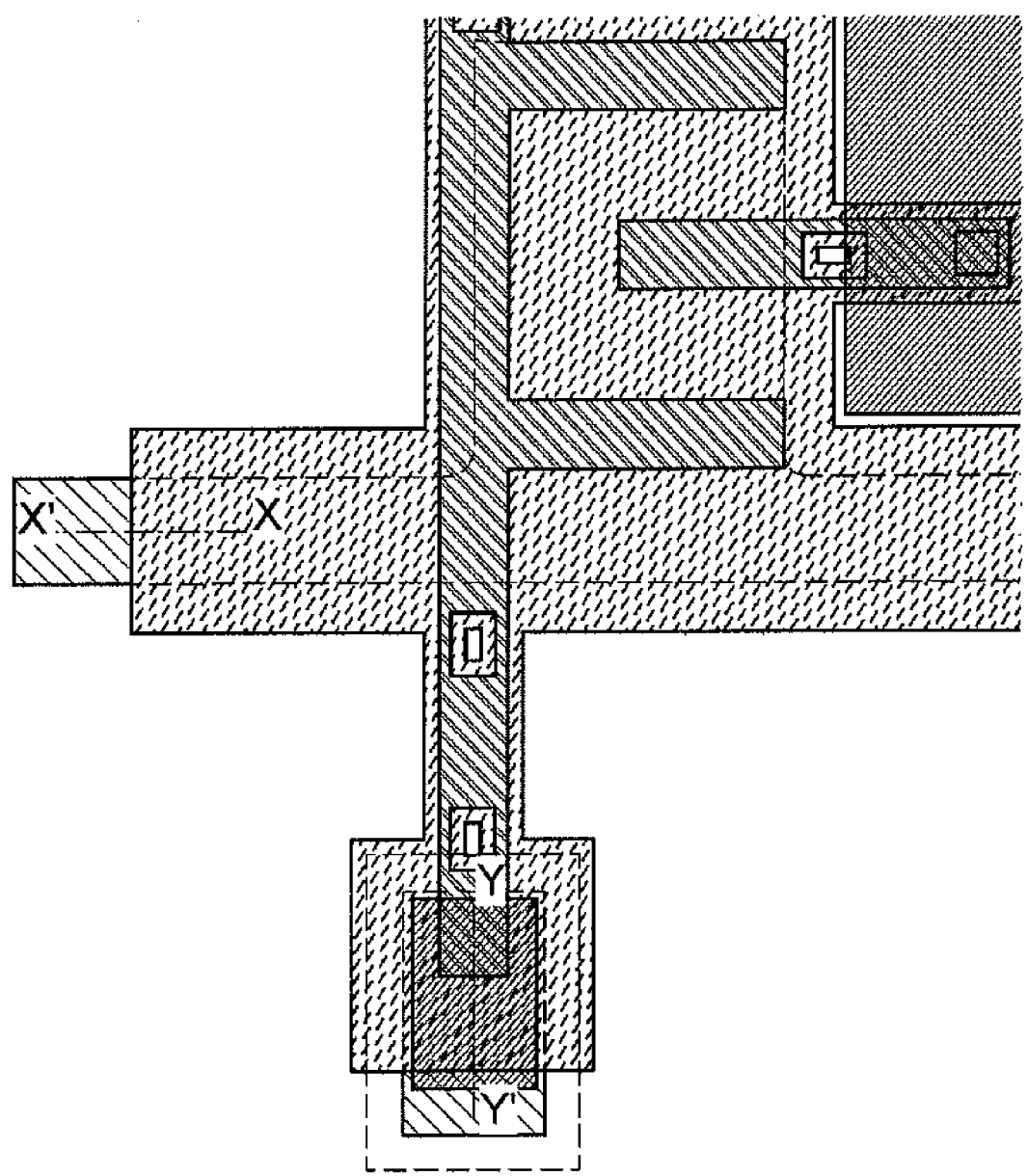
FIG. 25 illustrates a connection portion of an active matrix substrate.

FIG. 25 is a top view and FIG. 26 and FIGS. 27A to 27C are cross-sectional views of a terminal connection portion on the gate wiring side and a terminal connection portion on the source wiring side of the active matrix substrate manufactured in the above-described steps.

FIG. 25 is a top view of the gate wiring and the source wiring extended from the pixel portion, in the terminal connection portion on the gate wiring side and the terminal connection portion on the source wiring side.

Figure 26:
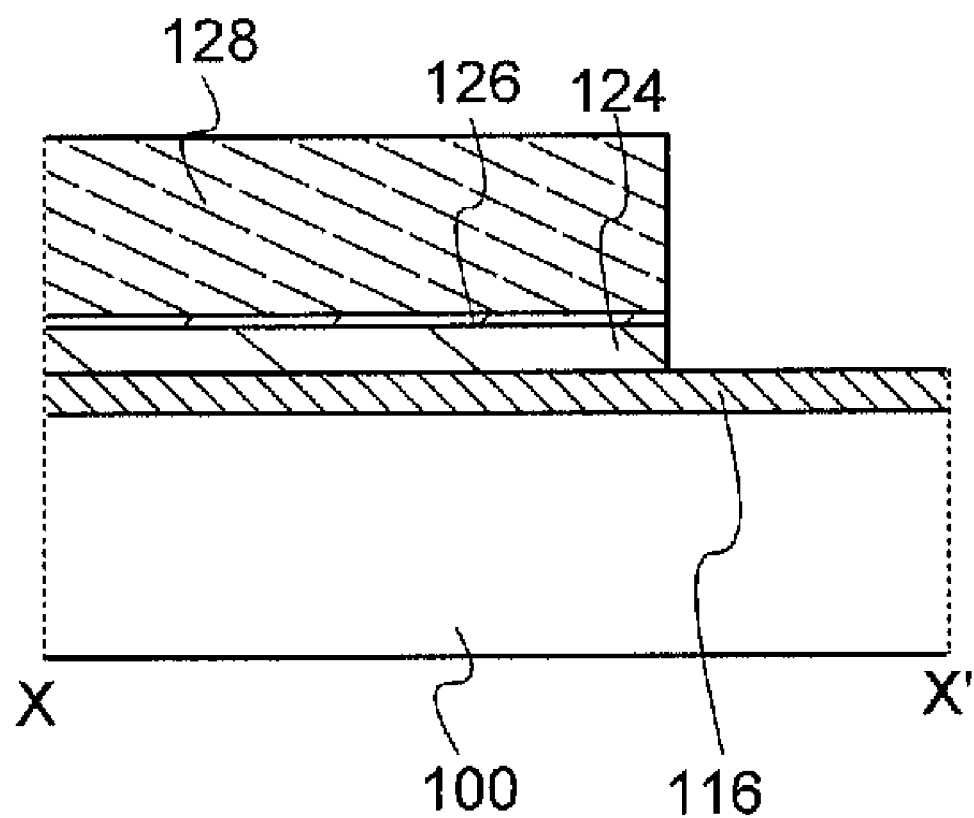
FIG. 26 illustrates a connection portion of an active matrix substrate.

FIG. 26 is a cross-sectional view taken along the line X-X' in FIG. 25. That is, FIG. 26 is a cross-sectional view of the terminal connection portion on the gate wiring side. In FIG. 26, only the gate electrode layer 116 is exposed. A terminal portion is connected to the region in which the gate electrode layer 116 is exposed.

Figure 27A:
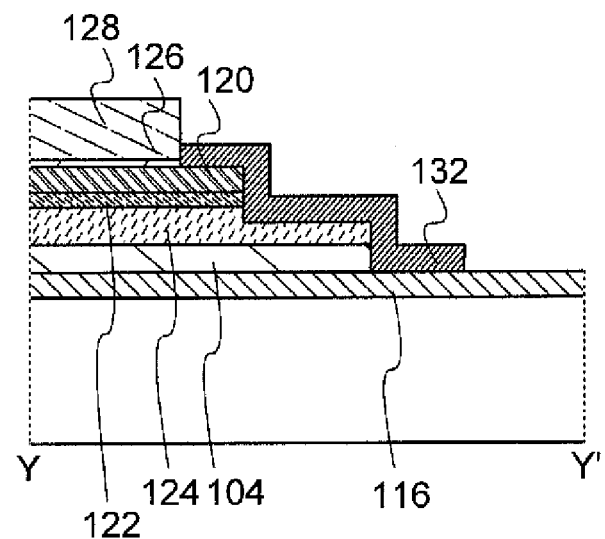
FIGS. 27A to 27C illustrate a connection portion of an active matrix substrate.
Figure 27B:
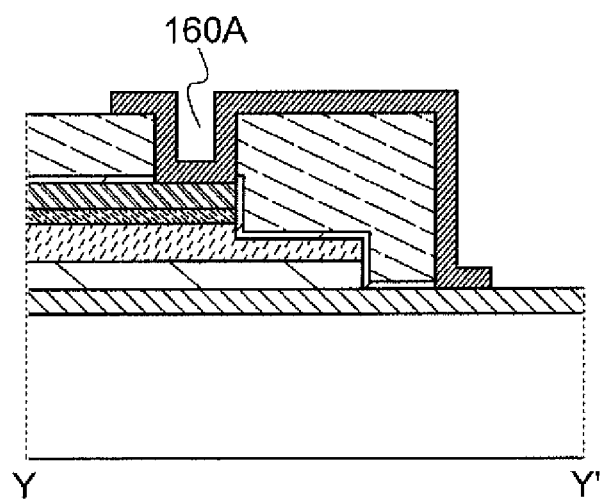
Figure 27C:
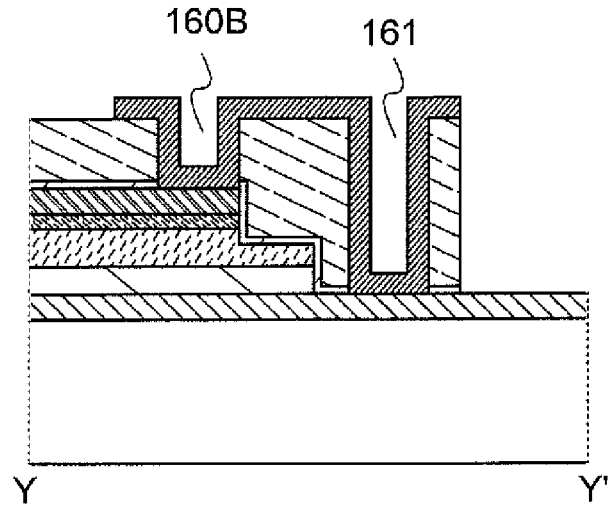

FIGS. 27A to 27C are cross-sectional views of the terminal connection portion on the source wiring side. In the cross section along the line Y-Y' illustrated in FIGS. 27A to 27C, the gate electrode layer 116 and the source and drain electrode layer 120 are connected to each other through the pixel electrode layer 132. FIGS. 27A to 27C illustrate various connection modes between the gate electrode layer 116 and the source and drain electrode layer 120. Any of these modes or modes other than those illustrated in FIGS. 27A to 27C may be used for the terminal connection portion in a display device according to the invention to be disclosed. By the structure in which the source and drain electrode layer 120 is connected to the gate electrode layer 116, the height of the terminal connection portion can be made roughly uniform.

Note that the number of opening portions is not limited to those in FIGS. 27A to 27C. Not only one opening portion but also a plurality of opening portions may be provided for one terminal. In the case where a plurality of opening portions are provided for one terminal, even when any of the opening portions is not formed favorably due to insufficient etching for forming the opening portion or the like, electric connection can be realized at the other opening portion. Further, even in the case where all the opening portions are formed without any problems, the contact area can be made larger and contact resistance can be reduced, which is preferable.

In FIG. 27A, electric connection is realized in such a manner that end portions of the first protective film 126 and the second protective film 128 are removed by etching or the like to expose the gate electrode layer 116 and the source and drain electrode layer 120, and the pixel electrode layer 132 is formed over the exposed region. FIG. 27A corresponds to a cross-sectional view taken along the line Y-Y' in FIG. 25.

Note that the formation of the region in which the gate electrode layer 116 and the source and drain electrode layer 120 are exposed can be performed at the same time as the formation of the first opening portion 130 and the second opening portion 131.

In FIG. 27B, electric connection is realized in such a manner that a third opening portion 160A is provided in the first protective film 126 and the second protective film 128, end portions of the first protective film 126 and the second protective film 128 are removed by etching or the like to expose the gate electrode layer 116 and the source and drain electrode layer 120, and the pixel electrode layer 132 is formed over the exposed region.

Note that the formation of the third opening portion 160A and the formation of the region in which the gate electrode layer 116 is exposed can be performed at the same time as the formation of the first opening portion 130 and the second opening portion 131.

In FIG. 27C, electric connection is realized in such a manner that a third opening portion 160B and a fourth opening portion 161 are provided in the first protective film 126 and the second protective film 128 to expose the gate electrode layer 116 and the source and drain electrode layer 120, and the pixel electrode layer 132 is formed over the exposed region. Here, end portions of the first protective film 126 and the second protective film 128 are removed by etching or the like as in the case of FIGS. 27A and 27B, and this etched region is used as a terminal connection portion.

Note that the formation of the third opening portion 160B and the fourth opening portion 161 and the formation of the region in which the gate electrode layer 116 is exposed can be performed at the same time as the formation of the first opening portion 130 and the second opening portion 131.

Note that the number of opening portions is not limited to those in FIGS. 27A to 27C. Not only one opening portion but also a plurality of opening portions may be provided for one terminal. In the case where a plurality of opening portions are provided for one terminal, even when any of the opening portions is not formed favorably due to insufficient etching for forming the opening portion or the like, electric connection can be realized at the other opening portion. Further, even in the case where all the opening portions are formed without any problems, the contact area can be made larger and contact resistance can be reduced, which is preferable.

Next, a method for manufacturing a liquid crystal display device using the active matrix substrate for a display device, which is manufactured in the above-described steps, will be described. That is, a cell process and a module process will be described. Note that the cell process and the module process are not limited to the following description in the method for manufacturing a display device according to this embodiment.

In the cell process, the active matrix substrate manufactured in the above-described steps and a substrate opposite to the active matrix substrate (hereinafter referred to as an opposite substrate) are attached to each other and liquid crystal is injected. First, a method for manufacturing the opposite substrate will be briefly described below. Note that a film formed on the opposite substrate may have a single layer or stacked layers even if not described.

First, a light-blocking layer is formed over a substrate; a color filter layer of any of red, green, and blue is formed over the light-blocking layer; a pixel electrode layer is selectively formed over the color filter; and then, a rib is formed over the pixel electrode layer.

As the light-blocking layer, a film of a material having a light-blocking property is selectively formed. As the material having a light-blocking property, for example, an organic resin containing a black resin (carbon black) can be used. Alternatively, a stacked film which includes a film of a material containing chromium as its main component may be used. The film of a material containing chromium as its main component means a film containing chromium, chromium oxide, or chromium nitride. The material used for the light-blocking layer is not particularly limited as long as it has a light-blocking property. In order to selectively form the film of a material having a light-blocking property, photolithography or the like is employed.

The color filter layer may be selectively formed using an organic resin film which transmits only light with any of red, green, and blue when irradiated with white light from a backlight. The color filter layer can be selectively formed by selective formation of color materials. The arrangement of the color filter may be a stripe arrangement, a delta arrangement, or a square arrangement.

The pixel electrode layer in the opposite substrate can be formed in a similar manner to the pixel electrode layer 132 included in the active matrix substrate. Note that since selective formation is not necessary, the pixel electrode layer may be formed over the entire surface of the opposite substrate.

The rib formed over the pixel electrode is an organic resin film formed with a pattern for the purpose of widening the viewing angle. Note that the rib does not need to be formed if not particularly necessary.

As the method for manufacturing the opposite substrate, there are other various modes. For example, after formation of the color filter layer and before formation of the pixel electrode layer, an overcoat layer may be formed. By formation of the overcoat layer, planarity of a surface on which the pixel electrode is formed can be improved, thereby increasing yield. In addition, part of a material included in the color filter layer can be prevented from entering a liquid crystal material. For the overcoat layer, a thermosetting material containing acrylic resin or epoxy resin as a base is used.

Further, before or after formation of the rib, a post spacer (columnar spacer) may be formed as a spacer. The post spacer means a structural object formed at a constant interval on the opposite substrate in order to keep the gap between the active matrix substrate and the opposite substrate constant. In the case of using a bead spacer (spherical spacer), the post spacer need not be formed.

Next, an alignment film is formed over the active matrix substrate and the opposite substrate. Formation of the alignment film is performed, for example, in such a manner that polyimide resin or the like is melted in an organic solvent; this solution is applied by a printing method, a spin coating method, or the like; and then, the organic solvent is removed, and the substrates are baked. The thickness of the formed alignment film is generally approximately greater than or equal to about 50 nm and less than or equal to about 100 nm. Rubbing treatment is performed on the alignment film to align liquid crystal molecules with a certain pretilt angle. The rubbing treatment is performed, for example, by rubbing an alignment film with a shaggy cloth such as a velvet.

Then, the active matrix substrate and the opposite substrate are attached with a sealant. In the case where a post spacer is not provided on the opposite substrate, a bead spacer may be dispersed in a desired region and attachment may be performed.

Next, a liquid crystal material is injected in a space between the active matrix substrate and the opposite substrate, which are attached to each other. After injection of the liquid crystal material, an inlet for injection is sealed with an ultraviolet curable resin or the like. Alternatively, after dropping a liquid crystal material over the active matrix substrate or the opposite substrate, these substrates may be attached to each other.

Next, a polarizing plate is attached to both surfaces of a liquid crystal cell, which is formed by attachment of the active matrix substrate and the opposite substrate. Then, the cell process is finished.

Next, as the module process, a flexible printed circuit (FPC) is connected to an input terminal (in FIGS. 27A to 27C, the exposed region of the gate electrode layer 116) of the terminal portion. The FPC has a wiring formed using a conductive film over an organic resin film of polyimide or the like, and is connected to the input terminal through an anisotropic conductive paste (hereinafter referred to as an ACP). The ACP includes a paste functioning as an adhesive and particles plated with gold or the like to have a conductive surface, which have a diameter of several tens of micrometers to several hundreds of micrometers. When the particles mixed in the paste are in contact with the conductive layer over the input terminal and the conductive layer over the terminal connected to the wiring formed in the FPC, electric connection therebetween is achieved. Alternatively, after connection of the FPC, a polarizing plate may be attached to the active matrix substrate and the opposite substrate. In the above-described manner, a liquid crystal panel used for a display device can be manufactured.

As described above, the active matrix substrate including a pixel transistor, which is used for a display device, can be manufactured using three photomasks.

Accordingly, the number of steps for manufacturing a thin film transistor and a display device can be significantly reduced. Specifically, as described above, a thin film transistor can be manufactured using one photomask (multi-tone mask). Further, an active matrix substrate including a pixel transistor can be manufactured using three photomasks. In this manner, because the number of photomasks to be used is reduced, the number of steps for manufacturing a thin film transistor and a display device can be significantly reduced.

In addition, the number of steps for manufacturing a thin film transistor can be significantly reduced without a complicated step using backside light exposure, resist reflow, a lift-off method, or the like. Therefore, the number of steps for manufacturing a display device can be significantly reduced without a complicated step. Accordingly, the number of steps for manufacturing a display device can be significantly reduced without reducing yield of the display device.

Moreover, the number of steps for manufacturing a thin film transistor can be significantly reduced while electrical characteristics of the thin film transistor are maintained.

Furthermore, by the above-described effects, manufacturing cost can be significantly reduced.

Furthermore, by provision of an opening portion as described above, a contact area between a film which is to be etched and a chemical solution or a gas which is used for the etching in the second etching can be increased. Thus, controllability of the second etching can be improved, and a thin film transistor with smaller parasitic capacitance can be manufactured compared to the case where an opening portion is not provided. Further, insufficient insulation between adjacent wirings formed using a gate electrode layer can be prevented and thin film transistors can be manufactured with high yield.

In addition, by increasing a contact area between a film which is to be etched and a chemical solution or a gas which is used for the etching in the second etching, etching can be favorably performed even in the case where etching is hindered by a residue or the like which is caused in manufacturing steps and is left on a plane to be etched.

Moreover, by provision of an opening portion, the layout is not determined depending on the side-etching amount of the second etching. Thus, without reducing the freedom of layout design, the number of steps for manufacturing a thin film transistor and a display device can be significantly reduced.

Further, by increasing the width of a wiring at an opening portion, the increase in the amount of generated heat can be prevented and reliability can be improved.

Furthermore, by the above-described effects, manufacturing cost can be significantly reduced.

Note that the invention to be disclosed is not limited to the above-described pixel structure and can be applied to various liquid crystal display devices.

Embodiment 2

In this embodiment, a method for manufacturing a thin film transistor and a method for manufacturing a display device, which is an embodiment of the invention to be disclosed and is different from Embodiment 1, will be described. Specifically, a method for manufacturing a thin film transistor, which is similar to that of Embodiment 1, without using a multi-tone mask, will be described with reference to FIGS. 29A to 29C, FIGS. 30A to 30C, FIG. 31, FIG. 32, and FIG. 33.

Figure 29A:
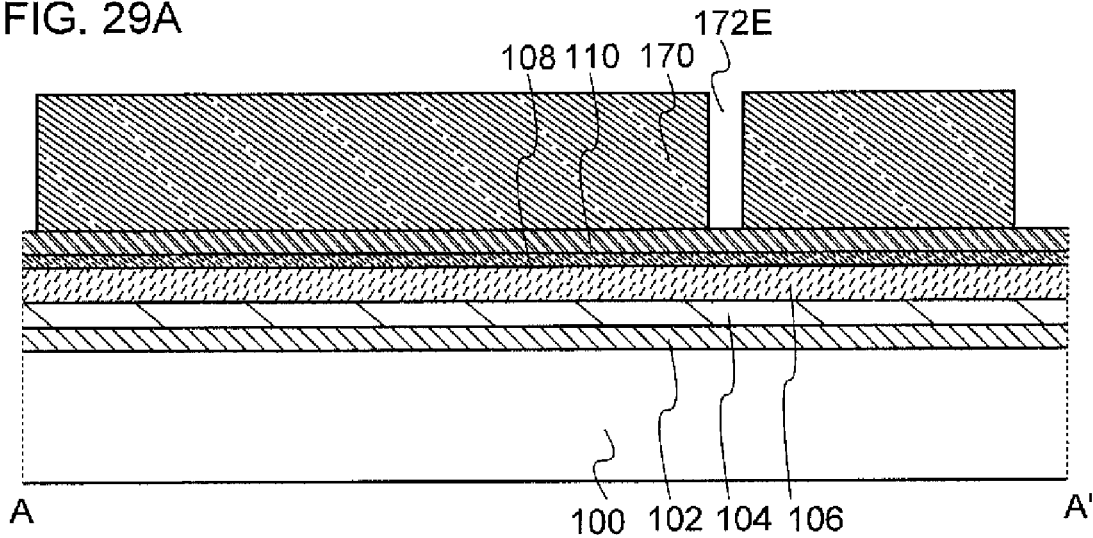
FIGS. 29A to 29C illustrate an example of a method for manufacturing a thin film transistor and a display device.
Figure 29B:
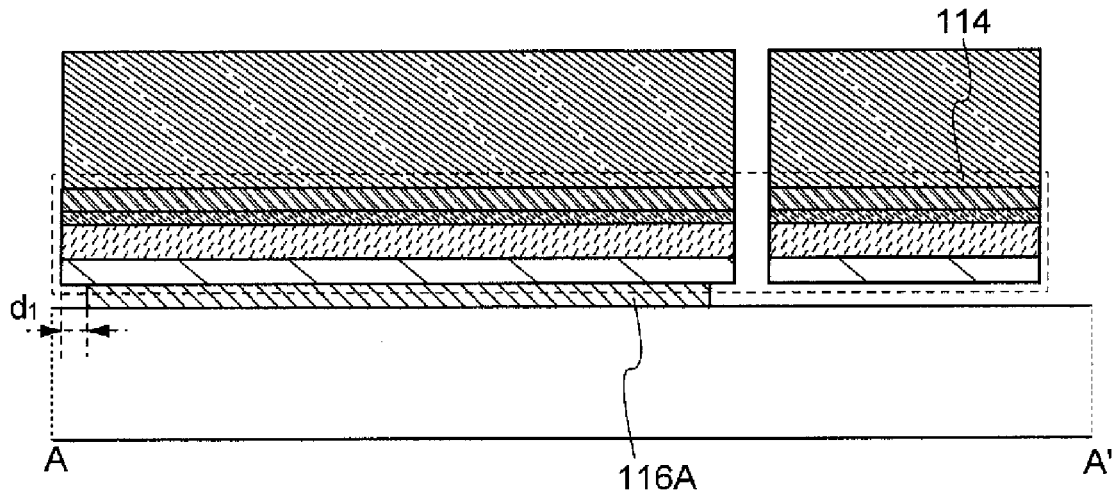
Figure 29C:
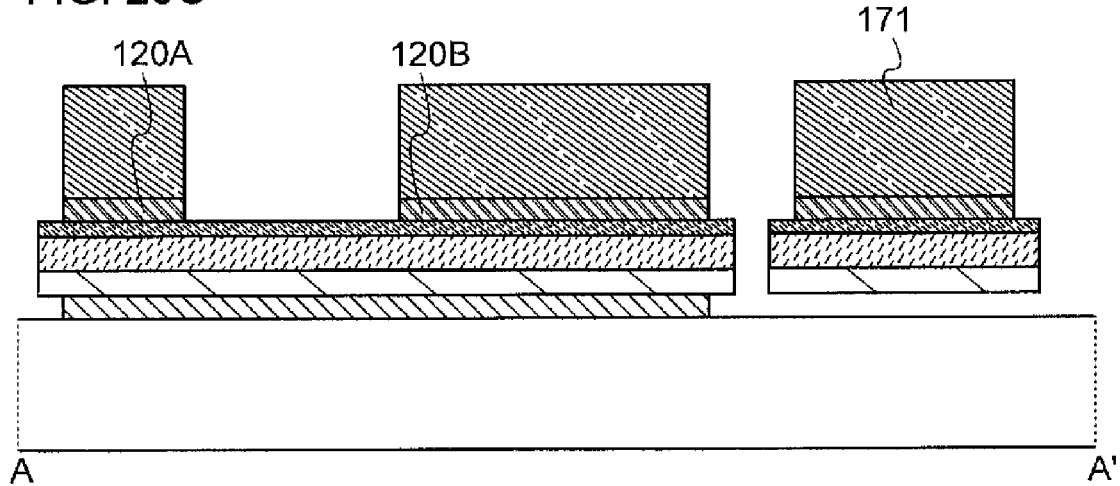
Figure 30A:
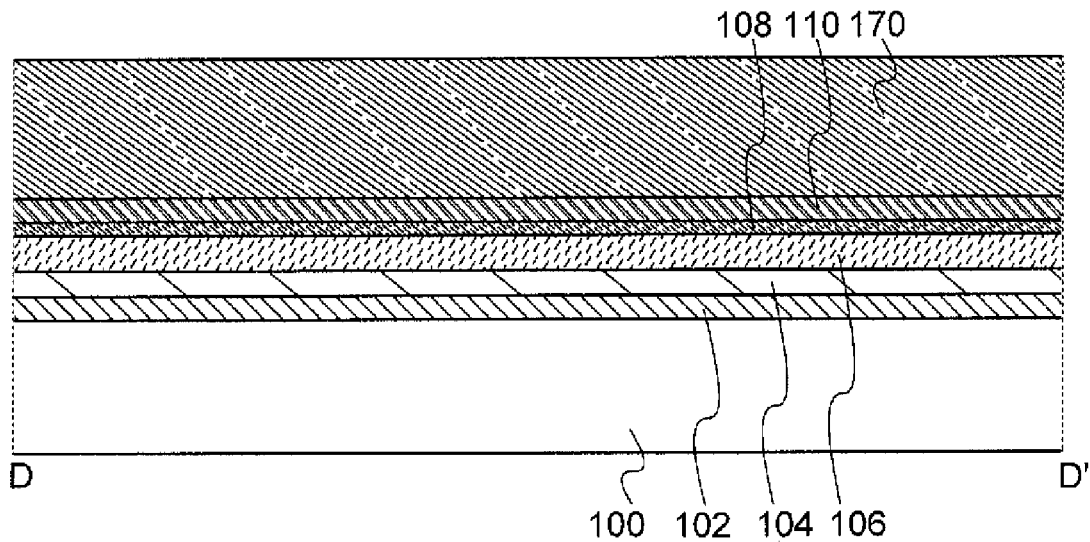
FIGS. 30A to 30C illustrate an example of a method for manufacturing a thin film transistor and a display device.
Figure 30B:
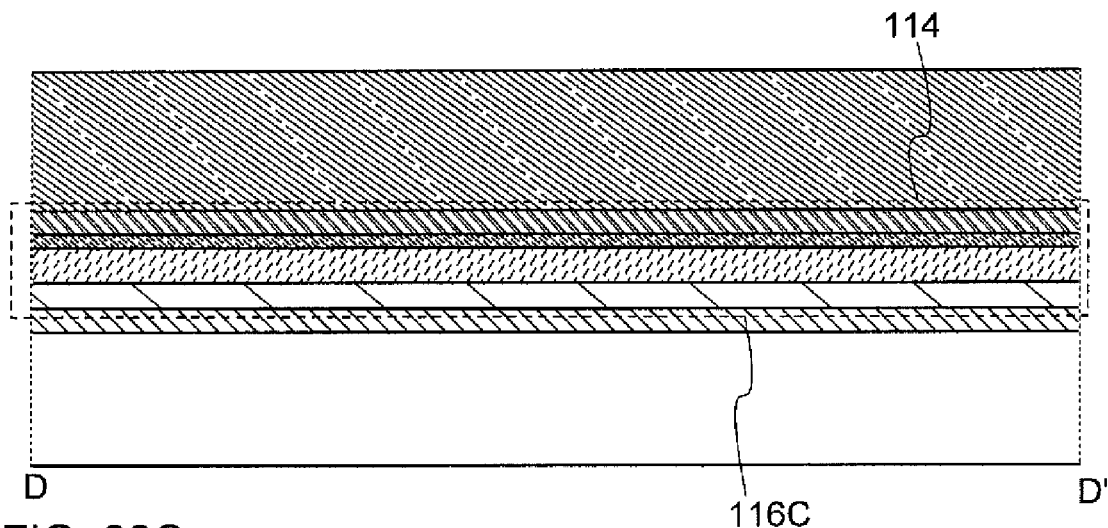
Figure 30C:
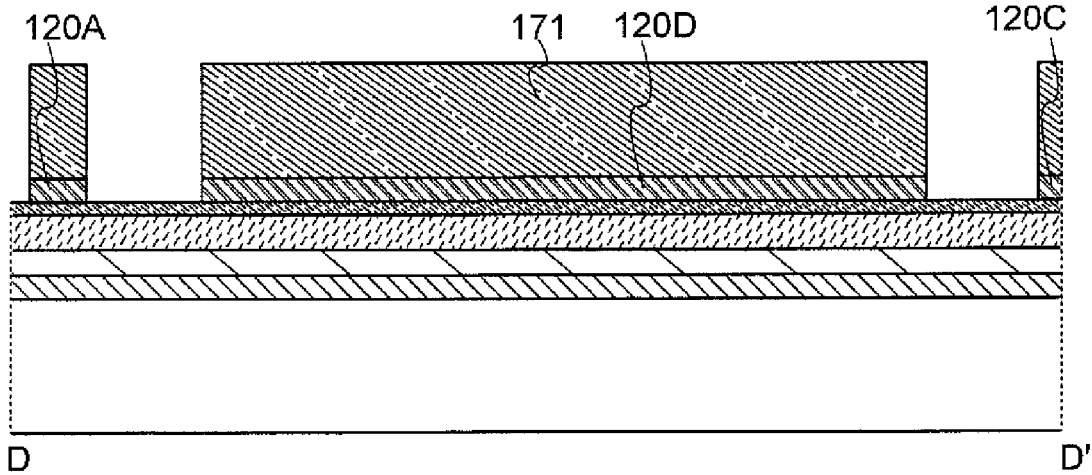
Figure 31:
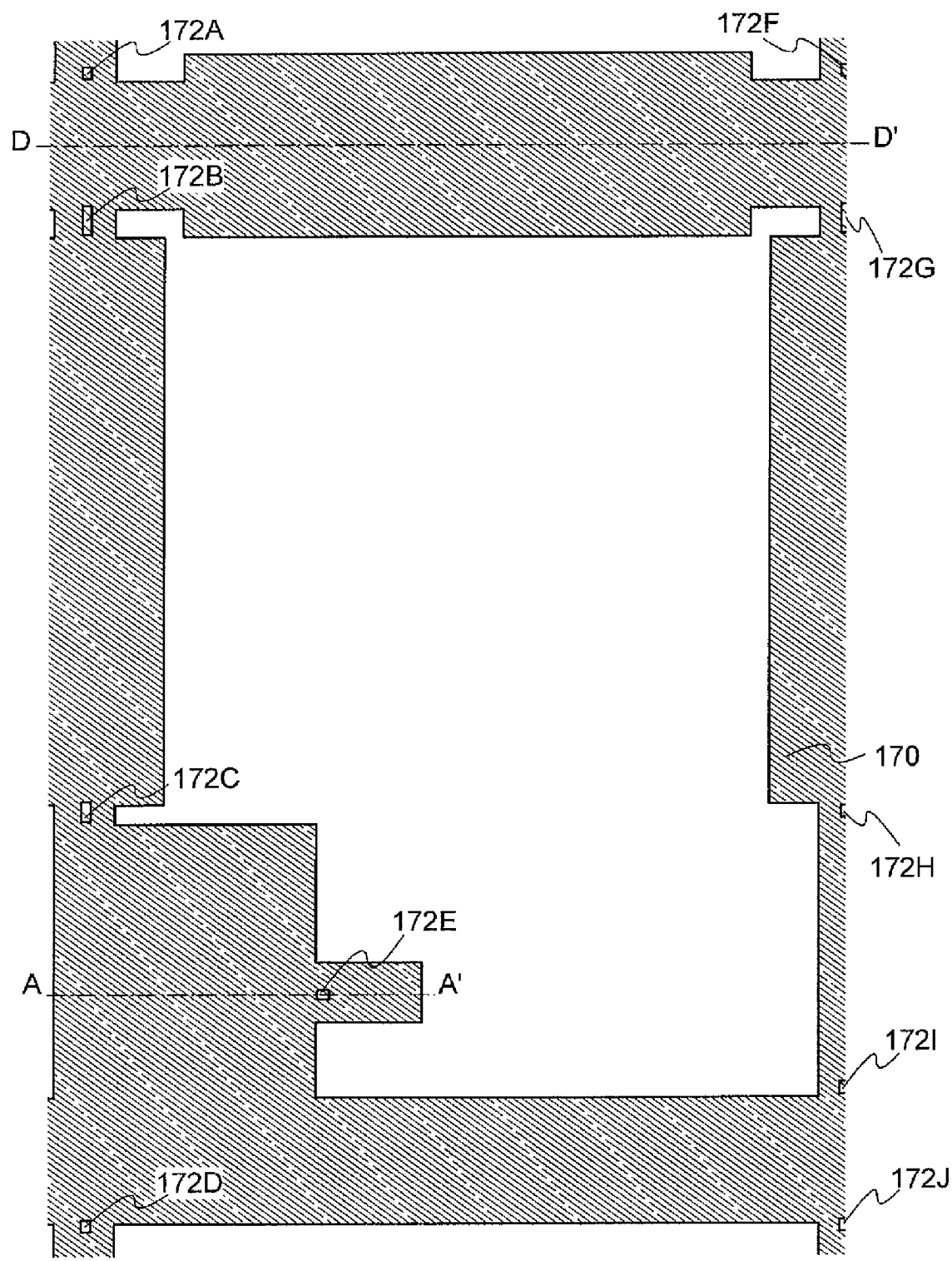
FIG. 31 illustrates an example of a method for manufacturing a thin film transistor and a display device.
Figure 32:
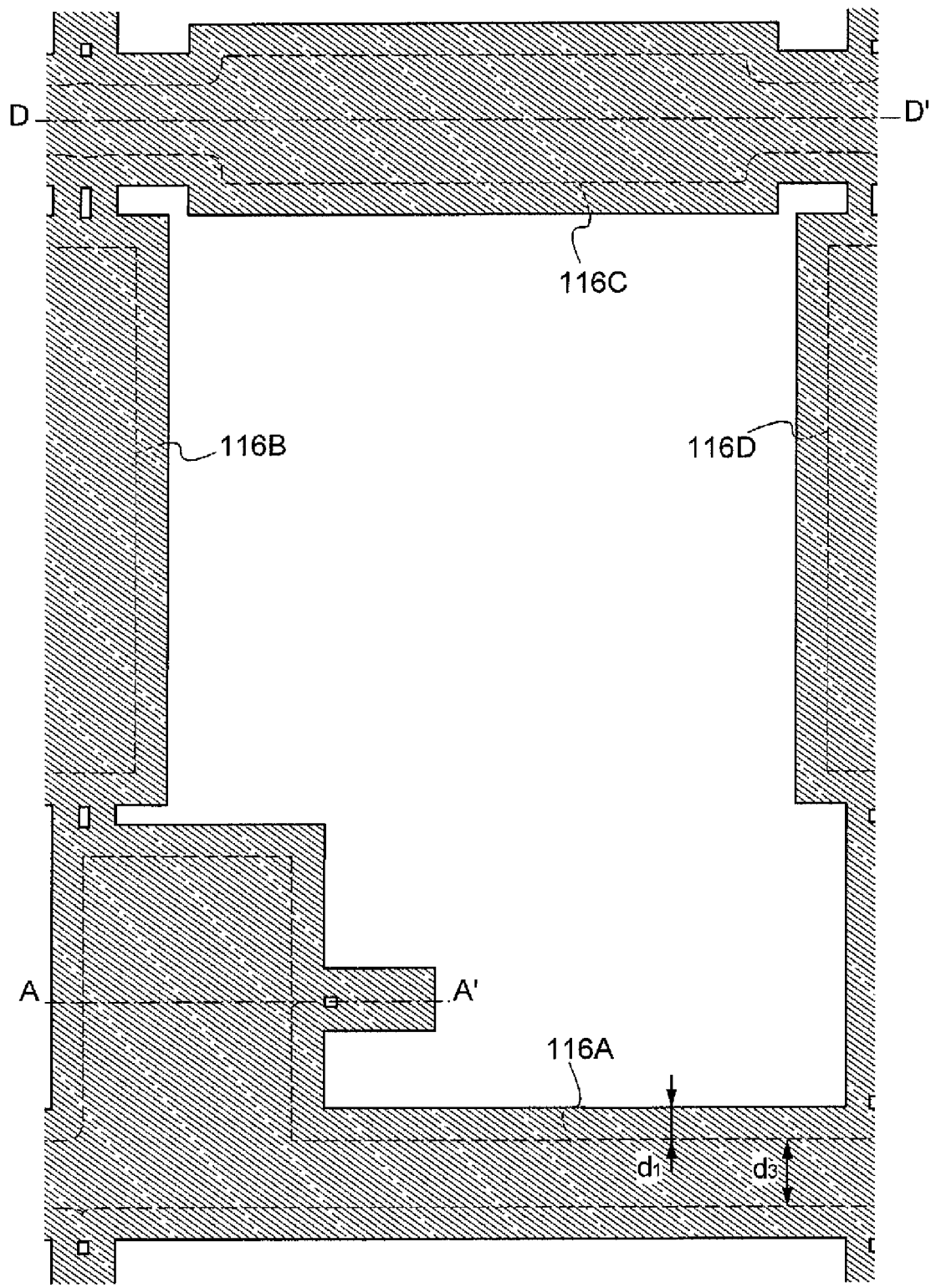
FIG. 32 illustrates an example of a method for manufacturing a thin film transistor and a display device.
Figure 33:
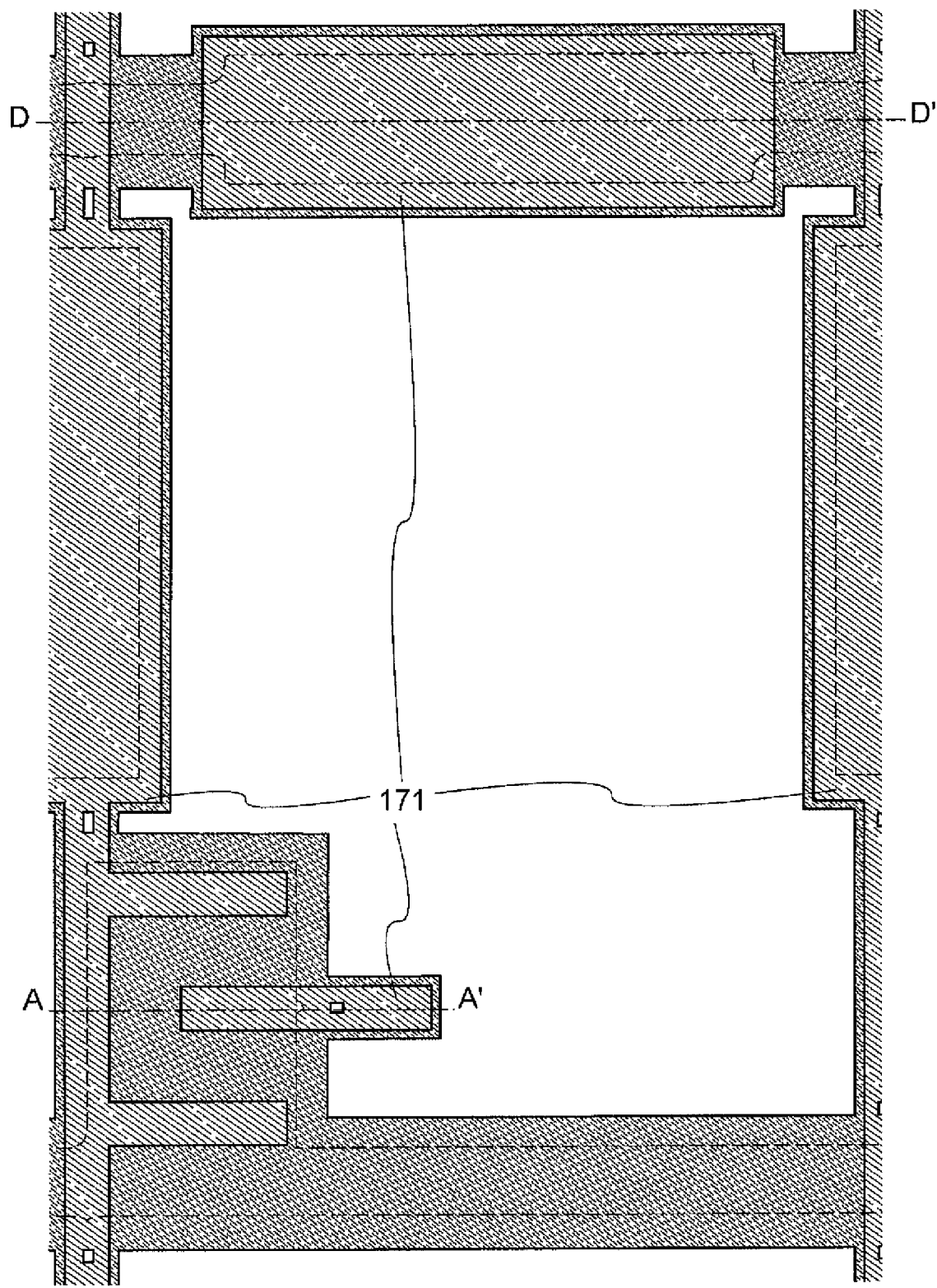
FIG. 33 illustrates an example of a method for manufacturing a thin film transistor and a display device.

Note that FIGS. 29A to 29C correspond to FIGS. 2A to 2C and FIGS. 3A to 3C in Embodiment 1. FIGS. 30A to 30C correspond to FIGS. 11A to 11C and FIGS. 12A to 12C in Embodiment 1. FIG. 31, FIG. 32, and FIG. 33 correspond to FIG. 17, FIG. 18, and FIG. 19 in Embodiment 1. In addition, cross-sectional views taken along the line A-A' illustrated in FIG. 31, FIG. 32, and FIG. 33 correspond to FIGS. 29A to 29C, and cross-sectional views taken along the line D-D' illustrated in FIG. 31, FIG. 32, and FIG. 33 correspond to FIGS. 30A to 30C.

First, in a similar manner to Embodiment 1, the first conductive film 102, the first insulating film 104, the semiconductor film 106, the impurity semiconductor film 108, and the second conductive film 110 are formed over the substrate 100 (see FIG. 29A and FIG. 30A). Materials thereof and formation methods thereof are similar to those in Embodiment 1. Note that in the case where a region which can make ohmic contact to a source and drain electrode layer is provided by doping or the like in a part of a semiconductor layer formed using the semiconductor film 106, the impurity semiconductor film 108 does not need to be provided.

Next, a first resist mask 170 is formed over the second conductive film 110 (see FIG. 29A and FIG. 30A). The first resist mask 170 is different from the first resist mask 112 of Embodiment 1 and is formed such that the whole mask has roughly uniform thickness. That is, the first resist mask 170 can be formed without using a multi-tone mask.

As in the case of the first resist mask 112 in Embodiment 1, the first resist mask 170 has a resist opening portion 172. Positions where resist opening portions 172A to 172J are provided in the first resist mask 170 or the like are similar to those of the resist opening portions 113A to 113J described in Embodiment 1, and thus the description is omitted.

Next, first etching is performed using the first resist mask 170. That is, the first conductive film 102, the first insulating film 104, the semiconductor film 106, the impurity semiconductor film 108, and the second conductive film 110 are patterned by etching to form the thin-film stack body 114 over the first conductive film 102 (see FIG. 31). Note that an insulating film may be provided between the substrate 100 and the first conductive film 102 as a base film also in this embodiment.

Then, second etching is performed in a similar manner to Embodiment 1; accordingly, the gate electrode layer 116 is formed (see FIG. 29C, FIG. 30C, and FIG. 32).

Here, the conditions of the second etching are similar to those of the second etching in Embodiment 1.

Then, a second resist mask 171 is formed over the thin-film stack body 114, and the source and drain electrode layer 120 is formed using the second resist mask 171 (see FIG. 29D, FIG. 30D, and FIG. 33). The etching conditions or the like are similar to those of Embodiment 1. The steps following this are similar to those of Embodiment 1.

Note that the case of forming the second resist mask 171 after the second etching is described here; however, the present invention is not limited thereto, and the second etching may be performed after formation of the second resist mask 171.

As described in this embodiment, a thin film transistor can be manufactured without using a multi-tone mask. Note that the number of masks to be used is increased by one, as compared to that of Embodiment 1.

Note that the method for manufacturing a thin film transistor and a display device according to this embodiment is similar to that of Embodiment 1 except for the point described above. Therefore, effects similar to those of the method for manufacturing a thin film transistor and a display device of Embodiment 1 can be obtained, but the number of masks to be used is increased by one. In other words, according to this embodiment, a thin film transistor can be manufactured using two photomasks. In addition, an active matrix substrate including a pixel transistor can be manufactured using four photomasks. In this manner, since the number of photomasks to be used is reduced compared to the conventional method in which the multi-tone mask is not used, the number of steps for manufacturing a thin film transistor and a display device can be significantly reduced. Furthermore, a thin film transistor and a display device can be manufactured with high yield and low cost.

Embodiment 3

In this embodiment, an example of a method for manufacturing a thin film transistor and a method for manufacturing an EL display device in which the thin film transistors are arranged in matrix will be described with reference to FIG. 34, FIG. 35, FIG. 36, FIG. 37, FIG. 38, FIG. 39, FIGS. 40A to 40C, FIGS. 41A to 41C, FIGS. 42A to 42C and FIGS. 46A to 46C.

Figure 34:
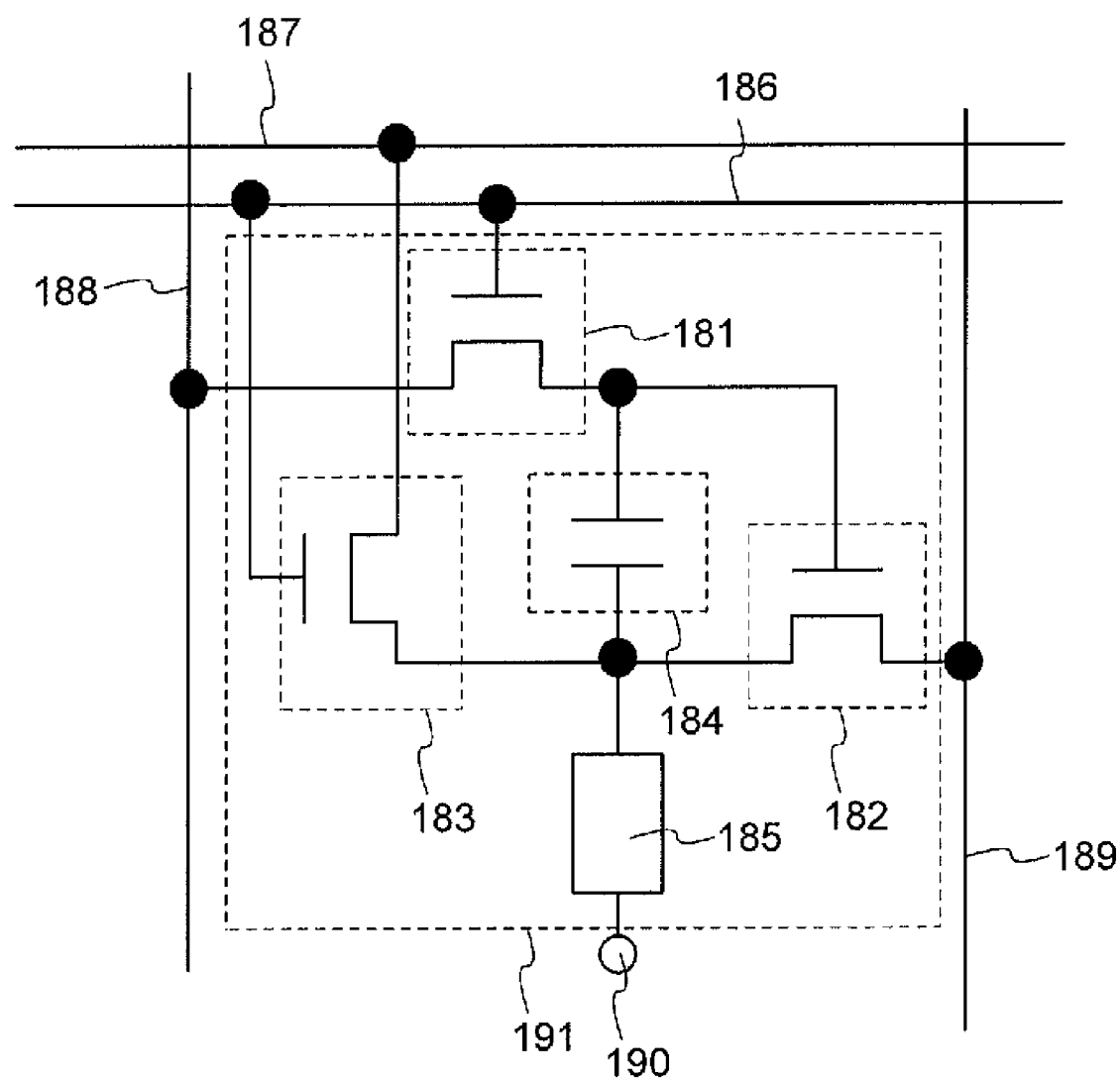
FIG. 34 illustrates an example of a pixel circuit of a display device.

As a pixel circuit of an EL display device (an active matrix EL display device), which uses a thin film transistor as a switching element, various pixel circuits are studied. In this embodiment, an example of a simple pixel circuit is illustrated in FIG. 34, and a method for forming a pixel structure in which this pixel circuit is applied will be described. Note that the structure of a pixel circuit of the EL display device to be disclosed is not limited to the structure illustrated in FIG. 34.

In the pixel structure of the EL display device illustrated in FIG. 34, a pixel 191 includes a first transistor 181, a second transistor 182, a third transistor 183, a capacitor element 184, and a light-emitting element 185. The first transistor, the second transistor, and the third transistor are n-channel transistors. A gate electrode of the first transistor 181 is connected to a gate wiring 186. One of a source electrode and a drain electrode (first electrode) of the first transistor 181 is connected to a source wiring 188. The other of the source electrode and the drain electrode (second electrode) is connected to a gate electrode of the second transistor 182 and one of electrodes (first electrode) of the capacitor element 184. The other of the electrodes (second electrode) of the capacitor element 184 is connected to one of a source electrode and a drain electrode (first electrode) of the second transistor 182, one of a source electrode and a drain electrode (first electrode) of the third transistor 183, and one of electrodes (first electrode) of the light-emitting element 185. The other of the source electrode and the drain electrode (second electrode) of the second transistor 182 is connected to a second power supply line 189. The other of the source electrode and the drain electrode (second electrode) of the third transistor 183 is connected to a first power supply line 187. A gate electrode of the third transistor 183 is connected to the gate wiring 186. The other of the electrodes (second electrode) of the light-emitting element 185 is connected to a common electrode 190. Note that the potential of the first power supply line 187 is different from that of the second power supply line 189.

Operation of the pixel 191 is described. When the third transistor 183 is turned on by a signal of the gate wiring 186, the first electrode of the second transistor 182, the first electrode of the light-emitting element 185, the second electrode of the capacitor element 184, and the first power supply line 187 are made to have the same potential ($V_{187}$). Here, since the first power supply line 187 is held at a constant potential ($V_{187}$), the first electrode of the second transistor 182 and the like are held at a constant potential ($V_{187}$).

When the first transistor 181 is selectively turned on by the signal of the gate wiring 186, the potential of a signal from the source wiring 188 ($V_{185}$) is input to the gate electrode of the second transistor 182 through the first transistor 181. At this time, when the potential of the second power supply line 189 ($V_{189}$) is higher than that of the first power supply line 187 ($V_{187}$), $V_{gs}=V_{188}-V_{187}$ is satisfied. In addition, when $V_{gs}$ is higher than the threshold voltage of the second transistor 182, the second transistor 182 is turned on.

Accordingly, when the second transistor 182 is operated in a linear region, the second transistor 182 can be controlled to be turned on or off by changing the potential of the source wiring 188 ($V_{188}$) (e.g., binary value). That is, it is possible to control whether or not voltage is applied to the EL layer included in the light-emitting element 185.

In addition, when the second transistor 182 is operated in a saturation region, the amount of the current flowing to the light-emitting element 185 can be controlled by changing the potential of the source wiring 188 ($V_{188}$).

Figure 46A:
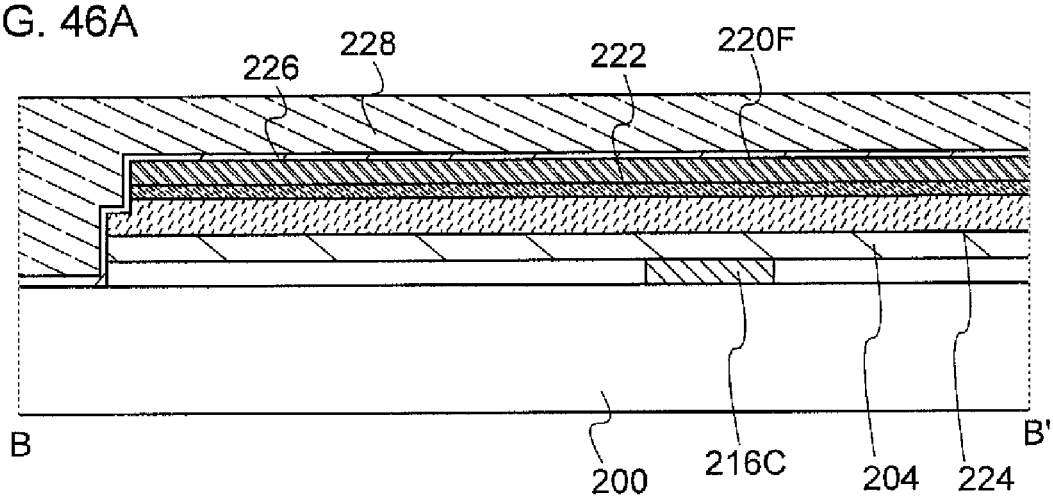
FIGS. 46A to 46C illustrate an example of a method for manufacturing a thin film transistor and a display device.
Figure 46B:
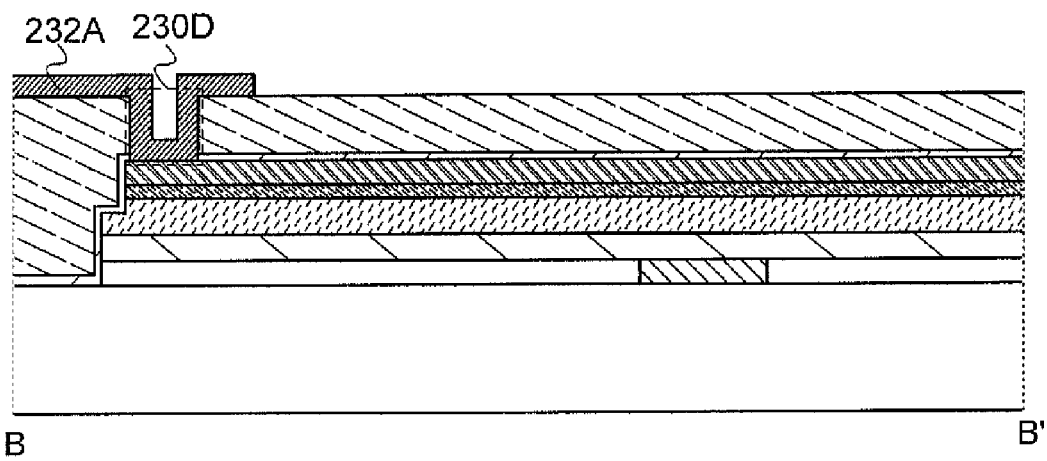
Figure 46C:
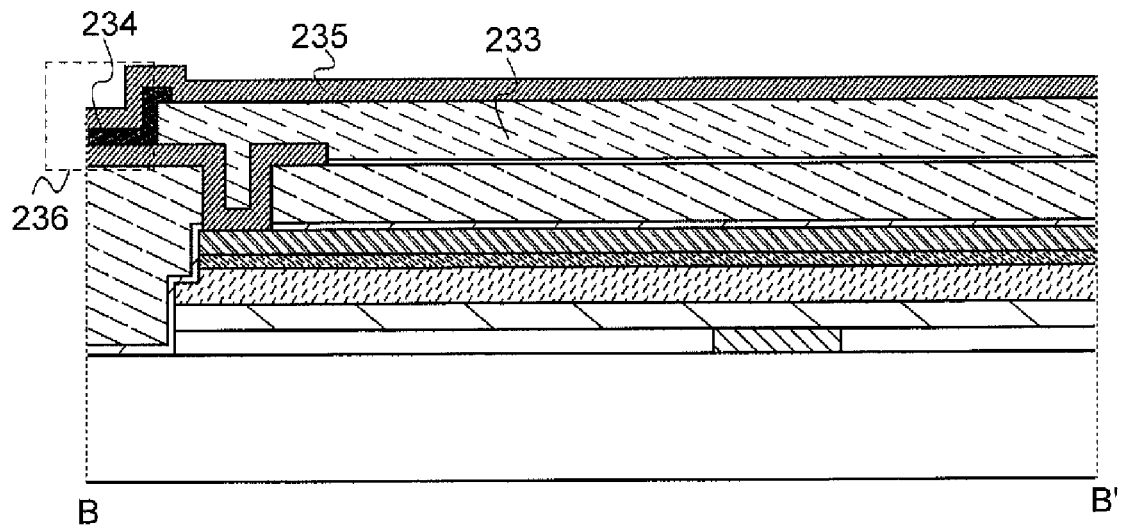

In this manner, when the second transistor 182 is operated in a linear region, it is possible to control whether or not voltage is applied to the light-emitting element 185 and it is possible to control whether the light-emitting element 185 is in a light-emitting state or in a non-light-emitting state. This driving method can be used for, for example, digital time gray scale driving. The digital time gray scale driving is a driving method in which one frame is divided into a plurality of subframes and it is possible to control whether the light-emitting element 185 is in a light-emitting state or in a non-light-emitting state in each of the subframes. In addition, when the second transistor 182 is operated in a saturation region, the amount of the current flowing to the light-emitting element 185 can be controlled and luminance of the light-emitting element 185 can be controlled. FIGS. 46A to 46C are cross-sectional views taken along the line B-B' in FIG. 39

Next, a pixel structure which applies the pixel circuit illustrated in FIG. 34 and a manufacturing method thereof are described below.

Figure 37:
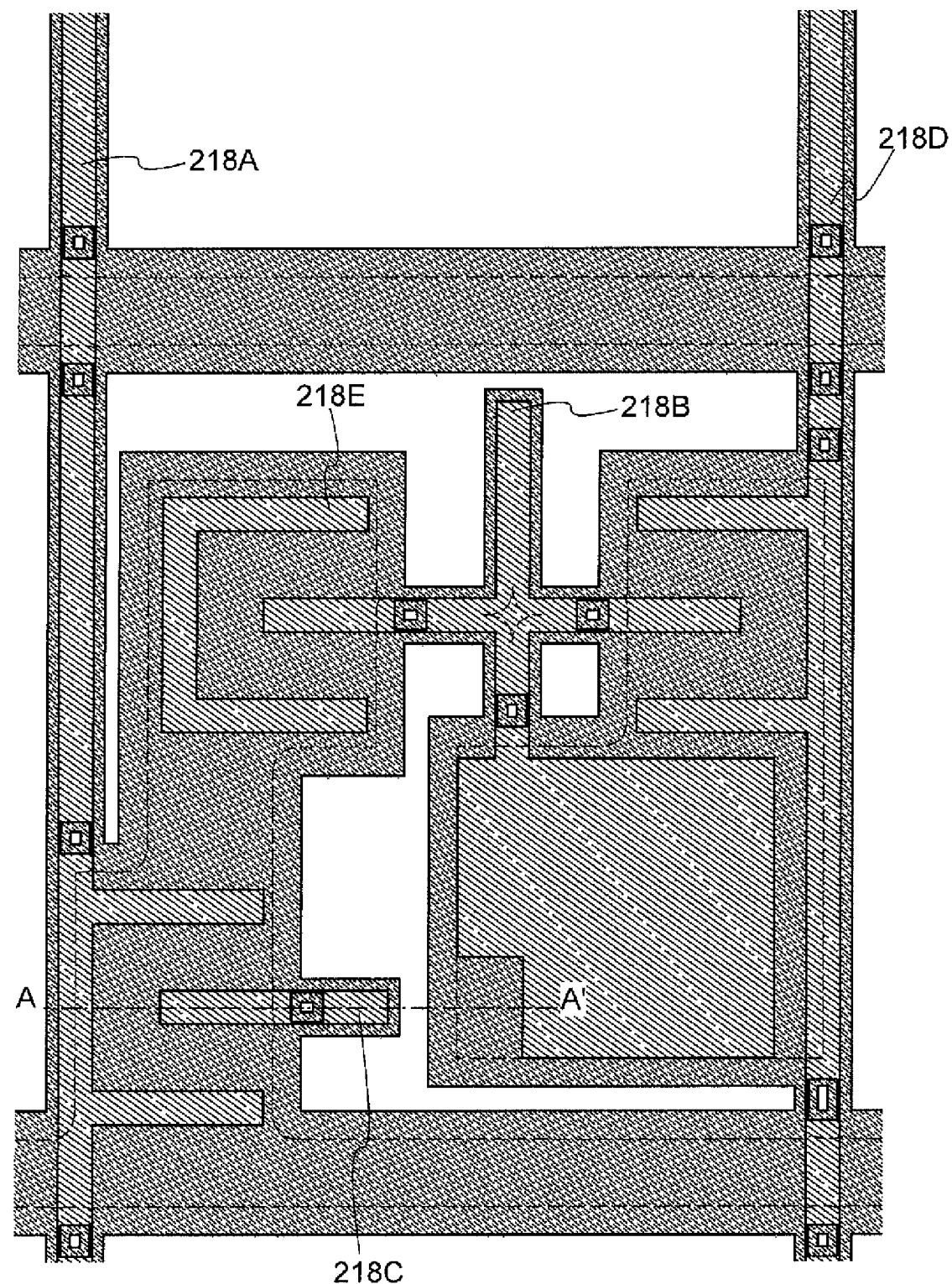
FIG. 37 illustrates an example of a method for manufacturing a thin film transistor and a display device.
Figure 38:
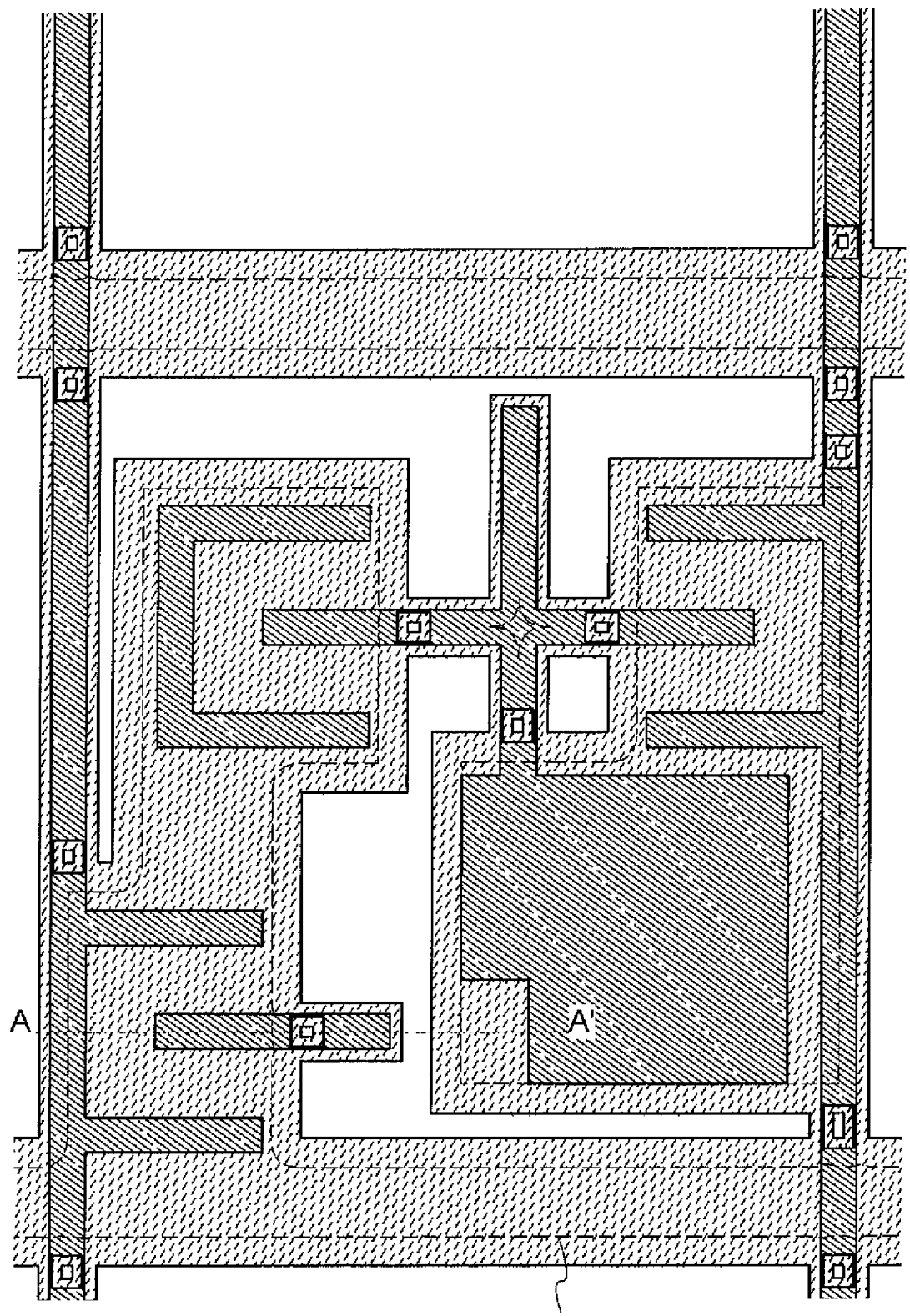
FIG. 38 illustrates an example of a method for manufacturing a thin film transistor and a display device.
Figure 39:
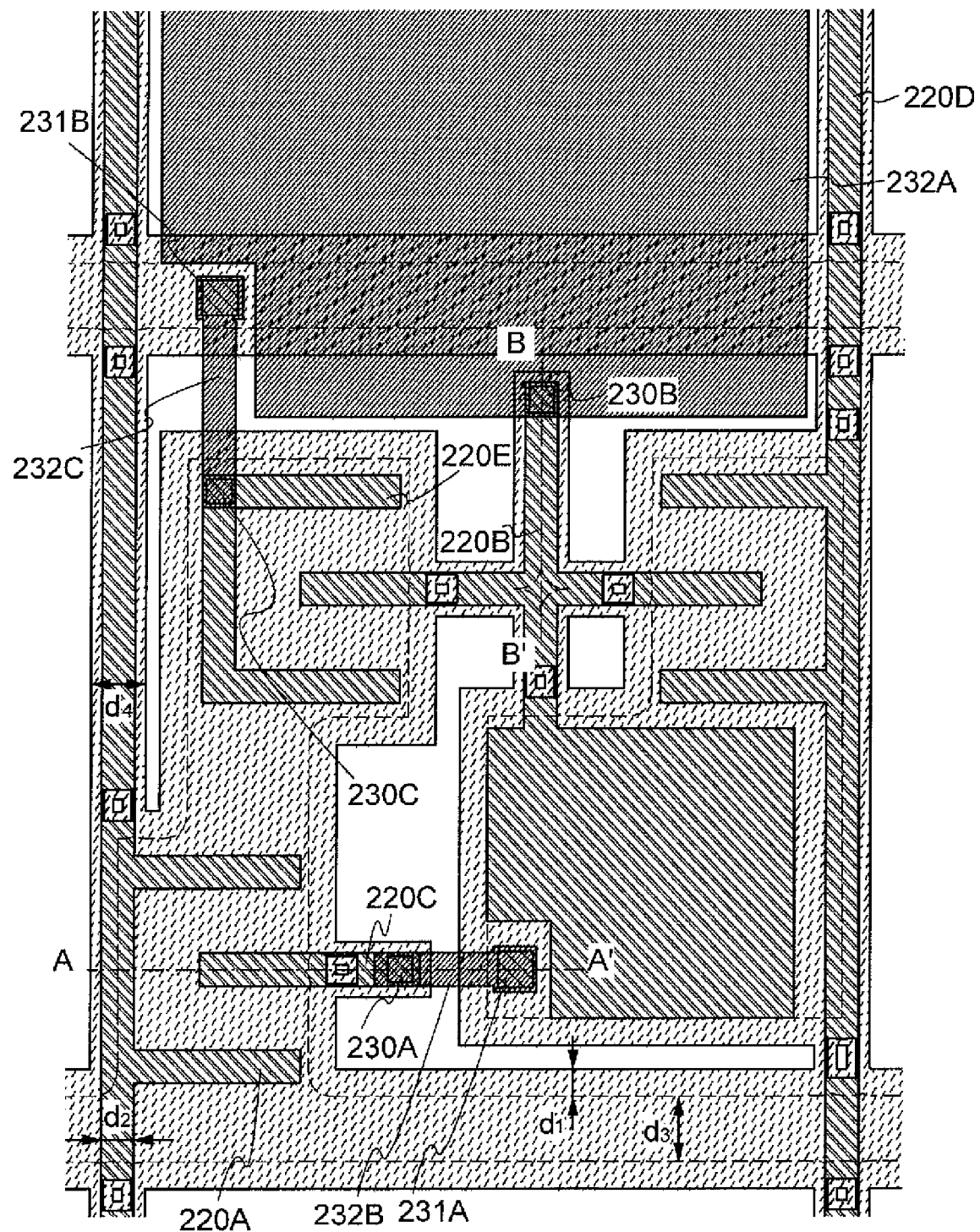
FIG. 39 illustrates an example of a method for manufacturing a thin film transistor and a display device.

Note that FIG. 35, FIG. 36, FIG. 37, FIG. 38, and FIG. 39 are top views of thin film transistors according to this embodiment. FIG. 39 is a completion view in which components are formed up to a pixel electrode. FIGS. 40A to 40C, FIGS. 41A to 41C, and FIGS. 42A to 42C are cross-sectional views taken along the line A-A' in FIG. 35, FIG. 36, FIG. 37, FIG. 38, and FIG. 39.

Figure 40A:
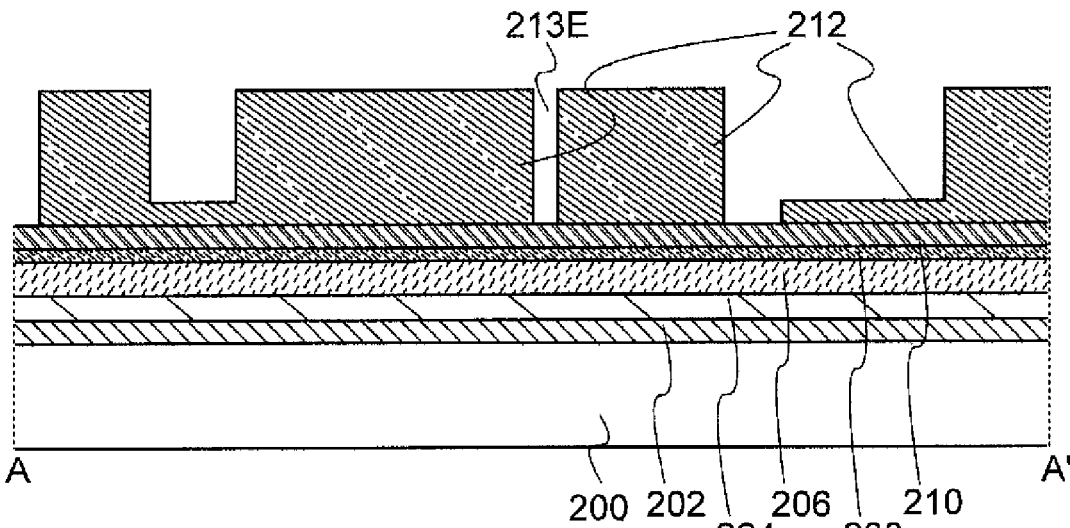
FIGS. 40A to 40C illustrate an example of a method for manufacturing a thin film transistor and a display device.
Figure 40B:
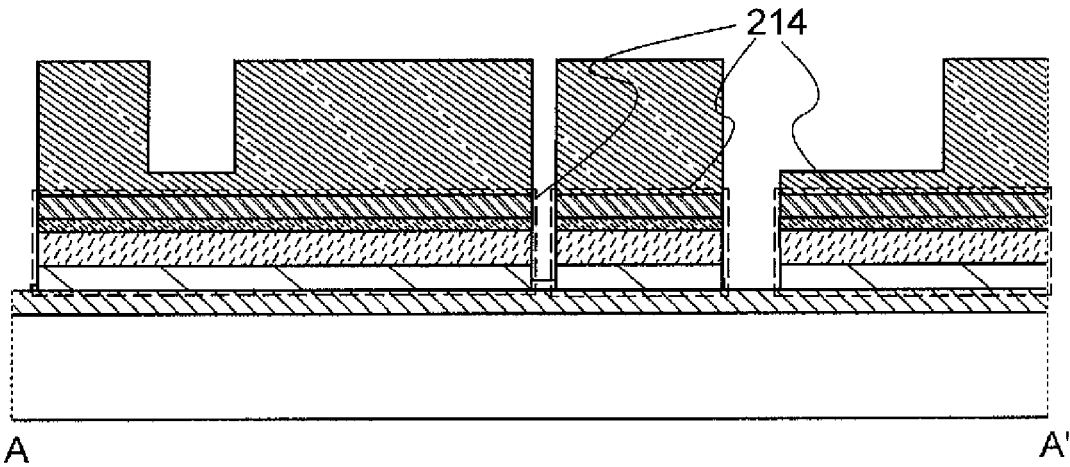

First, a first conductive film 202, a first insulating film 204, a semiconductor film 206, an impurity semiconductor film 208, and a second conductive film 210 are formed over a substrate 200 (see FIG. 40A). Note that an insulating film may be provided between the substrate 200 and the first conductive film 202 as a base film also in this embodiment.

As the substrate 200, a substrate similar to the substrate 100 of Embodiment 1 can be used. Note that the first conductive film 202 can be formed using a material similar to that of the first conductive film 102 of Embodiment 1 in a similar manner to the first conductive film 102 of Embodiment 1. The first insulating film 204 can be formed using a material similar to that of the first insulating film 104 of Embodiment 1 in a similar manner to the first insulating film 104 of Embodiment 1.

It is preferable that the semiconductor film 206 be formed using stacked layers including a crystalline semiconductor film and an amorphous semiconductor film. As a crystalline semiconductor film, a polycrystalline semiconductor film, a microcrystalline semiconductor film, and the like are given.

A "polycrystalline semiconductor film" means a semiconductor film including crystal grains and having a large number of grain boundaries between the crystal grains. The polycrystalline semiconductor film is formed by, for example, a thermal crystallization method or a laser crystallization method. Here, a "thermal crystallization method" means a crystallization method in which an amorphous semiconductor film is formed over a substrate and the substrate is heated to crystallize the amorphous semiconductor. In addition, a "laser crystallization method" means a crystallization method in which an amorphous semiconductor film is formed over a substrate and the amorphous semiconductor film is irradiated with a laser beam to crystallize the amorphous semiconductor. Alternatively, a crystallization method in which an element promoting crystallization such as nickel is added and a semiconductor is crystallized may be used. In the case where crystallization is performed using an element promoting crystallization to be added, the semiconductor film is preferably irradiated with a laser beam.

Polycrystalline semiconductors are classified into low temperature polysilicon (LTPS) to which crystallization is performed at a temperature and for a time period at which distortion is not caused in a glass substrate and high temperature polysilicon (HTPS) to which crystallization is performed at a higher temperature.

A "microcrystalline semiconductor film" means a semiconductor film including crystal grains with a diameter of approximately greater than or equal to 2 nm and less than or equal to 100 nm, and also includes a semiconductor film in which only crystal grains are formed on a whole surface or a semiconductor film in which an amorphous semiconductor is interposed between crystal grains. As a method for forming a microcrystalline semiconductor film, a method in which crystal nuclei are formed and the crystal nuclei are grown, a method in which an amorphous semiconductor film is formed, an insulating film is formed in contact with the amorphous semiconductor film, a metal film is formed, and the metal film is irradiated with a laser beam, whereby the amorphous semiconductor is crystallized using heat generated in the metal film, or the like may be used. Note that a crystalline semiconductor film which is formed by using the thermal crystallization method or the laser crystallization method for the amorphous semiconductor film is not included.

When as the semiconductor film 206, for example, stacked layers including a crystalline semiconductor film and an amorphous semiconductor film stacked thereover are used, a transistor included in a pixel circuit of an EL display device can be operated at high speed. Here, as the crystalline semiconductor film, a polycrystalline semiconductor (including LTPS and HTPS) film may be employed, or a microcrystalline semiconductor film may be employed.

Note that by provision of an amorphous semiconductor film over a crystalline semiconductor film, oxidization of a surface of a microcrystalline semiconductor film can be prevented. In addition, withstand voltage can be improved, and off current can be reduced.

Note that as long as a pixel circuit of an EL display device can be operated normally, crystallinity of the semiconductor film 206 is not particularly limited.

The impurity semiconductor film 208 is a semiconductor film including an impurity element imparting one conductivity type and is formed using a gas for forming a semiconductor material to which the impurity element imparting one conductivity type is added or the like. In this embodiment, since an n-channel thin film transistor is provided, the impurity semiconductor film 208 may be formed using, for example, a silicon film including phosphorus, which is formed using a silane gas including phosphine (chemical formula: $PH_3$). Note that as in the case of the first conductive film 202 and the like, the material of the impurity semiconductor film 208 needs to have heat resistance and be not unintentionally etched or eroded in a later step. As long as these conditions are satisfied, the material of the impurity semiconductor film 208 is not limited to a particular material. Crystallinity of the impurity semiconductor film 208 is not particularly limited as well. Moreover, in the case where a region which can make ohmic contact is provided by doping or the like in a part of a semiconductor layer formed using the semiconductor film 206, the impurity semiconductor film 208 does not need to be provided.

In this embodiment, since an n-channel thin film transistor is manufactured, arsenic or the like may be used as the impurity element imparting one conductivity type to be added. A silane gas used for formation of the impurity semiconductor film 208 may contain arsine (chemical formula: $AsH_3$) at a desired concentration.

In addition, the impurity semiconductor film 208 can be formed by, for example, a CVD method (including a thermal CVD method, a plasma CVD method, and the like), or the like. However, the formation method of the impurity semiconductor film 208 is not limited to a particular method.

The second conductive film 210 can be formed using a material which is similar to that of the second conductive film 110 of Embodiment 1 in a similar manner to the second conductive film 110 of Embodiment 1, but the second conductive film 210 is formed using a material which is different from the material used for the first conductive film 202.

Next, a first resist mask 212 is formed over the second conductive film 210 (see FIG. 40A). Here, it is preferable that the first resist mask 212 be a resist mask having a recessed portion and a projected portion. In other words, the first resist mask 212 can also be referred to as a resist mask including a plurality of regions (here, two regions) having different thicknesses. In the first resist mask 212, the thick region is called a projected portion of the first resist mask 212 and the thin region is called a recessed portion of the first resist mask 212. Note that the embodiment mode is not limited thereto, and a resist mask which does not have a recessed portion and a projected portion may be used.

In the first resist mask 212, a projected portion is formed in a region where a source and drain electrode layer is formed and a recessed portion is formed in a region where a source and drain electrode layer is not formed and a semiconductor layer is exposed.

The first resist mask 212 can be formed using a multi-tone mask that is described in Embodiment 1. Note that the multi-tone mask is not necessarily used.

Figure 35:
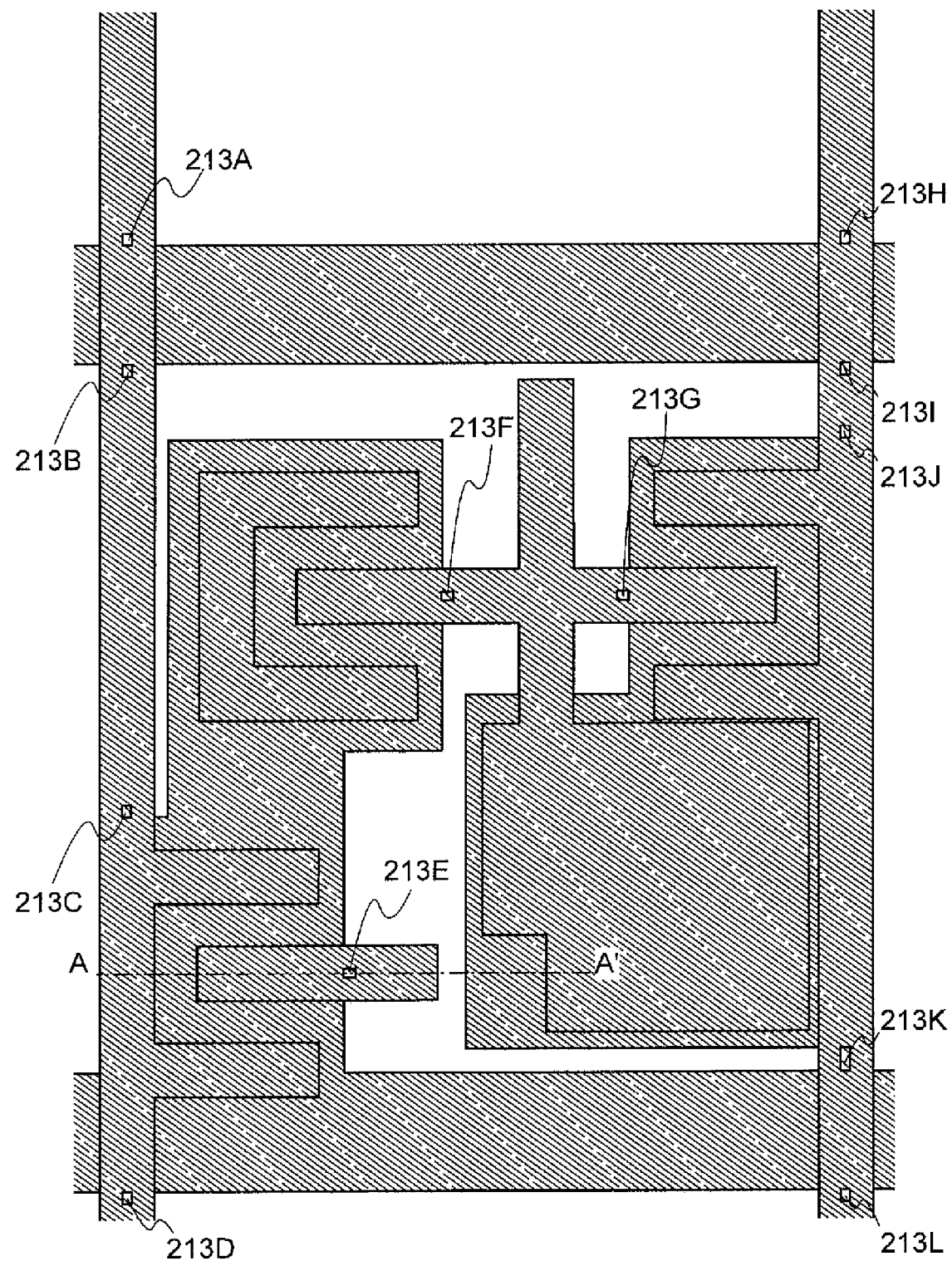
FIG. 35 illustrates an example of a method for manufacturing a thin film transistor and a display device.

Further, the first resist mask 212 has resist opening portions 213A to 213L as in the case of the first resist mask 112 of Embodiment 1 (see FIG. 35).

Here, at least one resist opening portion may be provided between adjacent wirings formed using a conductive layer (a gate electrode layer 216) which is the processed first conductive film 202. Because the first resist mask 212 has the resist opening portion in a region overlapping with the source wiring, an opening portion can be formed in a thin-film stack body 214 by the first etching. Note that the opening portion to be provided in the thin-film stack body 214 is formed so as to reach the first conductive film 202. By provision of the opening portion in the thin-film stack body 214, controllability of the second etching that is described later can be improved. Moreover, because the first resist mask 212 has at least one resist opening portion between a gate wiring and a capacitor wiring, which are adjacent to each other, in a region overlapping with a source wiring, the accuracy of insulation between a gate wiring and a capacitor wiring, which are adjacent to each other, by the second etching that is described later can be improved.

Note that at an intersection of the source wiring and the wiring provided using the conductive layer (the gate electrode layer 216) that is the processed first conductive film 202, the resist opening portion is preferably provided at a position where the gate wiring is sandwiched between them (see FIG. 36, FIG. 37, FIG. 38, and FIG. 39). At this time, a distance between the opening portion and the gate wiring may be determined in accordance with the etching rate of the side-etching. By the second etching accompanied by the side-etching, a horn is not generated in the conductive layer (the gate electrode layer 216) that is the processed first conductive film 202, or the horn can be formed to be smaller even when the horn is generated.

Next, the first etching is performed using the first resist mask 212. That is, the first insulating film 204, the semiconductor film 206, the impurity semiconductor film 208, and the second conductive film 210 are patterned by etching to form the thin-film stack body 214 (see FIG. 35 and FIG. 40B). It is preferable that at least a surface of the first conductive film 202 be exposed at this time. This etching step is called "first etching". As the first etching, either dry etching or wet etching may be employed. Note that the first etching can be performed in one step when dry etching is employed as the first etching, while the first etching is preferably performed in plural steps when wet etching is employed as the first etching. This is because the etching rate varies depending on the kind of a film to be etched and it is difficult to perform the etching in one step.

Next, second etching is performed using the first resist mask 212. That is, the first conductive film 202 is patterned by the etching to form the gate electrode layer 216 (see FIG. 36 and FIG. 40C).

Note that the gate electrode layer 216 includes a gate electrode of a thin film transistor, a gate wiring, one of electrodes of a capacitor element, first power supply line, and a supporting portion. When a gate electrode layer is referred to as a gate electrode layer 216A, the gate electrode layer means an electrode layer which includes a gate wiring, a gate electrode of the first transistor 181, and a gate electrode of the third transistor 183; when a gate electrode layer is referred to as a gate electrode layer 216B, the gate electrode layer means an electrode layer which includes a gate electrode of the second transistor 182 and one of electrodes of the capacitor element 184; when a gate electrode layer is referred to as a gate electrode layer 216C, the gate electrode layer means an electrode layer which includes a supporting portion; and when a gate electrode layer is referred to as a gate electrode layer 216D, the gate electrode layer means an electrode layer which includes the first power supply line 187. Then, these gate electrode layers are collectively referred to as the gate electrode layer 216.

The second etching is performed under such etching conditions that a side surface of the gate electrode layer 216 formed using the first conductive film 202 is provided more on the inside than a side surface of the thin-film stack body 214. In other words, the second etching is performed so that the side surface of the gate electrode layer 216 is in contact with a bottom surface of the thin-film stack body 214 (the etching is performed such that the width of the gate electrode layer 216 is narrower than that of the thin-film stack body 214 along the line A-A'). Further, the second etching is performed under such conditions that the etching rate of the second conductive film 210 is low and the etching rate of the first conductive film 202 is high. In other words, the second etching is performed under the conditions that the etching selectivity of the first conductive film 202 with respect to the second conductive film 210 is high. By performing the second etching under such conditions, the gate electrode layer 216 can be formed.

Note that the shape of the side surface of the gate electrode layer 216 is not particularly limited. For example, the shape may be a tapered shape. The shape of the side surface of the gate electrode layer 216 is determined depending on the conditions such as a chemical solution used in the second etching.

Here, the phrase "the conditions that the etching rate of the second conductive film 210 is low and the etching rate of the first conductive film 202 is high" or "the conditions that the etching selectivity of the first conductive film 202 with respect to the second conductive film 210 is high" means conditions satisfying the following first requirement and second requirement.

Figure 36:
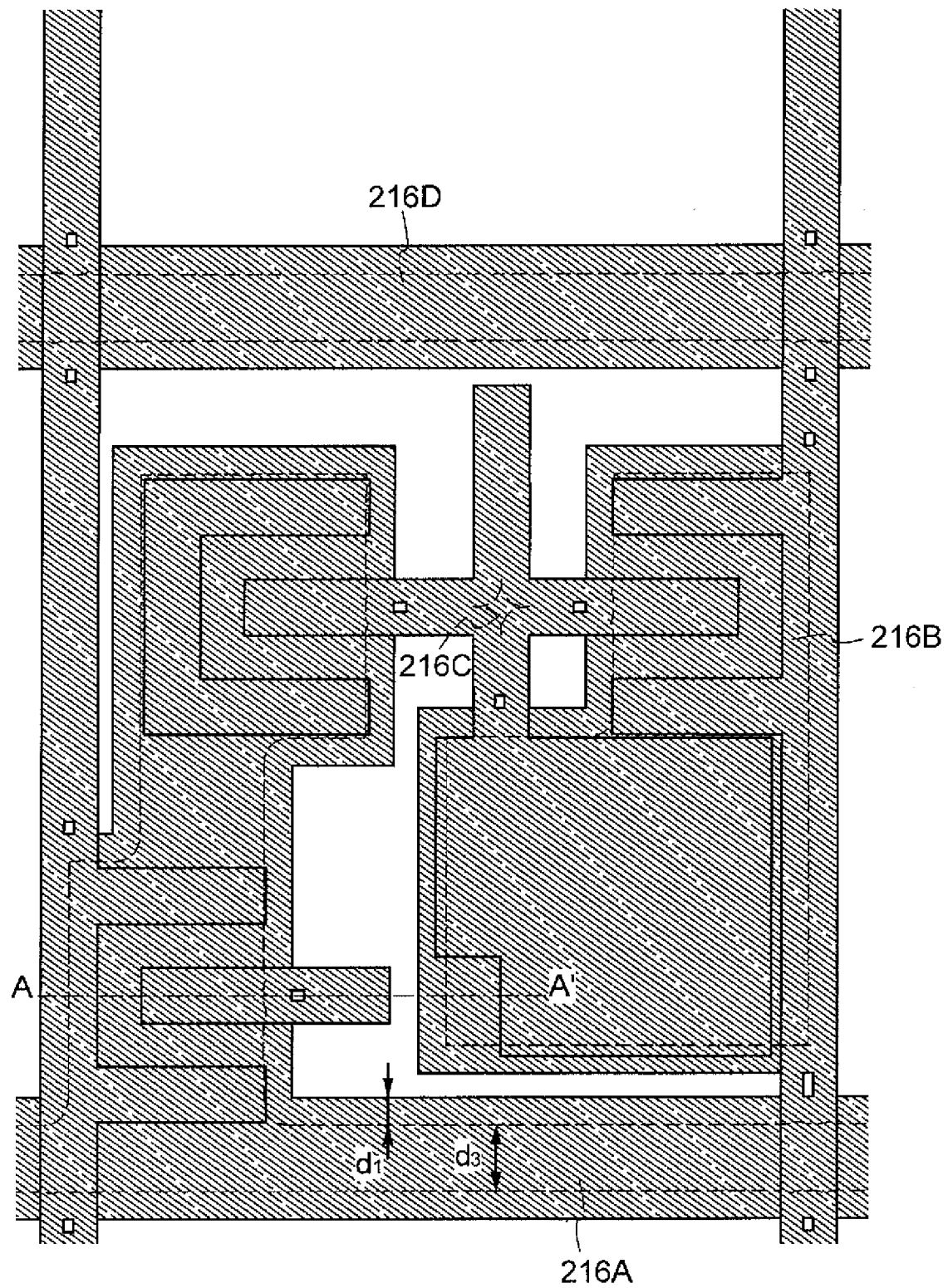
FIG. 36 illustrates an example of a method for manufacturing a thin film transistor and a display device.
Figure 40C:
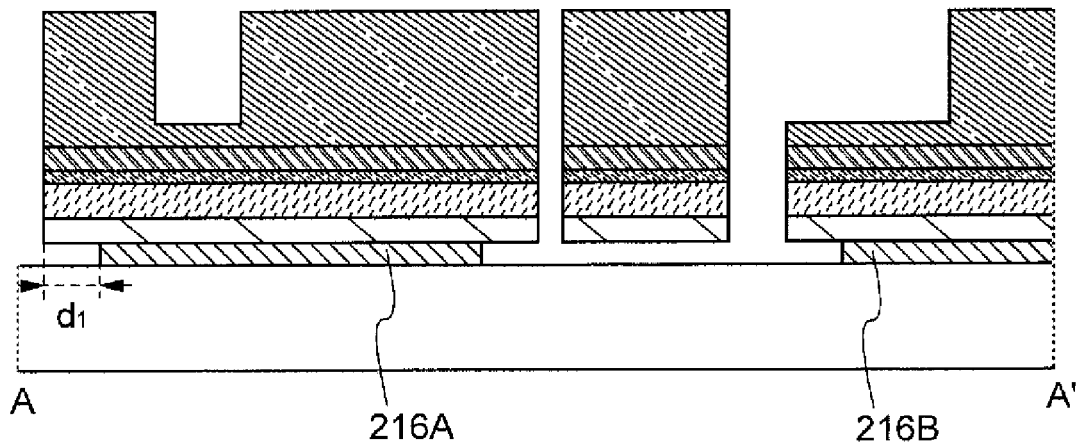

The first requirement is that the gate electrode layer 216 is left in necessary places. The places where the gate electrode layer 216 is necessary are regions indicated by dotted lines in FIG. 36, FIG. 37, FIG. 38, and FIG. 39. That is, it is necessary that the gate electrode layer 216 is left so as to form a gate wiring, a gate electrode included in a transistor, and an electrode included in a capacitor element after the second etching. In order that the gate electrode layer forms the gate wiring and the first power supply line, the second etching needs to be performed so as not to disconnect these wirings. As illustrated in FIG. 36 and FIG. 40C, the side surface of the gate electrode layer 216 is preferably provided more on the inside than the side surface of the thin-film stack body 214 by a distance $d_1$, and the distance $d_1$ may be set as appropriate by a practitioner in accordance with the layout.

The second requirement is that the minimum width $d_3$ of the gate wiring or the first power supply line formed using the gate electrode layer 216 and a minimum width $d_2$ of a source wiring formed using a source and drain electrode layer 220 have appropriate values (see FIG. 39). This is because as the source and drain electrode layer 220 is etched by the second etching, the minimum width $d_2$ of the source wiring is reduced; accordingly, the current density of the source wiring becomes excessive and electrical characteristics are degraded. Therefore, the second etching is performed under the conditions that the etching rate of the first conductive film 202 is not too high and the etching rate of the second conductive film 210 is as low as possible.

Here, the case where the resist opening portions 213A to 213L are not provided is discussed. In the case where the resist opening portions 213A to 213L are not provided, it is difficult to make the minimum width $d_2$ of the source wiring large. This is because in the case where the resist opening portions 213A to 213L are not provided, the minimum width $d_2$ of the source wiring is determined by a minimum width $d_4$ of the semiconductor layer overlapping with the source wiring and the minimum width $d_4$ of the semiconductor layer has to be increased in order to make the minimum width $d_2$ of the source wiring larger; accordingly, it becomes difficult that the gate wiring and the power supply line, which are adjacent to each other, are insulated from each other. In this case, the minimum width $d_4$ of the semiconductor layer needs to be set smaller than about twice the distance $d_1$. In other words, the distance $d_1$ needs to be set larger than about half the minimum width $d_4$ of the semiconductor layer. Thus, the layout available to be designed is limited. Moreover, the etching rate of a chemical solution used in the second etching needs to be sufficient. When insulation between the gate wiring and the first power supply line, which are adjacent to each other, is secured, an etching gas, a chemical solution, or the like, which can be used for the second etching, is limited.

Accordingly, as described above, by providing the first resist mask 212 with the resist opening portions 213A to 213L, the number of paths through which an etching gas, a chemical solution, or the like enters is increased and the shape of the gate electrode layer 216 can be a preferable shape. Further, the range of choices of chemical solutions used for the etching can be expanded, and the range of choices of materials can be expanded as well.

Furthermore, in the case where the resist opening portions 213A to 213L are not provided, as described above, a horn is formed in the gate electrode layer 216 in the top views in some cases. This is because the second etching is roughly isotropic. In addition, in some cases, the horn is in contact with the gate wiring and the first power supply line, which are adjacent to each other; accordingly, the gate wiring and the first power supply line, which are adjacent to each other, are electrically connected, which becomes the cause of reduction in yield. However, as described above, by provision of the resist opening portions 213A to 213L, insulation between the gate wiring and the first power supply line, which are adjacent to each other, can be secured, which makes it possible to increase yield.

Moreover, even when insulation between the gate wiring and the first power supply line, which are adjacent to each other, can be secured without provision of the resist opening portions, parasitic capacitance is generated due to the existence of the horn that is described above, which causes delay of a signal and the like. As described above, by providing the first resist mask 212 with the resist opening portions 213A to 213L, generation of the horn can be prevented and the horn can be made to be smaller. Accordingly, generation of parasitic capacitance can be suppressed and display devices with excellent characteristics or the like can be manufactured.

Note that there may be at least one portion where the width of the semiconductor layer overlapping with the source wiring is the minimum width $d_4$ between the gate wiring and the first power supply line that is adjacent to the gate wiring. It is preferable that the width of the semiconductor layer in a region adjacent to the gate wiring and a region adjacent to the first power supply line be the minimum width $d_4$ as illustrated in FIG. 39.

Note that as in the case of the portion where the width of the semiconductor layer overlapping with the source wiring is the minimum width $d_4$, one resist opening portion to be provided in the first resist mask 212 may be provided between the gate wiring and the first power supply line, which are adjacent to each other, and all of the resist opening portions are not necessarily provided.

However, there is a problem in that the width of the source wiring to be formed is made to be narrow when the resist opening portions 213A to 213L are provided. When a cross-sectional area of the wiring is narrower, the path for electric current becomes narrower, which leads to the increase in the amount of generated heat. The increase in the amount of generated heat causes disconnection or the like in use, which becomes the cause of the breakdown of electronic devices. That is, reliability is reduced.

Accordingly, it is preferable that the resist opening portion be provided without reducing a cross-sectional area of the source wiring in a similar manner to Embodiment 1. In order to provide the resist opening portion without reducing the cross-sectional area of the source wiring, the width of the source wiring may be increased by an amount equal to the width of the opening portion on the periphery of the opening portion (not illustrated). By increasing the width of the source wiring on the periphery of the opening portion, the opening portion can be provided without narrowing the width of the source wiring.

Alternatively, the increase in the amount of generated heat may be suppressed by increasing the thickness of the second conductive film 210 used for forming the source wiring.

In addition, it is preferable that the width of the electrode in a portion connected to a pixel electrode layer, which is formed using the source and drain electrode layer, be equal to the minimum width $d_2$ of the source wiring.

As described above, the second etching under the condition in which side-etching can be performed is very important. This is because by the second etching in which the first conductive film 202 is side-etched, it is possible to form a pattern so that a desired connection of elements in the pixel circuit can be obtained, as well as the gate wirings which are adjacent to each other and are formed using the gate electrode layer 216.

Here, since the second etching is accompanied by side-etching, the second etching is roughly isotropic. As described above, at least the surface of the first conductive film 202 is exposed by the first etching, and the gate electrode layer 216 is formed by the second etching, whereby the distance $d_1$ can be set smaller than the thickness of the first conductive film 202. That is, the distance $d_1$ can be designed independently with respect to the thickness of the first conductive film 202, thereby improving the freedom of layout design of the pixel structure.

Here, the term "side-etching" means etching in which a film is etched not only in a thickness direction of the film (a direction perpendicular to the substrate surface or a direction perpendicular to the surface of a base film) but also in a direction perpendicular to the thickness direction (a direction parallel to the substrate surface or a direction parallel to the surface of the base film). An end portion of the film subjected to side-etching can have various shapes depending on the etching rate of an etching gas or a chemical solution which is used for the etching with respect to the film. The end portion of the film is, in many cases, formed with a curved surface.

The gate electrode layer 216C illustrated in FIG. 36 serves as a supporting portion which supports the thin-film stack body 214. By the existence of the supporting portion, peeling of a film such as a gate insulating film formed over the gate electrode layer can be prevented. Further, by the existence of the supporting portion, a cavity region formed adjacent to the gate electrode layer 216 by the second etching can be prevented from being larger than necessary. Furthermore, it is preferable to provide the supporting portion because the thin-film stack body 214 can be prevented from being broken or damaged due to its own weight and, accordingly, yield is increased. However, the present invention is not limited to the mode with the supporting portion, and the supporting portion is not necessarily provided.

As described above, the second etching is preferably performed by wet etching.

In the case where the second etching is performed by wet etching, the first conductive film 202 may be formed using aluminum or molybdenum, the second conductive film 210 may be formed using titanium or tungsten, and a chemical solution containing nitric acid, acetic acid, and phosphoric acid may be used for etching. Alternatively, the first conductive film 202 may be formed using molybdenum, the second conductive film 210 may be formed using titanium, aluminum, or tungsten, and a chemical solution containing hydrogen peroxide water may be used for etching.

In the case where the second etching is performed by wet etching, it is most preferable that a stacked film in which molybdenum is provided over aluminum to which neodymium is added be formed as the first conductive film 202, tungsten be provided as the second conductive film 210, and a chemical solution containing nitric acid at 2%, acetic acid at 10%, and phosphoric acid at 72% be used for etching. By the usage of a chemical solution having such a composition, the first conductive film 202 can be etched without the second conductive film 210 being etched. Note that neodymium is added to the first conductive film 202 for the purpose of reducing resistance of aluminum and preventing a formation of hillocks.

Next, the first resist mask 212 is made to be reduced; accordingly, the second conductive film 210 is exposed and a second resist mask 218 is formed. As a method for forming the second resist mask 218 by reducing the first resist mask 212, for example, ashing using oxygen plasma can be given. However, the method for forming the second resist mask 218 by reducing the first resist mask 212 is not limited thereto. A region where the second resist mask 218 is formed roughly corresponds to a projected portion in the first resist mask 212. Note that the case where the second resist mask 218 is formed after the second etching is described here; however, the embodiment mode is not limited thereto and the second etching may be performed after formation of the second resist mask 218.

Note that in the case where a multi-tone mask is not used for forming the first resist mask 212, the second resist mask 218 may be formed separately with the use of a different photomask.

Figure 41A:
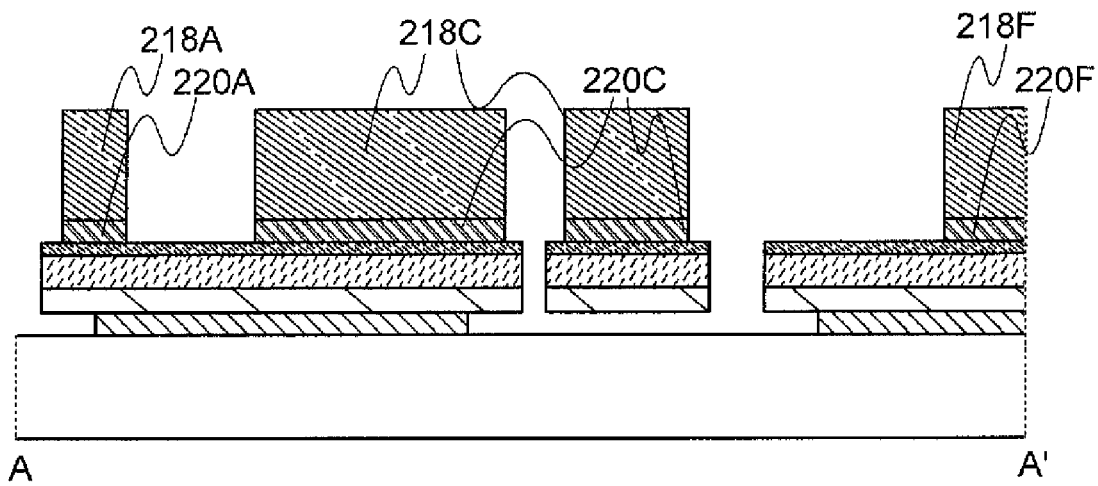
FIGS. 41A to 41C illustrate an example of a method for manufacturing a thin film transistor and a display device.

Next, the second conductive film 210 in the thin-film stack body 214 is etched using the second resist mask 218, so that the source and drain electrode layer 220 is formed (see FIG. 37 and FIG. 41A). Here, as the etching conditions, the conditions by which films other than the second conductive film 210 are not unintentionally etched or eroded or are not easily unintentionally etched or eroded are selected. In particular, it is important that etching is performed under the conditions that the gate electrode layer 216 is not unintentionally etched or eroded or is not easily unintentionally etched or eroded.

Note that the source and drain electrode layer 220 includes the source electrode or the drain electrode of the thin film transistor, the source wiring, the second power supply line 189, the other of the electrodes of the capacitor element, and the electrode that connects the thin film transistor to one electrode of the light-emitting element. When a source and drain electrode layer is referred to as a source and drain electrode layer 220A, the source and drain electrode layer means an electrode layer which includes the source wiring 188 and one of the source electrode and the drain electrode of the first transistor 181; when a source and drain electrode layer is referred to as a source and drain electrode layer 220B, the source and drain electrode layer means the other one of the electrodes of the capacitor element 184, one of the source electrode and the drain electrode of the second transistor 182, one of the source electrode and the drain electrode of the third transistor 183, and an electrode layer constituting an electrode to be connected to one electrode of the light emitting-element; when a source and drain electrode layer is referred to as a source and drain electrode layer 220C, the source and drain electrode layer means an electrode layer which includes the other of the source electrode and the drain electrode of the first transistor 181 and the electrode that connects the first transistor 181 to the pixel electrode; when a source and drain electrode layer is referred to as a source and drain electrode layer 220D, the source and drain electrode layer means an electrode layer which includes the second power supply line 189 and the other one of the source electrode and the drain electrode of the second transistor 182; and when a source and drain electrode layer is referred to as a source and drain electrode layer 220E, the source and drain electrode layer means an electrode layer which includes the other one of the source electrode and the drain electrode of the third transistor 183.

Note that a second resist mask 218A is a second resist mask overlapping with the source and drain electrode layer 220A; a second resist mask 218B is a second resist mask overlapping with the source and drain electrode layer 220B; a second resist mask 218C is a second resist mask overlapping with the source and drain electrode layer 220C; a second resist mask 218D is a second resist mask overlapping with the source and drain electrode layer 220D; and a second resist mask 21SE is a second resist mask overlapping with the source and drain electrode layer 220E.

Note that for etching the second conductive film 210 in the thin-film stack body 214, either wet etching or dry etching may be performed.

Figure 41B:
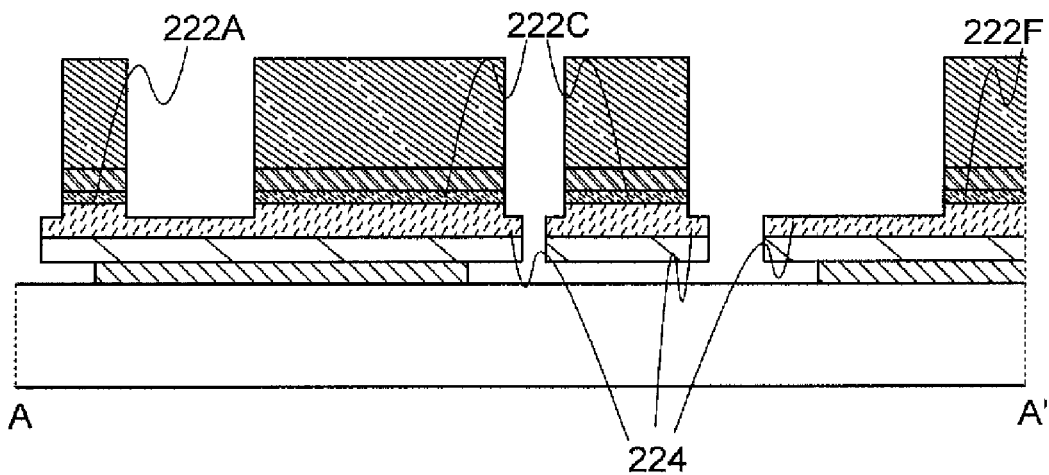

Then, the impurity semiconductor film 208 and an upper portion of the semiconductor film 206 (back channel portion) in the thin-film stack body 214 are etched to form a source and drain region 222 and a semiconductor film 224 (see FIG. 38 and FIG. 41B). Here, as the etching conditions, the conditions by which films other than the impurity semiconductor film 208 and the semiconductor film 206 are not unintentionally etched or eroded or are not easily unintentionally etched or eroded are selected. In particular, it is important that etching is performed under the conditions that the gate electrode layer 216 is not unintentionally etched or eroded or is not easily unintentionally etched or eroded.

Note that the etching of the impurity semiconductor film 208 and the upper portion of the semiconductor film 206 (back channel portion) in the thin-film stack body 214 can be performed by dry etching or wet etching.

Figure 41C:
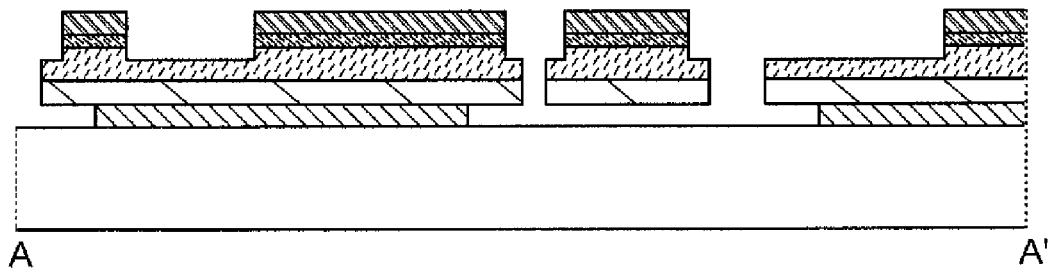

Then, the second resist mask 218 is removed; accordingly, a thin film transistor is completed (see FIG. 41C). As described above, the thin film transistor that is applicable to an EL display device can be manufactured using one photomask (multi-tone mask).

Note that the steps described with reference to FIG. 41A and FIG. 41B are collectively referred to as "third etching." The third etching may be performed in separate steps as described above or may be performed in a single step.

A second insulating film is formed to cover the thin film transistor that is formed in the above-described manner. Although the second insulating film may be formed using only a first protective film 226, the second insulating film is formed using the first protective film 226 and a second protective film 228 here (see FIG. 42A and FIG. 46A). The first protective film 226 may be formed in a similar manner to the first insulating film 204; however, it is preferable that the first protective film 226 be formed using silicon nitride containing hydrogen or silicon oxynitride containing hydrogen to prevent a semiconductor layer from being contaminated by impurities, such as a metal, which penetrate the semiconductor layer and diffuse thereinto.

The second protective film 228 is formed by a method by which the surface thereof becomes roughly planar. This is because when the surface of the second protective film 228 is roughly planar, a break due to a step or the like of a first pixel electrode layer 232 formed over the second protective film 228 can be prevented. Accordingly, the phrase "roughly planar" means being planar to such an extent that the above-described aim can be achieved, and does not mean that high planarity is required.

The second protective film 228 can be formed by, for example, a spin coating method or the like using photosensitive polyimide, acrylic, epoxy resin, or the like. Note that the present invention is not limited to these materials and the formation method.

Note that it is preferable that the second protective film 228 be formed by stacking the above-described protective film that is formed by a method by which the surface thereof becomes roughly planar and a protective film which covers the above-described protective film in order to prevent penetration and release of moisture. The protective film for preventing penetration and release of moisture is preferably formed using, specifically, silicon nitride, silicon oxynitride, aluminum oxynitride, aluminum nitride, or the like. As the formation method, a sputtering method is preferably used.

Figure 42A:
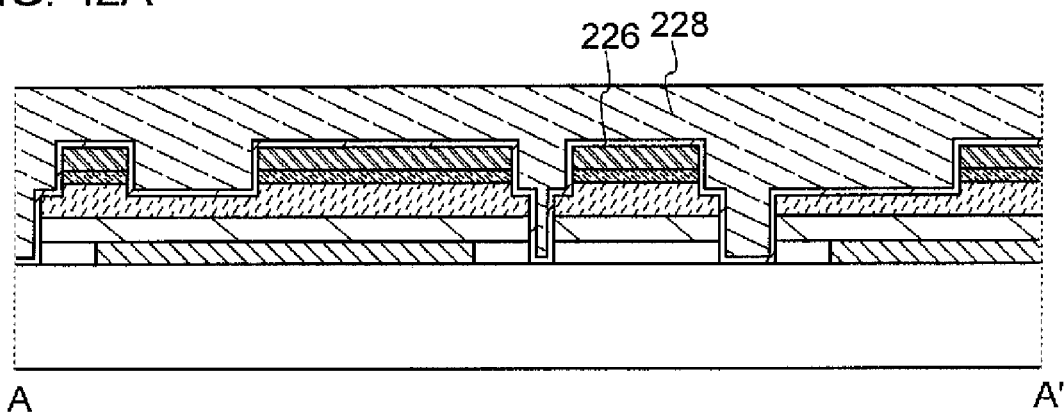
FIGS. 42A to 42C illustrate an example of a method for manufacturing a thin film transistor and a display device.
Figure 42B:
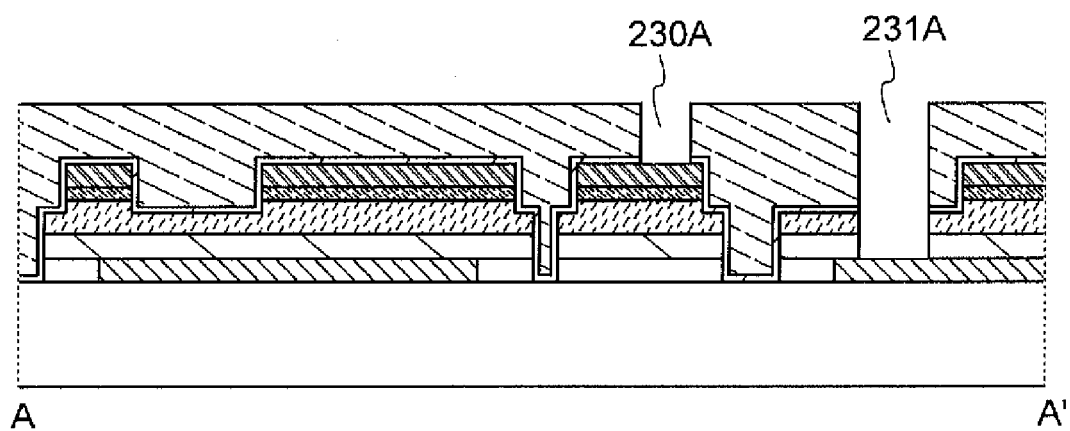

Next, a first opening portion 230 and a second opening portion 231 are formed in the second insulating film (see FIG. 42B and FIG. 46B). The first opening portion 230 is formed so as to reach at least the surface of the source and drain electrode layer. The second opening portion 231 is formed so as to reach at least the surface of the gate electrode layer. The formation method of the first opening portion 230 and the second opening portion 231 is not limited to a particular method and may be determined as appropriate by a practitioner in accordance with the diameter of the first opening portion 230 or the like. For example, the first opening portion 230 and the second opening portion 231 can be formed by dry etching using photolithography.

The first opening portion 230 is provided so as to reach the source and drain electrode layer 220, and a plurality of the first opening portions 230 is provided at required portions as illustrated in FIG. 39. A first opening portion 230A is formed over the source and drain electrode layer 220C, a first opening portion 230B is formed over the source and drain electrode layer 220B, and a first opening portion 230C is formed over the source and drain electrode layer 220E.

The second opening portion 231 is provided so as to reach the gate electrode layer 216, and a plurality of the second opening portions 231 is provided at required portions as illustrated in FIG. 39. That is, the second opening portion 231 is provided at a desired portion by removing not only the second insulating film but also the first insulating film 204 and the semiconductor film 224. A second opening portion 231 A is provided over the gate electrode layer 216B and a second opening portion 231B is provided over the gate electrode layer 216D.

Note that in the case of forming the opening portions by photolithography, one photomask is used.

Figure 42C:
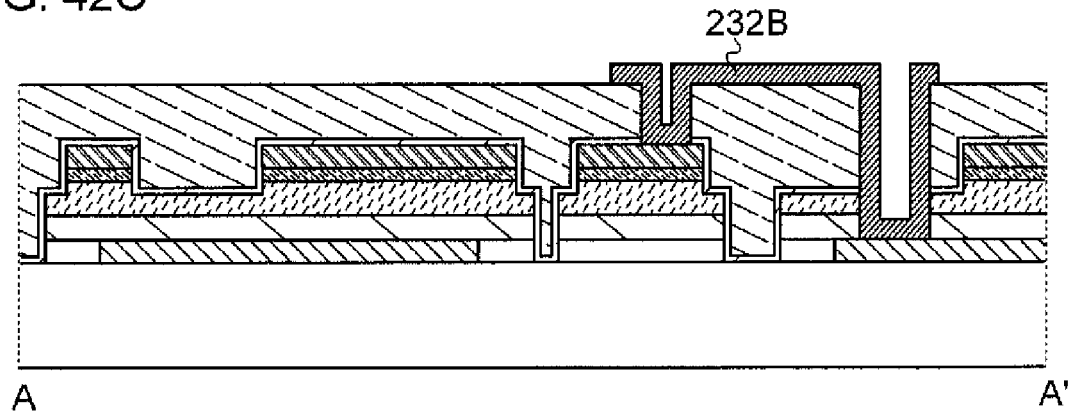

Next, the first pixel electrode layer 232 is formed over the second insulating film (see FIG. 39, FIG. 42C and FIG. 46C). The first pixel electrode layer 232 is formed so as to be connected to the source and drain electrode layer 220 or the gate electrode layer 216 through the first opening portion 230 or the second opening portion 231. Specifically, the first pixel electrode layer 232 is formed so as to be connected to the source and drain electrode layer 220C through the first opening portion 230A, connected to the source and drain electrode layer 220B through the first opening portion 230B, connected to the source and drain electrode layer 220E through the first opening portion 230C, connected to the gate electrode layer 216B through the second opening portion 231 A, and connected to the gate electrode layer 216D through the second opening portion 231 B.

Note that in the case of forming the first pixel electrode layer 232 by photolithography, one photomask is used.

As described above, a transistor which is applicable to a pixel of an EL display device and one of pixel electrodes, which is connected thereto, can be formed. Another EL layer is formed over this pixel electrode and the other of the pixel electrodes is formed over the EL layer, whereby an EL display device can be manufactured. The steps following this are briefly described below.

Since an n-channel thin film transistor is included in the pixel, the first pixel electrode layer 232 is preferably formed using a material serving as a cathode. As examples of the material serving as a cathode, the material with low work function, such as Ca, Al, MgAg, and AlLi are given. Note that the present invention is not limited to these materials. In addition, the first pixel electrode layer 232 may have a single layer or stacked layers including a plurality of films.

Next, a partition 233 is formed over the second insulating film and over a side face (an end portion) of the first pixel electrode layer 232 (see FIG. 46C). The partition 233 has an opening portion, and the first pixel electrode layer 232 is formed so as to be exposed in the opening portion. The partition 233 is formed using an organic resin film, an inorganic insulating film, or an organic polysiloxane film. Specifically, polyimide, polyamide, polyimide amide, acrylic, or benzocyclobutene-based resin may be used to form the partition 233. In particular, it is preferable that the partition 233 be formed using a photosensitive material; the opening portion be formed over the first pixel electrode layer 232; and a side wall of the opening portion have an inclined surface with a continuous curvature.

Then, an EL layer 234 is formed so as to be in contact with the first pixel electrode layer 232 in the opening portion of the partition 233 (see FIG. 46C). The EL layer 234 may have a single layer or stacked layers including a plurality of films. The EL layer 234 includes at least a light-emitting layer. It is preferable that the EL layer 234 be connected to the second pixel electrode layer 235 via an electron injecting layer.

Then, a second pixel electrode layer 235 is formed using a material serving as an anode so as to cover the EL layer 234. The second pixel electrode layer 235 corresponds to the common electrode 190 in FIG. 34. The second pixel electrode layer 235 can be formed using a conductive material having a light-transmitting property. Here, as the conductive material having a light-transmitting property, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like are given. The film of the conductive material having a light-transmitting property may be formed by a sputtering method, a CVD method, or the like; however, the present invention is not limited to a particular method. In addition, the second pixel electrode layer 235 may have a single layer or stacked layers including a plurality of films.

Here, the second pixel electrode layer 235 is formed using ITO. In the opening portion of the partition 233, the first pixel electrode layer 232, the EL layer 234, and the second pixel electrode layer 235 overlap with one another, thereby forming a light-emitting element 236. The light-emitting element 236 corresponds to the light-emitting element 185 in FIG. 34. After that, a third protective film (not illustrated) is preferably formed over the second pixel electrode layer 235 and the partition 233 so that oxygen, hydrogen, moisture, carbon dioxide, or the like does not penetrate the light-emitting element 236. The third protective film is formed using a material similar to that of the first protective film 226, which has the function of preventing penetration and release of moisture. The third protective film is preferably formed using silicon nitride, silicon oxynitride, aluminum oxynitride, aluminum nitride, or the like. Moreover, a silicon nitride film, a DLC film, or the like, which covers the third protective film, is preferably formed.

In addition, it is preferable that packaging (sealing) be further performed using a protective film (an attachment film, an ultraviolet curable resin film, or the like) or a cover material so as to prevent exposure to air. It is preferable that the protective film and the cover material have low gas transmissivity and cause less degasification.

As described above, components can be formed up to the light-emitting element of the EL display device with a top emission structure (see FIG. 46C). However, the EL display device that is one embodiment mode is not limited to the above description, and the EL display device can have a bottom emission structure or a dual emission structure. In a bottom emission structure and a dual emission structure, the first pixel electrode layer 232 may be formed using a conductive material having a light-transmitting property. Here, when the first pixel electrode layer 232 is formed of an anode material, the first pixel electrode layer 232 can be formed of ITO or the like. By making the first pixel electrode layer 232 have such a structure, a bottom-emission type EL display device can be manufactured. In this case, the second pixel electrode layer 235 can be formed of a cathode material so as to cover the EL layer 234. Materials with low work function such as Ca, Al, MgAg, AlLi can be given as the cathode materials. Note that it is preferable to form the EL layer 234 and the second pixel electrode layer 235 by a vapor deposition with masks. Therefore, the second pixel electrode layer 235 may be formed of a material that can be formed by a vapor deposition.

Note that materials and formation methods of the protective film and the like, which are described above, are not limited to the above-described materials and formation methods, and any other film that does not prevent the EL layer from emitting light and can prevent deterioration or the like may be used.

In addition, in a top emission structure, a first pixel electrode layer 232A may be formed so as to cover a region where a pixel circuit is formed. In this case, first, only conductive layers corresponding to a first pixel electrode layer 232B and a first pixel electrode layer 232C may be formed; an insulating film having a first opening portion 230D may be formed over the conductive layers; and the first pixel electrode layer 232A may be formed so as to be connected to the source and drain electrode layer 220F through the first opening portion 230D. The first pixel electrode layer 232A is formed so as to cover a region where a pixel circuit is formed, and thus a light-emitting region can be expanded, whereby higher definition display can be achieved.

Note that although an organic EL element is described here as a light-emitting element, an inorganic EL element can also be used as a light-emitting element.

Note that a terminal connection portion is similar to the terminal connection portion that is described in Embodiment 1.

As described above, an EL display device can be manufactured.

As described above, the number of steps for manufacturing a thin film transistor and a display device can be significantly reduced. Specifically, as described above, a thin film transistor can be manufactured using one photomask (multi-tone mask). Further, an active matrix substrate including a pixel transistor can be manufactured using three photomasks. In this manner, since the number of photomasks to be used is reduced, the number of steps for manufacturing a thin film transistor and an EL display device can be significantly reduced.

In addition, the number of steps for manufacturing a thin film transistor can be significantly reduced without a complicated step using backside light exposure, resist reflow, a lift-off method, or the like. Therefore, the number of steps for manufacturing a display device can be significantly reduced without a complicated step. Thus, the number of steps for manufacturing an EL display device can be significantly reduced without reducing yield of the EL display device. Accordingly, the number of steps for manufacturing a display device can be significantly reduced without reducing yield of the display device.

Moreover, the number of steps for manufacturing a thin film transistor can be significantly reduced while electrical characteristics of the thin film transistor are maintained.

Furthermore, by provision of an opening portion as described above, a contact area between a film which is to be etched and a chemical solution or a gas which is used for the etching in the second etching can be increased. Thus, controllability of the second etching can be improved, and a thin film transistor with smaller parasitic capacitance can be manufactured compared to the case where an opening portion is not provided. Further, insufficient insulation between adjacent wirings formed using a gate electrode layer can be prevented and thin film transistors can be manufactured with high yield.

In addition, by increasing a contact area between a film which is to be etched and a chemical solution or a gas which is used for the etching in the second etching, etching can be favorably performed even in the case where there is concern that etching is hindered by a residue or the like which is caused in manufacturing steps and is left on a plane to be etched.

Note that by provision of an opening portion, the layout is not determined depending on the side-etching amount of the second etching. Thus, without reducing the freedom of layout design, the number of steps for manufacturing a thin film transistor and a display device can be significantly reduced.

Further, by increasing the width of a wiring at an opening portion, the increase in the amount of generated heat can be prevented and reliability can be improved.

Furthermore, because a thin film transistor with low leakage current at an end portion of the gate electrode layer can be manufactured, a display device with a high contrast ratio and high display quality can be obtained.

Note that the invention to be disclosed is not limited to the above-described pixel structure and can be applied to various EL display devices.

Embodiment 4

In this embodiment, electronic devices each incorporating the display panel or the display device that is manufactured by any of the methods described in Embodiments 1 to 3 as a display portion will be described with reference to FIGS. 43A and 43B, FIG. 44, and FIGS. 45A to 45C. Examples of such electronic devices include cameras such as video cameras and digital cameras, head-mounted displays (goggle-type displays), car navigation systems, projectors, car stereo sets, personal computers, and portable information terminals (e.g., mobile computers, mobile phones, electronic book readers, and the like). Examples of these devices are illustrated in FIGS. 43A and 43B.

Figure 43A:
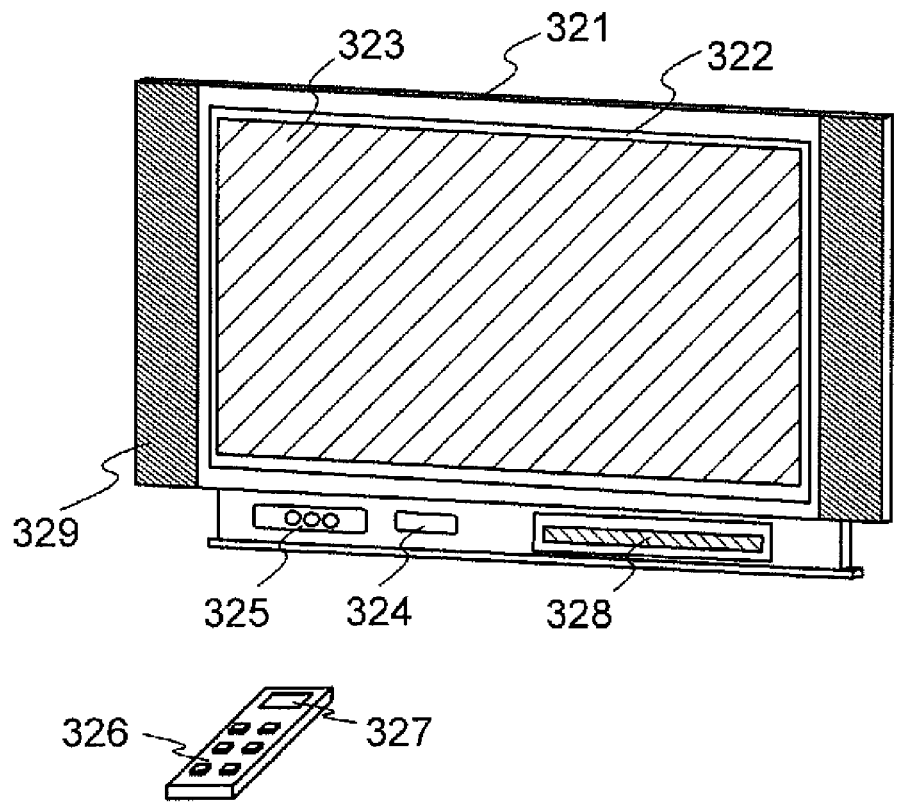
FIGS. 43A and 43B each illustrate an electronic device.
Figure 43B:
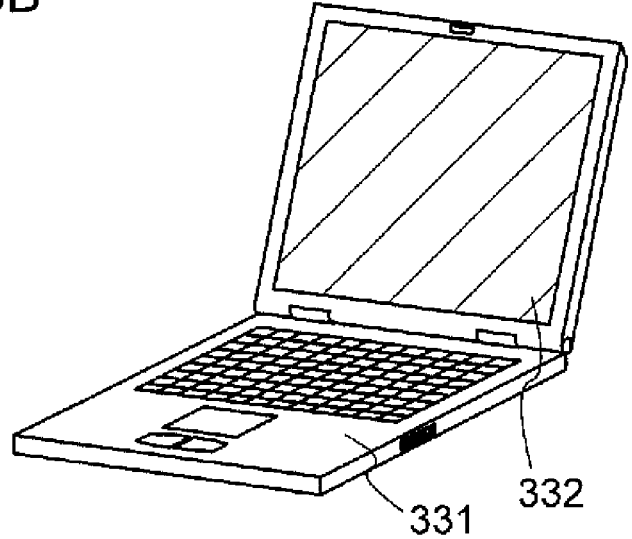

FIG. 43A illustrates a television device. The television device illustrated in FIG. 43A can be completed by incorporating a display panel into a chassis. A main screen 323 is formed using a display panel manufactured according to any of the methods described in Embodiments 1 to 3. In addition, a speaker portion 329, operation switches, and the like are provided as accessory equipment.

As illustrated in FIG. 43A, a display panel 322 which is manufactured by any of the methods described in Embodiments 1 to 3 is incorporated into a chassis 321. The television device can receive general TV broadcast with a receiver 325, and can be connected to a wired or wireless communication network via a modem 324, so that one-way information communication from a sender to a receiver or two-way information communication between a sender and a receiver or between receivers can be performed. The television device can be operated with a switch built in the chassis, or a remote control unit 326 that is provided separately. The remote control unit 326 may also have a display portion 327 for displaying information to be outputted.

Further, the television device may include a sub-screen 328 formed using a second display panel for displaying channels, volume, and the like, in addition to the main screen 323.

Figure 44:
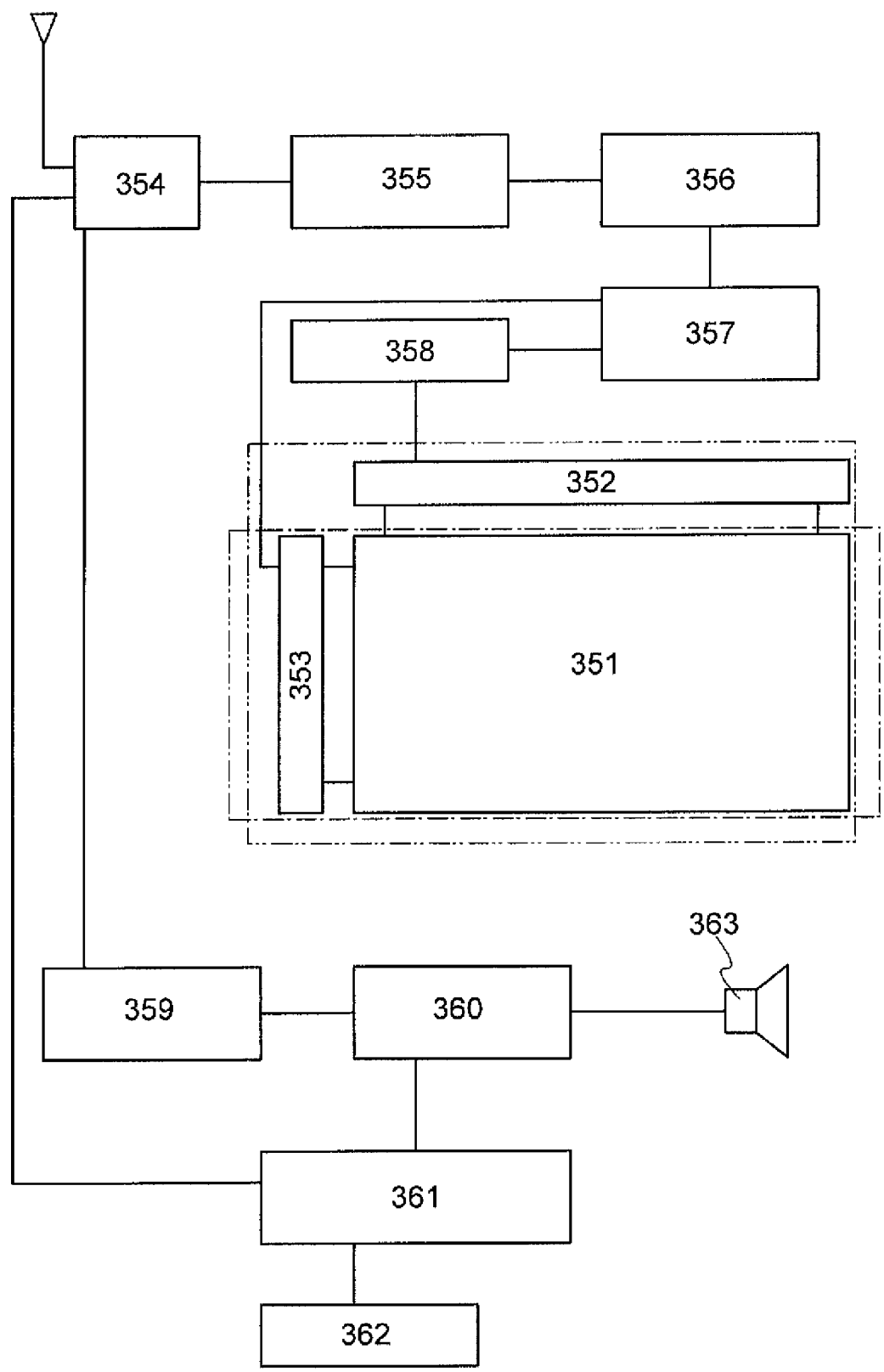
FIG. 44 illustrates an electronic device.

FIG. 44 is a block diagram of a main structure of a television device. A display panel is provided with a pixel portion 351. A signal line driver circuit 352 and a scanning line driver circuit 353 may be mounted on the display panel by a COG method.

As other external circuits, a video signal amplifier circuit 355 that amplifies a video signal among signals received by a tuner 354, a video signal process circuit 356 that converts the signals output from the video signal amplifier circuit 355 into color signals corresponding to their respective colors of red, green, and blue, a control circuit 357 that converts the video signal so that the video signal can match input specification of a driver IC, and the like are provided on an input side of the video signal. The control circuit 357 outputs signals to both a scanning line side and a signal line side. In the case of digital driving, a signal dividing circuit 358 may be provided on the signal line side and an input digital signal may be divided into an integral number of pieces and supplied.

An audio signal among signals received by the tuner 354 is transmitted to an audio signal amplifier circuit 359 and an output therefrom is supplied to a speaker 363 through an audio signal processing circuit 360. A control circuit 361 receives control information on a receiving station (receiving frequency) or sound volume from an input portion 362 and transmits the signal to the tuner 354 and the audio signal processing circuit 360.

Needless to say, the display device that is an embodiment of the invention to be disclosed is not limited to television devices, and can be applied to a variety of applications such as monitors of personal computers, or display media that have a large area, such as information display boards in railway stations, airports, and the like, and street-side advertisement display boards. Thus, by employing any of the methods for manufacturing a display device, which is one embodiment mode, in order to manufacture such display media, productivity of these display media can be improved.

The main screen 323 and the sub-screen 328 are formed using the display panel or the display device that is manufactured by any of the methods for manufacturing a display device, which are described in Embodiments 1 to 3, whereby productivity of the television device can be enhanced.

A portable computer illustrated in FIG. 43B includes a main body 331, a display portion 332, and the like. By using the display panel or the display device that is manufactured by any of the methods for manufacturing a display device, which are described in Embodiments 1 to 3, as the display portion 332, productivity of the computer can be enhanced.

Figure 45A:
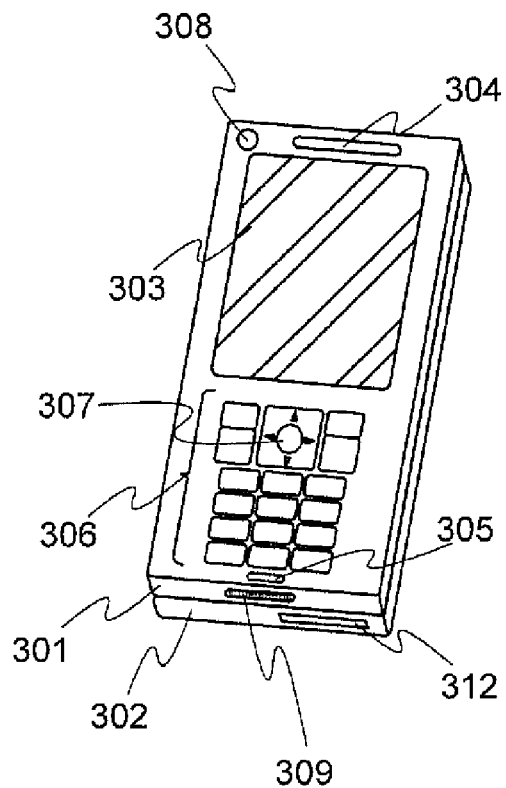
FIGS. 45A to 45C illustrate an electronic device.
Figure 45B:
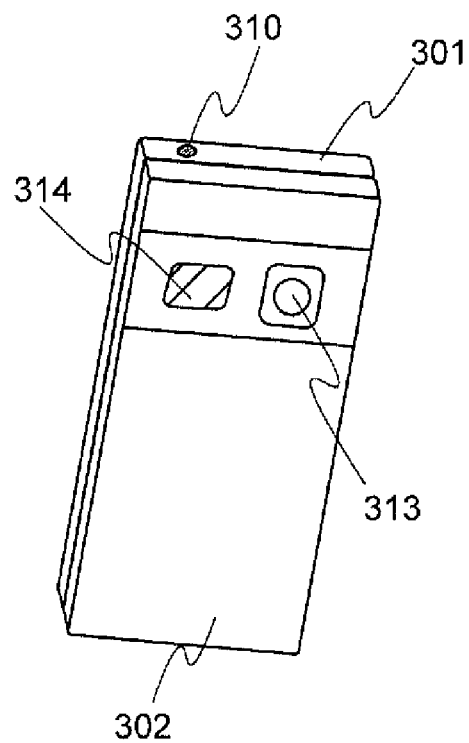
Figure 45C:
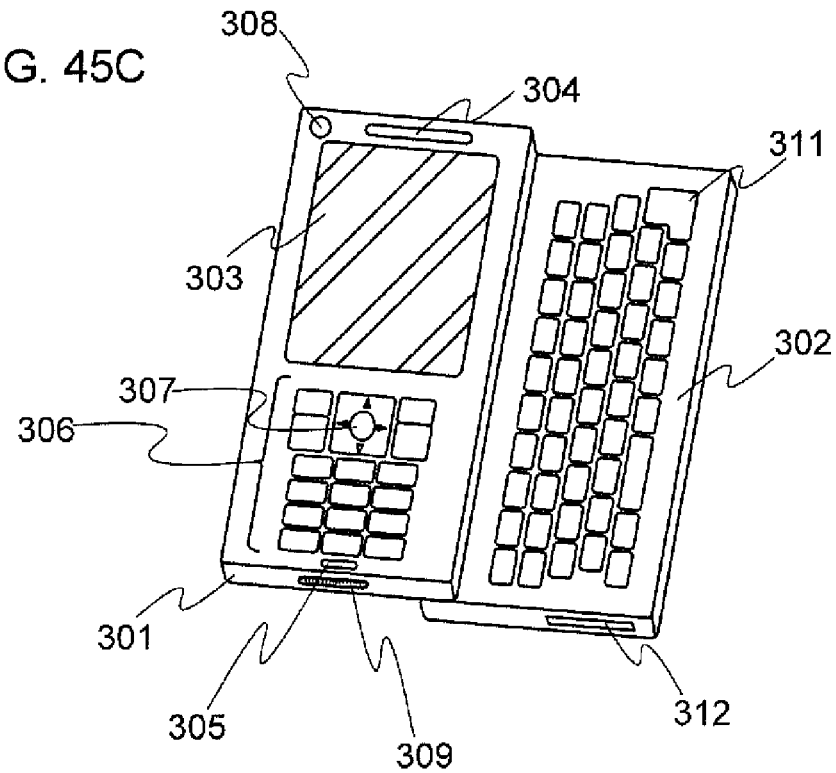

FIGS. 45A to 45C illustrate an example of a mobile phone. FIG. 45A is a front view, FIG. 45B is a rear view, and FIG. 45C is a front view in which two chassis are slid. A mobile phone has chassis 301 and 302. The mobile phone has both functions of a mobile phone and a portable information terminal, and incorporates a computer. The mobile phone is an electronic device so-called a smartphone which is capable of various data processing in addition to voice call.

The chassis 301 includes a display portion 303, a speaker 304, a microphone 305, operation keys 306, a pointing device 307, a front camera lens 308, a jack 309 for an external connection terminal, an earphone terminal 310, and the like. The chassis 302 includes a keyboard 311, an external memory slot 312, a rear camera 313, a light 314, and the like. In addition, an antenna is incorporated in the chassis 301.

Further, in addition to the above-described structure, the mobile phone may incorporate a non-contact IC chip, a small memory device, or the like.

The chassis 301 and 302 which overlap with each other (see FIG. 45A) can be slid, and are developed by being slid as illustrated in FIG. 45C. The display panel or the display device that is manufactured by any of the methods for manufacturing a display device, which are described in Embodiments 1 to 3, can be incorporated in the display portion 303. Since the front camera lens 308 is provided in the same plane as the display portion 303, the mobile phone can be used as a videophone. Further, a still image and a moving image can be taken with the rear camera 313 and the light 314, using the display portion 303 as a viewfinder.

With the use of the speaker 304 and the microphone 305, the mobile phone can be used as an audio recording device (recording device) or an audio reproducing device. With the use of the operation keys 306, further, operations of incoming and outgoing calls, simple information input for electronic mails or the like, scrolling of a screen displayed on the display portion, cursor movement, e.g., for selecting information to be displayed in the display portion, and the like are possible.

If much information needs to be handled in documentation, a use as a portable information terminal, and the like, it is convenient to use the keyboard 311. Further, by sliding the chassis 301 and 302 which overlap with each other (see FIG. 45A), the mobile phone can be developed as illustrated in FIG. 45C. In the case of using the mobile phone as a portable information terminal, a cursor can be moved smoothly with the use of the keyboard 311 and the pointing device 307. The jack 309 for an external connection terminal can be connected to an AC adapter or a variety of cables such as a USB cable, and charging and data communication with a personal computer or the like are possible. Further, by inserting a recording medium in the external memory slot 312, a larger amount of data can be stored and moved.

The rear face of the chassis 302 (see FIG. 45B) is provided with the rear camera 313 and the light 314, and a still image and a moving image can be taken using the display portion 303 as a viewfinder.

Further, the mobile phone may have an infrared communication function, a USB port, a function of receiving one segment television broadcast, a non-contact IC chip, an earphone jack, or the like, in addition to the above-described functions and structures.

The variety of electronic devices described in this embodiment can be manufactured by any of the methods for manufacturing a thin film transistor and a display device, which are described in Embodiments 1 to 3; therefore, productivity of these electronic devices can be improved.

Therefore, manufacturing cost of these electronic devices can be significantly reduced.

Further, as described in Embodiments 1 to 3, a display device with high display quality can be manufactured.

This application is based on Japanese Patent Application serial No. 2008-061680 filed with Japan Patent Office on Mar. 11, 2008, the entire contents of which are hereby incorporated by reference.

What is claimed is:

1. A method for manufacturing a thin film transistor, comprising:
   forming a first conductive film over a substrate;
   forming an insulating film over the first conductive film;
   forming a semiconductor film over the insulating film;
   forming an impurity semiconductor film over the semiconductor film;
   forming a second conductive film over the impurity semiconductor film;
   forming a first resist mask including a recessed portion over the second conductive film and including at least one opening portion;
   exposing at least a surface of the first conductive film by performing first etching on the insulating film, the semiconductor film, the impurity semiconductor film, and the second conductive film using the first resist mask;
   forming a gate electrode layer by performing second etching in which a part of the first conductive film is side-etched;
   after forming the gate electrode layer, forming a second resist mask by making the first resist mask to be reduced to expose a part of the second conductive film, which overlaps with the recessed portion of the first resist mask; and
   forming a source and drain electrode layer, a source and drain region, and a semiconductor layer by performing third etching on the second conductive film, the impurity semiconductor film, and a part of the semiconductor film using the second resist mask.

2. A method for manufacturing a thin film transistor, comprising:
   forming a first conductive film over a substrate;
   forming an insulating film over the first conductive film;
   forming a semiconductor film over the insulating film;
   forming an impurity semiconductor film over the semiconductor film;
   forming a second conductive film over the impurity semiconductor film;
   forming a first resist mask including a recessed portion over the second conductive film and including at least one opening portion;
   exposing at least a surface of the first conductive film by performing first etching on the insulating film, the semiconductor film, the impurity semiconductor film, and the second conductive film using the first resist mask;
   forming a second resist mask by making the first resist mask to be reduced to expose a part of the second conductive film, which overlaps with the recessed portion of the first resist mask;
   after forming the second resist mask, forming a gate electrode layer by performing second etching in which a part of the first conductive film is side-etched; and
   forming a source and drain electrode layer, a source and drain region, and a semiconductor layer by performing third etching on the second conductive film, the impurity semiconductor film, and a part of the semiconductor film using the second resist mask.

3. A method for manufacturing a thin film transistor, comprising:
   forming a first conductive film over a substrate;
   forming an insulating film over the first conductive film;
   forming a semiconductor film over the insulating film;
   forming an impurity semiconductor film over the semiconductor film;
   forming a second conductive film over the impurity semiconductor film;
   forming a first resist mask including a recessed portion over the second conductive film and including at least one opening portion;
   performing first etching on the first conductive film, the insulating film, the semiconductor film, the impurity semiconductor film, and the second conductive film using the first resist mask;
   forming a gate electrode layer by performing second etching in which a part of the first conductive film is side-etched;
   after forming the gate electrode layer, forming a second resist mask by making the first resist mask to be reduced to expose a part of the second conductive film, which overlaps with the recessed portion of the first resist mask; and
   forming a source and drain electrode layer, a source and drain region, and a semiconductor layer by performing third etching on the second conductive film, the impurity semiconductor film, and a part of the semiconductor film using the second resist mask.

4. A method for manufacturing a thin film transistor, comprising:
   forming a first conductive film over a substrate;
   forming an insulating film over the first conductive film;
   forming a semiconductor film over the insulating film;
   forming an impurity semiconductor film over the semiconductor film;
   forming a second conductive film over the impurity semiconductor film;
   forming a first resist mask including a recessed portion over the second conductive film and including at least one opening portion;
   performing first etching on the first conductive film, the insulating film, the semiconductor film, the impurity semiconductor film, and the second conductive film using the first resist mask;
   forming a second resist mask by making the first resist mask to be reduced to expose a part of the second conductive film, which overlaps with the recessed portion of the first resist mask;
   after forming the second resist mask, forming a gate electrode layer by performing second etching in which a part of the first conductive film is side-etched; and
   forming a source and drain electrode layer, a source and drain region, and a semiconductor layer by performing third etching on the second conductive film, the impurity semiconductor film, and a part of the semiconductor film using the second resist mask.

5. The method for manufacturing a thin film transistor according to any one of claims 1 to 4,
   wherein the first resist mask is formed using a multi-tone mask.

6. The method for manufacturing a thin film transistor according to any one of claims 1 to 4,
wherein an element region is formed by the first etching, and
wherein a side surface of the gate electrode layer is provided more on the inside than a side surface of the element region by a roughly uniform distance by the second etching.

7. The method for manufacturing a thin film transistor according to any one of claims 1 to 4,
wherein the first etching is dry etching, and
wherein the second etching is wet etching.

8. The method for manufacturing a thin film transistor according to any one of claims 1 to 4,
wherein the at least one opening portion is provided over a region where there is a wiring which is formed by processing the second conductive film at an intersection of a wiring which is formed by processing the first conductive film and the wiring that is formed by processing the second conductive film with the wiring that is formed by processing the first conductive film sandwiched.

9. The method for manufacturing a thin film transistor according to any one of claims 1 to 4,
wherein the thin film transistor is incorporated in one selected from the group consisting of a television, a computer and a phone.

10. A method for manufacturing a display device, comprising:
forming a first conductive film over a substrate;
forming a first insulating film over the first conductive film;
forming a semiconductor film over the first insulating film;
forming an impurity semiconductor film over the semiconductor film;
forming a second conductive film over the impurity semiconductor film;
forming a first resist mask including a recessed portion over the second conductive film and including at least one opening portion;
exposing at least a surface of the first conductive film by performing first etching on the first insulating film, the semiconductor film, the impurity semiconductor film, and the second conductive film using the first resist mask;
forming a gate electrode layer by performing second etching in which a part of the first conductive film is side-etched;
after forming the gate electrode layer, forming a second resist mask by making the first resist mask to be reduced to expose a part of the second conductive film, which overlaps with the recessed portion of the first resist mask;
forming a source and drain electrode layer, a source and drain region, and a semiconductor layer by performing third etching on the second conductive film, the impurity semiconductor film, and a part of the semiconductor film using the second resist mask, thereby forming a thin film transistor;
removing the second resist mask and forming a second insulating film which covers the thin film transistor;
forming an opening portion in the second insulating film so as to expose a part of the source and drain electrode layer; and
forming a pixel electrode in the opening portion formed in the second insulating film and over the second insulating film selectively.

11. A method for manufacturing a display device, comprising:
forming a first conductive film over a substrate;
forming a first insulating film over the first conductive film;
forming a semiconductor film over the first insulating film;
forming an impurity semiconductor film over the semiconductor film;
forming a second conductive film over the impurity semiconductor film;
forming a first resist mask including a recessed portion over the second conductive film and including at least one opening portion;
exposing at least a surface of the first conductive film by performing first etching on the first insulating film, the semiconductor film, the impurity semiconductor film, and the second conductive film using the first resist mask;
forming a second resist mask by making the first resist mask to be reduced to expose a part of the second conductive film, which overlaps with the recessed portion of the first resist mask;
after forming the second resist mask, forming a gate electrode layer by performing second etching in which a part of the first conductive film is side-etched;
forming a source and drain electrode layer, a source and drain region, and a semiconductor layer by performing third etching on the second conductive film, the impurity semiconductor film, and a part of the semiconductor film using the second resist mask, thereby forming a thin film transistor;
removing the second resist mask and forming a second insulating film which covers the thin film transistor;
forming an opening portion in the second insulating film so as to expose a part of the source and drain electrode layer; and
forming a pixel electrode in the opening portion formed in the second insulating film and over the second insulating film selectively.

12. The method for manufacturing a display device according to any one of claims 10 and 11,
wherein the first resist mask is formed using a multi-tone mask.

13. The method for manufacturing a display device according to any one of claims 10 and 11,
wherein an element region is formed by the first etching, and
wherein a side surface of the gate electrode layer is provided more on the inside than a side surface of the element region by a roughly uniform distance by the second etching.

14. The method for manufacturing a display device according to any one of claims 10 and 11,
wherein the first etching is dry etching, and
wherein the second etching is wet etching.

15. The method for manufacturing a display device according to any one of claims 10 and 11,
wherein the second insulating film is formed by stacking an insulating film formed by a CVD method or a sputtering method, and an insulating film formed by a spin coating method.

16. The method for manufacturing a display device according to any one of claims 10 and 11,
wherein the at least one opening portion formed in the first resist mask is provided over a region where there is a wiring which is formed by processing the second conductive film at an intersection of a wiring which is formed by processing the first conductive film and the wiring that is formed by processing the second conductive film with the wiring that is formed by processing the first conductive film sandwiched.

17. The method for manufacturing a display device according to any one of claims 10 and 11,
wherein the display device is incorporated in one selected from the group consisting of a television, a computer and a phone.

* * * * *